(12) United States Patent
Sun

(10) Patent No.: US 12,292,345 B2
(45) Date of Patent: May 6, 2025

(54) FLEXIBLE FABRIC BASED TRANSISTORS FOR ELECTROMECHANICAL SENSING ON 2D AND 3D CURVED SURFACES

(71) Applicant: Nextiles, Inc., Brooklyn, NY (US)

(72) Inventor: George Sun, Brooklyn, NY (US)

(73) Assignee: Nextiles, Inc., Brooklyn, NY (US)

( * ) Notice: Subject to any disclaimer, the term of this patent is extended or adjusted under 35 U.S.C. 154(b) by 0 days.

(21) Appl. No.: 18/398,429

(22) Filed: Mar. 8, 2024

(65) Prior Publication Data

US 2024/0255363 A1 Aug. 1, 2024

Related U.S. Application Data

(63) Continuation of application No. 18/285,064, filed as application No. PCT/US2022/024582 on Apr. 13, 2022.

(60) Provisional application No. 63/174,046, filed on Apr. 13, 2021.

(51) Int. Cl.
*G01L 1/18* (2006.01)
*D05C 17/00* (2006.01)

(52) U.S. Cl.
CPC .......... *G01L 1/18* (2013.01); *D05C 17/00* (2013.01); *D05D 2209/00* (2013.01); *D05D 2303/40* (2013.01)

(58) Field of Classification Search
CPC . G01L 1/148; G01L 1/26; G01L 1/205; G01L 5/16; G01L 1/12; G01L 1/18; G01L 1/146; G01L 5/101; D05C 17/00; H05K 1/038; D05D 2303/40; D05D 2209/00

USPC ......................................................... 257/438
See application file for complete search history.

(56) References Cited

U.S. PATENT DOCUMENTS

2014/0150573 A1   6/2014  Cannard
2019/0310144 A1  10/2019  Sun
2020/0200623 A1   6/2020  Choi

FOREIGN PATENT DOCUMENTS

WO   2022221387 A1   10/2022

OTHER PUBLICATIONS

International Search Report and Written Opinion for Application No. PCT/US2022/024582 dated Jul. 8, 2022.

*Primary Examiner* — Nathan W Ha
(74) *Attorney, Agent, or Firm* — KDW Firm PLLC

(57) ABSTRACT

A system of fabric-based devices designed as transistors with tri-state behavior that can measure any geometries on 2D and 3D surfaces. The devices are constructed from layers of conductive materials and flexible sheets that allow signals to selectively cross between layers. Multiple layers of conductive signals can be achieved by controlling the tension of the top and bottom thread, and interlayering conductive, semiconductive, insulating, and semi-porous materials around a sensing layer. The layers can be further modified to include folds and cuts that allow for 2D and 3D bending, stretching, twisting, and curves. Large sheets of devices can be organized into grid-like matrixes, with signal wires connected in a multiplexed fashion to minimize the amount of threads to simplify construction and device communication to a central processing unit.

43 Claims, 18 Drawing Sheets

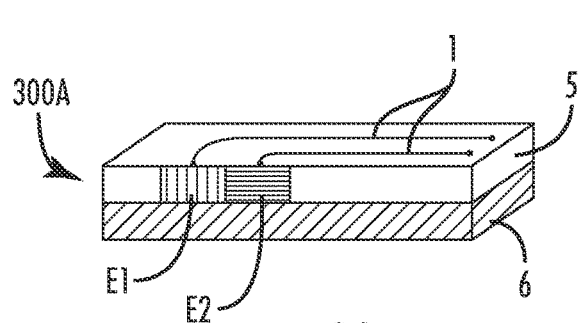
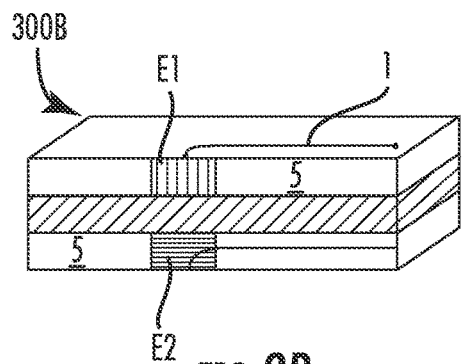
FIG. 8A  FIG. 8B
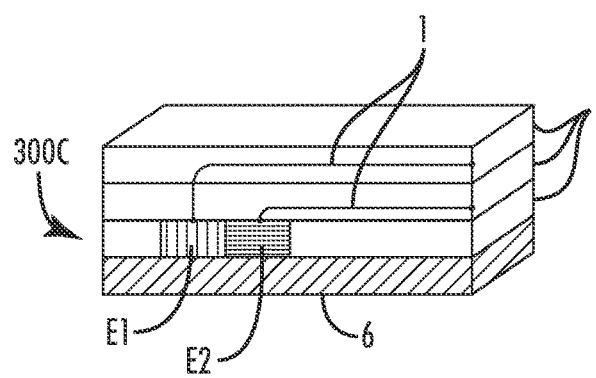
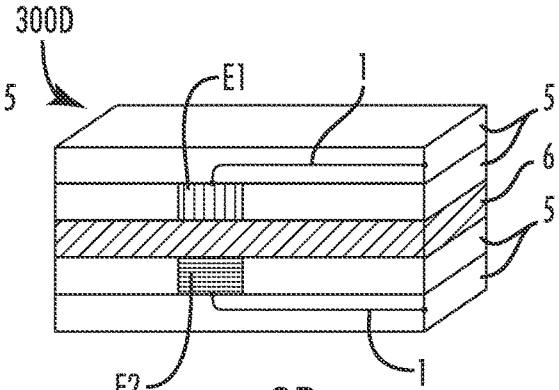
FIG. 8C  FIG. 8D
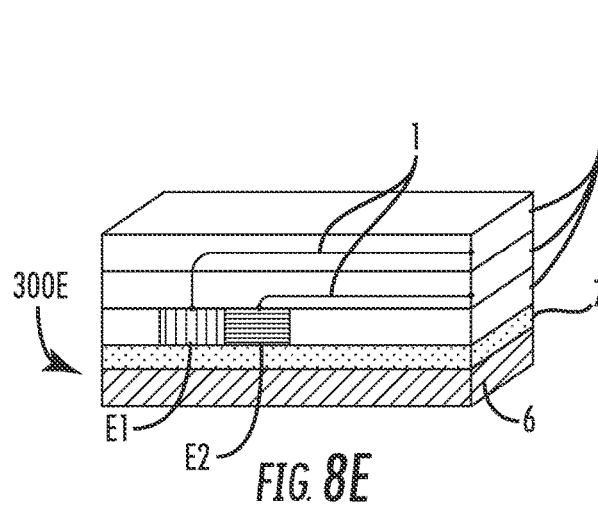
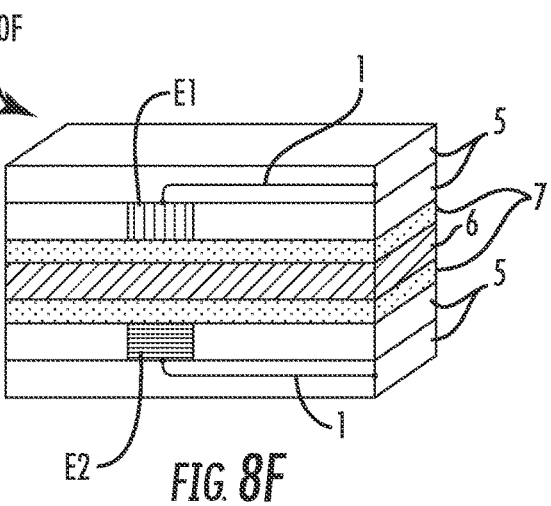
FIG. 8E  FIG. 8F

FLEXIBLE FABRIC BASED TRANSISTORS FOR ELECTROMECHANICAL SENSING ON 2D AND 3D CURVED SURFACES

CROSS-REFERENCE TO RELATED APPLICATION

This application claims priority to U.S. Patent Application Ser. No. 63/174,046, filed on Apr. 13, 2021, and U.S. patent application Ser. No. 18/285,064, filed on Sep. 29, 2023, the disclosure of which are incorporated by reference herein in their entirety.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the U.S. Patent and Trademark Office files or records, but otherwise reserves all copyright and trade dress rights whatsoever.

FIELD OF INVENTION

Embodiments of the present invention are in the field of electronic and instrumented textiles that monitor areas of electrical, mechanical, chemical, and magnetic perturbations over a wide range of fabrics using a systemic placement of conductive and non-conductive threads and an algorithm for multiplexing an arbitrary number of devices.

BACKGROUND

Force and pressure sensitive (FPS) materials are ubiquitously used to construct sensors that aid devices and machines to interact with external stimuli. Frequently, FPS are embedded into thin or planar surfaces. FPS materials operate by transducing physical forces, such as pressure, bending, and stretching, into an electrical output, such as current and/or voltage, that may be registered by a receiving device, such as an analog-to-digital converter (ADC) or central processing unit (CPU). Other types of FPS transduction phenomena include the transfer of physical forces into other types of energies, such as thermal, resonance, optical, and ionization.

Commercial devices that incorporate FPS materials and knowledge of their transduction characteristics primarily use them to construct strain gauges. Strain gauges take advantage of physical deformation to change the underlying electromechanical properties of the FPS materials, which then produce a corresponding change in electrical output. Many conventional strain gauges incorporate a specific FPS material, known as a force-sensitive resistor (FSR). FSRs can be piezo-resistive materials and/or piezo-electric materials that undergo physical deformations that match the force applied in order to change their resistivity (or inversely, their conductivity), and therefore transduce changes in current and voltage outputs. The physical deformation is proportional to changes in the height, width, and length of the FSR material, which normally abides a Poisson Ratio. Examples of types of conventional strain gauges can include linear strain gauges, membrane strain gauges, rosette strain gauges, double linear strain gauges, quarter-bridge strain gauges, half-bridge strain gauges, full-bridge strain gauges (also known as load cells or Wheatstone bridge), shear strain gauges, column strain gauges, displacement, and beam load.

Strain gauges are known to be used in applications pertaining to civil, mechanical, industrial, and robotic fields. In the civil, mechanical, industrial, and robotic fields, strain gauges are primarily used for testing and quality control, which provide information to the researcher on the material integrity and robustness when used or abused in real-world settings. In addition, strain gauges can be used as feedback mechanisms to inform machines of how far they have traveled, moved, or been loaded with material. Examples are strain gauges on robotic joints that send feedback signals to the CPU on how the limb has moved, and if required, repositioned if the signal is above or below a desired threshold.

Placement of sensors and electromechanical components onto flexible substrates, such as textiles, however, is known to be exceedingly limited. Among the reasons for difficulty in integrating sensors and electromechanical components onto flexible substrates are: 1) the flexible and bending nature of textiles do not conform to the flat and rigid structures of conventional electromechanical sensors and/or devices; 2) routing electrical connections between electromechanical devices requires planar or non-flexible surfaces; 3) electrical connections typically need to consolidate to a central processing unit (CPU) with a rigid interface, such as an assembly of integrated circuits (ICs) or a transmitting device (e.g. WiFi, Bluetooth); and 4) the overall assembly of devices, connections, and ICs cannot tolerate stretch, bend, and other mechanical deformations in the X, Y, or Z planes without damaging the assembly, inducing noise, or otherwise detrimentally altering the signals between the components.

The core challenge of items 1-4 relate to the lack of flexibility in today's electronic devices. Research directed towards addressing this issue has focused primarily on the use of flexible printed circuit boards (PCBs) as a possible solution that would allow for the placement of devices (e.g., ICs) onto a flexible substrate with flexible copper traces. A flexible PCB typically includes a metallic layer of electrically conductive traces, usually copper, which is bonded to a dielectric layer, usually made of a polyimide material. The thickness of the metal layer can be made thin (<0.0001") or thick (>0.010"), typically by increasing the thickness of the dielectric layer, which can vary from 0.0005" to 0.010". However, flexible PCBs are known to be more expensive to produce than rigid PCBs, which are made of glass fiber reinforced epoxy resin, also known as FR4. In addition, flexible PCBs still rely on the placement of solid components, such as resistors, capacitors, inductors, jacks, ICs, etc. onto the flexible PCB. Thus, while the PCB may be flexible, the attachment of rigid structures onto a flexible PCB hinders (e.g., reduces) flexibility and bending, especially in locations on the flexible PCB where such rigid components are more densely positioned. Therefore, an extremely high degree of engineering insight is required to place, incorporate, and assemble rigid components onto a flexible PCB to gain a desired flexibility, which leads to further increases in costs associated with the use of such flexible PCBs, as well as limiting the use of such flexible PCBs to very specific applications.

Another field of research has focused on the use of conductive inks for connecting electrical devices together. Conductive inks are typically made of emulsions of a dissolved metal immersed in organic to inorganic liquid. Conductive inks are chemically or thermally pressed onto a flexible substrate, typically a thin sheet of plastic or fabric. The conductive inks act as a coating layer on the flexible substrate, which are deposited according to a prescribed pattern that define (e.g., at the endpoints thereof) conductive connections for electronic devices. Once the ink is deposited, the electronic components are then attached on the prescribed positions. One improvement of flexible substrates over flexible PCBs is that the flexible substrate can be formed from a multitude of materials other than a polyimide or epoxy resin material. However, conductive inks are only able to interact with the top surface of a material; thus, flexible substrates lack many of the functional benefits associated with PCBs, whether rigid or flexible, in which electrical connections can be made in multiple layers and interconnected through vias to allow for more complex electrical circuit designs and connections. Conductive inks are similarly limited, like flexible PCBs, in that the electrical connections made by the conductive ink are still limited by the rigid electrical components placed on top. Therefore, just as with flexible PCBs, the attachment of rigid structures onto a flexible substrate, which has conductive ink deposited thereon, necessarily hinders (e.g., reduces) flexibility and bending of the flexible substrate. Furthermore, it is known that conductive inks wear (e.g., erode, or otherwise degrade) over time. When applied on fabrics, conductive inks exhibit similar characteristics to that of paint or heat press vinyl or dies, such that the conductive ink deposited into conductive patterns will flake, crack, and/or peel over time and with repeated use. Thus, the electrical connections provided by the use of such conductive inks will also fade, tear, or otherwise fail both due to the passage of time and/or use. As such, the useful life of conductive inks is dramatically shorter than for PCBs, whether rigid or flexible.

SUMMARY

The presently disclosed subject matter now will be described more fully hereinafter, in which some, but not all embodiments of the presently disclosed subject matter are described. Indeed, the presently disclosed subject matter can be embodied in many different forms and should not be construed as limited to the embodiments set forth herein; rather, these embodiments are provided so that this disclosure will satisfy applicable legal requirements.

In one or more embodiments described herein are systems, methods, and devices that describe various aspects of textile-based force sensors in 2D and 3D electromechanical surfaces.

According to an example embodiment, a device (e.g., a sensing device) is disclosed herein, the device comprising: a passive element formed of a plurality of individual layers stacked sequentially on top of each other and comprising: a plurality of insulating layers, each of which comprise an insulating material; at least one sensing layer, each of which comprise a conductive or a semi-conductive material; a plurality of conductive layers, each of which comprises an electrically conductive material; and at least one semi-porous layer, each of which comprises a semi-porous material; wherein all of the plurality of conductive layers are separated from each other by one or more of the plurality of insulating layers, one or more of the at least one sensing layer, and/or one or more of the at least one semi-porous layer; optionally, wherein at least some or all of the plurality of conductive layers are spaced apart from the at least one sensing layer by the at least one semi-porous layer; and wherein the passive element comprises one or more of resistive, capacitive, and inductive characteristics; the device further comprising: a first insulating layer disposed over a top surface of the passive element; a second insulating layer disposed over a bottom surface of the passive element; and one or more electrically conductive threads, each of which is electromechanically attached to one of the plurality of conductive layers of the passive element and also exposed on and/or embedded within the first insulating layer or the second insulating layer.

In some embodiments of the device, the plurality of individual layers of the passive element are cut and/or folded for stacking on top of each other and are secured together by one or more of sewing, embroidery, heat-pressing, adhesives, ultrasonic welding, folding, crimping, and/or casting.

In some embodiments, the device is configured for cutting and/or folding to conform to irregular surface geometries, optionally, wherein the irregular surface geometries comprise on one or more of cloths, body parts, vehicles, appliances, and/or furniture.

In some embodiments of the device, the plurality of insulating layers and the plurality of conductive layers are on a same side as the at least one sensing layer.

In some embodiments of the device, first and second conductive layers of the plurality of conductive layers each comprise a pattern of the electrically conductive material to control the resistive, capacitive, and/or inductive characteristics of the passive element.

In some embodiments of the device, for the at least one sensing layer and/or at least some of the plurality of conductive layers, a thickness of material, a chemical composition, a porosity, an area of intersecting region of the top and bottom conductive layers, a thickness of traces, a number of turns in a pattern, a separation between intertwined conductive traces, and/or a distance from a sensitive material is selected to control a response time, an input dynamic range, an output dynamic range, a bandwidth, a signal-to-noise ratio, a common-noise rejection ratio, a signal gain, a sensitivity, and/or an insensitivity of the device.

In some embodiments of the device, the first and second conductive layers are positioned on opposite sides of the sensing layer from each other; the at least one semi-porous layer comprises first and second semi-porous layers; the first semi-porous layer is disposed between the first conductive layer and the sensing layer; the second semi-porous layer is disposed between the second conductive layer and the sensing layer; and the semi-porous material of each of the first and second semi-porous layers is selected to control a response time, an input dynamic range, an output dynamic range, a bandwidth, a signal-to-noise ratio, a common-noise rejection ratio, a signal gain, a sensitivity, and/or an insensitivity of the device.

In some embodiments, the device comprises one or more additional layer bonded to the first and/or second insulating layers, the one or more additional layers comprising one or more of fabric, glass, wood, gravel, synthetic, leather, organic-like material, and a metal-like material.

In some embodiments of the device, each of the plurality of insulating layers, the at least one sensing layer, the plurality of conductive layers, and the at least one semi-porous layer are bonded together using one or more of sewing, embroidery, heat-pressing, adhesives, ultrasonic welding, folding, crimping, and casting.

In some embodiments of the device, an edge of the device is finished via one or more of sewing, embroidery, heat-pressing, adhesives, ultrasonic welding, folding, crimping, and casting.

In some embodiments of the device, the one or more electrically conductive threads comprise a plurality of electrically conductive threads that are configured to be disposed at any location on and/or within the device.

In some embodiments of the device, the plurality of electrically conductive threads is disposed via one or more of sewing, weaving, knitting, lacing, depositing, and embroidery.

In some embodiments of the device, the plurality of electrically conductive threads is padded with porous materials or semi-conductive materials within the device.

In some embodiments of the device, the plurality of electrically conductive threads is attached to passive or active filtering components configured to perform one or more operations comprising low-pass, high-pass, band-pass, and/or notch filtering.

In some embodiments of the device, the plurality of electrically conductive threads is terminated onto a connector attached to a controller, which is configured to assemble incoming data, thereby creating assembled data, and transmit the assembled data to a receiving device.

In some embodiments of the device, an area between points where the sensing layer is contacted by the plurality of electrically conductive threads determines an area over which the passive element is sensitive.

In some embodiments of the device, the at least one sensing layer comprises a plurality of sensing layers, which are configured to differentially determine a direction of a stimulus applied to the device in any of an X-, Y-, and Z-plane.

In some embodiments, the device comprises switches configured to toggle measurement of one of the plurality of sensing layers.

In some embodiments, the device is configured to use logic gates, clocks, and/or CPUs to time and deconvolve output signals from the plurality of sensing layers.

In some embodiments of the device, the one or more electrically conductive threads comprise a plurality of electrically conductive threads, which are folded into separate layers within the device.

In some embodiments, the device is configured such that, by altering an input signal on at least one of the conductive materials of the one or more conductive layers, a signal from the passive element is differentially turned on or off, or enters a high-Z state via the at least one semi-porous layer.

In some embodiments, the device is configured to enter an on state, an off state, or a high-Z state based on a direction of a stimulus applied to the device, when the direction of the stimulus is in a same direction in which the at least one semi-porous layer is positioned between one of the plurality of conductive layers and the at least one sensing layer.

In some embodiments of the device, the passive element is configured for cutting and/or folding in any of X-, Y-, and Z-directions to differentially measure a stimulus applied to the device in any of an X-, Y-, and Z-plane, respectively.

In some embodiments, the device is configured for interaction with a user for motion acquisition purposes.

In some embodiments, the device is foldable, bendable, and/or rollable by the user.

In some embodiments, the device is configured to be stored, carried, and/or transported by the user.

In some embodiments, the device is configured for installation onto one or more of wood, metal, ceramic, glass, plastic, foam, turf, gravel, carpet, synthetic, organic, and metamaterials.

In some embodiments, the device is configured to connect to a receiving device for use online, offline, cloud-based, and external storage applications.

In some embodiments, the device is configured to generate data for use by the user for algorithmic and/or computerized activities.

In some embodiments, the device is configured to generate data for use for machine-learning activities.

According to another example embodiment, a device (e.g., a sensing device) is disclosed herein, the device comprising: first and second passive elements that are formed, respectively, of a plurality of individual layers stacked sequentially on top of each other and comprising: a plurality of insulating layers, each of which comprise an insulating material; at least one sensing layer, each of which comprise a conductive or a semi-conductive material; a plurality of conductive layers, each of which comprises an electrically conductive material; and at least one semi-porous layer, each of which comprises a semi-porous material; wherein all of the plurality of conductive layers are separated from each other by one or more of the plurality of insulating layers, one or more of the at least one sensing layer, and/or one or more of the at least one semi-porous layer; optionally, wherein at least some or all of the plurality of conductive layers are spaced apart from the at least one sensing layer by the at least one semi-porous layer; and wherein each of the first and second passive element comprises one or more of resistive, capacitive, and inductive characteristics; the device further comprising: a first insulating layer disposed over a top surface of the first and second passive elements; a second insulating layer disposed over a bottom surface of the first and second passive elements; and a plurality of electrically conductive threads, each of which is electromechanically attached to, exposed on, and/or embedded in the first passive element and second passive element and/or the first and second insulating layers; optionally, wherein the first and second passive elements are arranged to form a laterally-extending array of passive elements.

In some embodiments of the device, the plurality of individual layers of the first and/or second passive elements can be cut and/or folded for embedding within layers of a fabric material by one or more of sewing, embroidery, heat-pressing, adhesives, ultrasonic welding, folding, crimping, and/or casting.

In some embodiments, the device is configured for cutting and/or folding to conform to irregular surface geometries, optionally, wherein the irregular surface geometries comprise on one or more of cloths, body parts, vehicles, appliances, and/or furniture.

In some embodiments of the device, the first passive element and the second passive element are combined in a configuration on a same surface of the fabric, on opposing surfaces of the fabric, on separate surfaces of the fabric, cut and stacked on top of each other, or folded together.

In some embodiments of the device, the first passive element and the second passive element share at least one of the plurality of electrically conductive threads.

In some embodiments of the device, an angular position the first passive element relative to the and second passive element is selected to control a directional sensitivity of the device and/or an average sensitivity of the device.

In some embodiments of the device, a surface area of the first passive element and/or of the second passive element is selected to control a response time, an input dynamic range, an output dynamic range, a signal-to-noise ratio, a common-noise rejection ratio, a signal gain, a sensitivity, and/or an insensitivity of the device.

In some embodiments of the device, a thickness of the first passive element and/or of the second passive element is selected to control a response time, an input dynamic range, an output dynamic range, a signal-to-noise ratio, a common-noise rejection ratio, a signal gain, a sensitivity, and/or an insensitivity of the device.

In some embodiments of the device, a spacing between the first passive element and/or of the second passive element is selected to control a response time, an input dynamic range, an output dynamic range, a signal-to-noise ratio, a common-noise rejection ratio, a signal gain, sensitivity, and/or an insensitivity of the device.

In some embodiments of the device, the device is configured to interpolate a signal from the first passive element and a signal from the second passive element to form a secondary signal that is located within the first passive element and the second passive element.

In some embodiments of the device, the device is configured to differentially read a signal from the first passive element and/or the second passive element via a serial communication protocol comprising one or more of single-wire, two-wire, MOSI-MISO, PCI, bus, and serial peripheral interfaces.

In some embodiments of the device, the device is configured such that, by altering an input signal on at least one of the conductive materials of the plurality of conductive layers of the first and/or second passive elements, a signal from the first passive element and/or the second passive element is differentially turned on or off, or enters a high-Z state via the at least one semi-porous layer of the first and/or second passive element, respectively.

In some embodiments of the device, the plurality of electrically conductive threads are shared between the first and second passive elements.

In some embodiments of the device, in the first and/or second passive elements, the plurality of insulating layers and the plurality of conductive layers are on a same side as the at least one sensing layer.

In some embodiments of the device, in the first and/or second passive elements, first and second conductive layers of the plurality of conductive layers each comprise a pattern of the electrically conductive material to control the resistive, capacitive, and/or inductive characteristics of the passive element.

In some embodiments of the device, in the first and/or second passive elements, for the at least one sensing layer and/or at least some of the plurality of conductive layers, a thickness of material, a chemical composition, a porosity, an area of intersecting region of the top and bottom conductive layers, a thickness of traces, a number of turns in a pattern, a separation between intertwined conductive traces, and/or a distance from a sensitive material is selected to control a response time, an input dynamic range, an output dynamic range, a bandwidth, a signal-to-noise ratio, a common-noise rejection ratio, a signal gain, a sensitivity, and/or an insensitivity of the device.

In some embodiments of the device, the first and second conductive layers are positioned on opposite sides of the sensing layer from each other; the at least one semi-porous layer comprises first and second semi-porous layers; the first semi-porous layer is disposed between the first conductive layer and the sensing layer; the second semi-porous layer is disposed between the second conductive layer and the sensing layer; and the semi-porous material of each of the first and second semi-porous layers is selected to control a response time, an input dynamic range, an output dynamic range, a bandwidth, a signal-to-noise ratio, a common-noise rejection ratio, a signal gain, a sensitivity, and/or an insensitivity of the device.

In some embodiments, the device comprises one or more additional layer bonded to the first and/or second insulating layers, the one or more additional layers comprising one or more of fabric, glass, wood, gravel, synthetic, leather, organic-like material, and a metal-like material.

In some embodiments of the device, each of the plurality of insulating layers, the at least one sensing layer, the plurality of conductive layers, and the at least one semi-porous layer are bonded together using one or more of sewing, embroidery, heat-pressing, adhesives, ultrasonic welding, folding, crimping, and casting.

In some embodiments of the device, an edge of the device is finished via one or more of sewing, embroidery, heat-pressing, adhesives, ultrasonic welding, folding, crimping, and casting.

In some embodiments of the device, the plurality of electrically conductive threads is configured to be disposed at any location on and/or within the device.

In some embodiments of the device, the plurality of electrically conductive threads is folded into separate layers within the device.

In some embodiments of the device, the plurality of electrically conductive threads is disposed via one or more of sewing, weaving, knitting, lacing, depositing, and embroidery; and/or the plurality of electrically conductive threads is padded with porous materials or semi-conductive materials within the device.

In some embodiments of the device, the plurality of electrically conductive threads is attached to passive or active filtering components configured to perform one or more operations comprising low-pass, high-pass, band-pass, and/or notch filtering.

In some embodiments of the device, the plurality of electrically conductive threads is terminated onto a connector attached to a controller, which is configured to assemble incoming data, thereby creating assembled data, and transmit the assembled data to a receiving device.

In some embodiments of the device, an area between points where the sensing layer is contacted by the plurality of electrically conductive threads determines an area over which the passive element is sensitive.

In some embodiments of the device, the at least one sensing layer comprises a plurality of sensing layers, which are configured to differentially determine a direction of a stimulus applied to the device in any of an X-, Y-, and Z-plane.

In some embodiments, the device comprises switches configured to toggle measurement of one of the plurality of sensing layers.

In some embodiments, the device is configured to use logic gates, clocks, and/or CPUs to time and deconvolve output signals from the plurality of sensing layers.

In some embodiments of the device, the one or more electrically conductive threads comprise a plurality of electrically conductive threads, which are folded into separate layers within the device.

In some embodiments, the device is configured such that, by altering an input signal on at least one of the conductive materials of the one or more conductive layers, a signal from the passive element is differentially turned on or off, or enters a high-Z state via the at least one semi-porous layer.

In some embodiments, the device is configured to enter an on state, an off state, or a high-Z state based on a direction of a stimulus applied to the device, when the direction of the stimulus is in a same direction in which the at least one semi-porous layer is positioned between one of the plurality of conductive layers and the at least one sensing layer.

In some embodiments of the device, the first and second passive elements is configured for cutting and/or folding in any of X-, Y-, and Z-directions to differentially measure a stimulus applied to the device in any of an X-, Y-, and Z-plane, respectively.

In some embodiments, the device is configured for interaction with a user for motion acquisition purposes.

In some embodiments, the device is foldable, bendable, and/or rollable by the user.

In some embodiments, the device is configured to be stored, carried, and/or transported by the user.

In some embodiments, the device is configured for installation onto one or more of wood, metal, ceramic, glass, plastic, foam, turf, gravel, carpet, synthetic, organic, and metamaterials.

In some embodiments, the device is configured to connect to a receiving device for use online, offline, cloud-based, and external storage applications.

In some embodiments, the device is configured to generate data for use by the user for algorithmic and/or computerized activities.

In some embodiments, the device is configured to generate data for use for machine-learning activities.

In some embodiments of the device, the first and second passive devices are arranged spaced apart from each other in X-, Y-, and/or X-directions, such that the device is configured to differentially measure a stimulus applied to the device in an X-, Y-, and/or Z-plane, respectively.

According to another example embodiment, a method of manufacturing a sensing device is provided herein, the method comprising: sequentially stacking a plurality of individual layers on top of each other to form a passive element, the passive element comprising: a plurality of insulating layers, each of which comprise an insulating material; at least one sensing layer, each of which comprise a conductive or a semi-conductive material; a plurality of conductive layers, each of which comprises an electrically conductive material; and at least one semi-porous layer, each of which comprises a semi-porous material; wherein all of the plurality of conductive layers are separated from each other by one or more of the plurality of insulating layers, one or more of the at least one sensing layer, and/or one or more of the at least one semi-porous layer; optionally, wherein at least some or all of the plurality of conductive layers are spaced apart from the at least one sensing layer by the at least one semi-porous layer; and wherein the passive element comprises one or more of resistive, capacitive, and inductive characteristics; the method further comprising: disposing a first insulating layer over a top surface of the passive element; disposing a second insulating layer over a bottom surface of the passive element; and electromechanically attaching each of one or more electrically conductive threads to one of the plurality of conductive layers, such that each of the one or more electrically conductive threads is exposed on and/or embedded within the first insulating layer or the second insulating layer.

In some embodiments, the method comprises cutting and/or folding the plurality of individual layers for stacking on top of each other; and securing the plurality of individual layers together by one or more of sewing, embroidery, heat-pressing, adhesives, ultrasonic welding, folding, crimping, and/or casting.

In some embodiments, the method comprises cutting and/or folding the sensing device to conform to irregular surface geometries, optionally, wherein the irregular surface geometries comprise on one or more of cloths, body parts, vehicles, appliances, and/or furniture.

In some embodiments of the method, the plurality of insulating layers and the plurality of conductive layers are on a same side as the at least one sensing layer.

In some embodiments of the method, first and second conductive layers of the plurality of conductive layers each comprise a pattern of the electrically conductive material to control the resistive, capacitive, and/or inductive characteristics of the passive element.

In some embodiments, the method comprises selecting, for the at least one sensing layer and/or at least some of the plurality of conductive layers, a thickness of material, a chemical composition, a porosity, an area of intersecting region of the top and bottom conductive layers, a thickness of traces, a number of turns in a pattern, a separation between intertwined conductive traces, and/or a distance from a sensitive material to control a response time, an input dynamic range, an output dynamic range, a bandwidth, a signal-to-noise ratio, a common-noise rejection ratio, a signal gain, a sensitivity, and/or an insensitivity of the sensing device.

In some embodiments of the method, the first and second conductive layers are positioned on opposite sides of the sensing layer from each other; and the at least one semi-porous layer comprises first and second semi-porous layers; the method further comprising: disposing the first semi-porous layer between the first conductive layer and the sensing layer; and disposing the second semi-porous layer between the second conductive layer and the sensing layer; wherein the semi-porous material of each of the first and second semi-porous layers is selected to control a response time, an input dynamic range, an output dynamic range, a bandwidth, a signal-to-noise ratio, a common-noise rejection ratio, a signal gain, a sensitivity, and/or an insensitivity of the sensing device.

In some embodiments, the method comprises bonding one or more additional layer to the first and/or second insulating layers, the one or more additional layers comprising one or more of fabric, glass, wood, gravel, synthetic, leather, organic-like material, and a metal-like material.

In some embodiments, the method comprises bonding together, using one or more of sewing, embroidery, heat-pressing, adhesives, ultrasonic welding, folding, crimping, and casting, each of the plurality of insulating layers, the at least one sensing layer, the plurality of conductive layers, and the at least one semi-porous layer.

In some embodiments, the method comprises finishing, via one or more of sewing, embroidery, heat-pressing, adhesives, ultrasonic welding, folding, crimping, and casting, an edge of the sensing device.

In some embodiments of the method, the one or more electrically conductive threads comprise a plurality of electrically conductive threads that are disposed at any location on and/or within the sensing device.

In some embodiments of the method, the plurality of electrically conductive threads is disposed via one or more of sewing, weaving, knitting, lacing, depositing, and embroidery; and/or the plurality of electrically conductive threads is padded with porous materials or semi-conductive materials within the device.

In some embodiments, the method comprises padding the plurality of electrically conductive threads with porous materials or semi-conductive materials within the sensing device.

In some embodiments, the method comprises attaching the plurality of electrically conductive threads to passive or active filtering components to perform one or more operations comprising low-pass, high-pass, band-pass, and/or notch filtering.

In some embodiments, the method comprises: terminating the plurality of electrically conductive threads onto a connector attached to a controller; assembling, using the controller, incoming data, to create assembled data; and transmitting the assembled data to a receiving device.

In some embodiments of the method, an area between points where the sensing layer is contacted by the plurality of electrically conductive threads determines an area over which the passive element is sensitive.

In some embodiments of the method, the at least one sensing layer comprises a plurality of sensing layers, the method comprising differentially determining, using the plurality of sensing layers, a direction of a stimulus applied to the sensing device in any of an X-, Y-, and Z-plane.

In some embodiments of the method, the sensing device comprises switches, the method comprising using the switches to toggle measurement of one of the plurality of sensing layers.

In some embodiments, the method comprises using logic gates, clocks, and/or CPUs to time and deconvolve output signals from the plurality of sensing layers.

In some embodiments of the method, the one or more electrically conductive threads comprise a plurality of electrically conductive threads, which are folded into separate layers within the sensing device.

In some embodiments, the method comprises altering an input signal on at least one of the conductive materials of the one or more conductive layers, to control a signal from the passive element to be differentially turned on or off, or to enter a high-Z state via the at least one semi-porous layer.

In some embodiments of the method, the sensing device enters an on state, an off state, or a high-Z state based on a direction of a stimulus applied to the sensing device, when the direction of the stimulus is in a same direction in which the at least one semi-porous layer is positioned between one of the plurality of conductive layers and the at least one sensing layer.

In some embodiments, the method comprises cutting and/or folding the passive element in any of X-, Y-, and Z-directions to differentially measure a stimulus applied to the sensing device in any of an X-, Y-, and Z-plane, respectively.

In some embodiments of the method, the sensing device can interact with a user for motion acquisition purposes.

In some embodiments of the method, the sensing device is foldable, bendable, and/or rollable by the user.

In some embodiments of the method, the sensing device can be stored, carried, and/or transported by the user.

In some embodiments, the method comprises installing the sensing device onto one or more of wood, metal, ceramic, glass, plastic, foam, turf, gravel, carpet, synthetic, organic, and metamaterials.

In some embodiments, the method comprises connecting the sensing device to a receiving device, for use online, offline, cloud-based, and external storage applications.

In some embodiments of the method, the sensing can generate data for use by the user for algorithmic and/or computerized activities.

In some embodiments of the method, the sensing device can generate data for use for machine-learning activities.

In some embodiments, the method comprises optimizing sew paths of the one or more electrically conductive threads to enhance a signal-to-noise ratio and/or a common-mode rejection of the sensing device, optionally, wherein optimizing sew paths comprises using one or more search algorithms, optionally, the one or more search algorithms comprising a depth-first search, a breadth-first search, nearest neighbor, and clustering.

According to another example embodiment, a method of manufacturing a sensing device is provided herein, the method comprising: sequentially stacking a first plurality of individual layers on top of each other to form a first passive element; sequentially stacking a second plurality of individual layers on top of each other to form a second passive element; wherein each of the first and second passive elements comprise: a plurality of insulating layers, each of which comprise an insulating material; at least one sensing layer, each of which comprise a conductive or a semi-conductive material; a plurality of conductive layers, each of which comprises an electrically conductive material; and at least one semi-porous layer, each of which comprises a semi-porous material; wherein all of the plurality of conductive layers are separated from each other by one or more of the plurality of insulating layers, one or more of the at least one sensing layer, and/or one or more of the at least one semi-porous layer; optionally, wherein at least some or all of the plurality of conductive layers are spaced apart from the at least one sensing layer by the at least one semi-porous layer; and wherein each of the first and second passive element comprises one or more of resistive, capacitive, and inductive characteristics; the method further comprising: disposing a first insulating layer over a top surface of the first and second passive elements; disposing a second insulating layer over a bottom surface of the first and second passive elements; and electromechanically attaching each of a plurality of electrically conductive threads to one of the plurality of conductive layers of the first and/or second passive elements, such that each of the plurality of electrically conductive threads is exposed on and/or embedded within one or more of the first passive element, the second passive element, and the first and second insulating layers; optionally, wherein the first and second passive elements are arranged to form a laterally-extending array of passive elements.

In some embodiments, the method comprises cutting and/or folding the first plurality of individual layers of the first passive element and/or the second plurality of individual layers of the second passive element for embedding within layers of a fabric material by one or more of sewing, embroidery, heat-pressing, adhesives, ultrasonic welding, folding, crimping, and/or casting.

In some embodiments, the method comprises cutting and/or folding the sensing device to conform to irregular surface geometries, optionally, wherein the irregular surface geometries comprise on one or more of cloths, body parts, vehicles, appliances, and/or furniture.

In some embodiments, the method comprises combining the first passive element and the second passive element in a configuration on a same surface of the fabric, on opposing surfaces of the fabric, on separate surfaces of the fabric, cut and stacked on top of each other, or folded together.

In some embodiments, the method comprises the first passive element and the second passive element share at least one of the plurality of electrically conductive threads.

In some embodiments, the method comprises selecting an angular position the first passive element relative to the and second passive element to control a directional sensitivity of the sensing device and/or an average sensitivity of the sensing device.

In some embodiments, the method comprises selecting a surface area of the first passive element and/or of the second passive element to control a response time, an input dynamic range, an output dynamic range, a signal-to-noise ratio, a common-noise rejection ratio, a signal gain, a sensitivity, and/or an insensitivity of the sensing device.

In some embodiments, the method comprises selecting a thickness of the first passive element and/or of the second passive element to control a response time, an input dynamic range, an output dynamic range, a signal-to-noise ratio, a common-noise rejection ratio, a signal gain, a sensitivity, and/or an insensitivity of the sensing device.

In some embodiments, the method comprises selecting a spacing between the first passive element and/or of the second passive element to control a response time, an input dynamic range, an output dynamic range, a signal-to-noise ratio, a common-noise rejection ratio, a signal gain, sensitivity, and/or an insensitivity of the sensing device.

In some embodiments, the method comprises interpolating a signal from the first passive element and a signal from the second passive element to form a secondary signal that is located within the first passive element and the second passive element.

In some embodiments, the method comprises differentially reading a signal from the first passive element and/or the second passive element via a serial communication protocol comprising one or more of single-wire, two-wire, MOSI-MISO, PCI, bus, and serial peripheral interfaces.

In some embodiments, the method comprises altering an input signal on at least one of the conductive materials of the plurality of conductive layers of the first and/or second passive elements, such that a signal from the first passive element and/or the second passive element is differentially turned on or off, or enters a high-Z state via the at least one semi-porous layer of the first and/or second passive element, respectively.

In some embodiments of the method, the plurality of electrically conductive threads are shared between the first and second passive elements.

In some embodiments of the method, in the first and/or second passive elements, the plurality of insulating layers and the plurality of conductive layers are on a same side as the at least one sensing layer.

In some embodiments of the method, in the first and/or second passive elements, first and second conductive layers of the plurality of conductive layers each comprise a pattern of the electrically conductive material to control the resistive, capacitive, and/or inductive characteristics of the passive element.

In some embodiments of the method, in the first and/or second passive elements, for the at least one sensing layer and/or at least some of the plurality of conductive layers, a thickness of material, a chemical composition, a porosity, an area of intersecting region of the top and bottom conductive layers, a thickness of traces, a number of turns in a pattern, a separation between intertwined conductive traces, and/or a distance from a sensitive material is selected to control a response time, an input dynamic range, an output dynamic range, a bandwidth, a signal-to-noise ratio, a common-noise rejection ratio, a signal gain, a sensitivity, and/or an insensitivity of the sensing device.

In some embodiments of the method, for one or both of the first and second passive elements: the first and second conductive layers are positioned on opposite sides of the sensing layer from each other; the at least one semi-porous layer comprises first and second semi-porous layers; the first semi-porous layer is disposed between the first conductive layer and the sensing layer; the second semi-porous layer is disposed between the second conductive layer and the sensing layer; and the semi-porous material of each of the first and second semi-porous layers is selected to control a response time, an input dynamic range, an output dynamic range, a bandwidth, a signal-to-noise ratio, a common-noise rejection ratio, a signal gain, a sensitivity, and/or an insensitivity of the sensing device.

In some embodiments, the method comprises bonding one or more additional layer to the first and/or second insulating layers, the one or more additional layers comprising one or more of fabric, glass, wood, gravel, synthetic, leather, organic-like material, and a metal-like material.

In some embodiments, the method comprises, for one or both of the first and second passive elements, bonding together each of the plurality of insulating layers, the at least one sensing layer, the plurality of conductive layers, and the at least one semi-porous layer using one or more of sewing, embroidery, heat-pressing, adhesives, ultrasonic welding, folding, crimping, and casting.

In some embodiments, the method comprises finishing an edge of the sensing device via one or more of sewing, embroidery, heat-pressing, adhesives, ultrasonic welding, folding, crimping, and casting.

In some embodiments, the method comprises disposing the plurality of electrically conductive threads at any location on and/or within the sensing device.

In some embodiments, the method comprises folding the plurality of electrically conductive threads into separate layers within the sensing device.

In some embodiments, the method comprises: disposing the plurality of electrically conductive threads via one or more of sewing, weaving, knitting, lacing, depositing, and embroidery; and/or padding the plurality of electrically conductive threads with porous materials or semi-conductive materials within the device.

In some embodiments, the method comprises attaching the plurality of electrically conductive threads to passive or active filtering components that perform one or more operations comprising low-pass, high-pass, band-pass, and/or notch filtering.

In some embodiments, the method comprises: terminating the plurality of electrically conductive threads onto a connector attached to a controller; assembling, using the controller, incoming data, to create assembled data; and transmitting the assembled data to a receiving device.

In some embodiments of the method, an area between points where the sensing layer is contacted by the plurality of electrically conductive threads determines an area over which the passive element is sensitive.

In some embodiments of the method, in the first and/or second passive elements, the at least one sensing layer comprises a plurality of sensing layers, the method comprising differentially determining, via the plurality of sensing layers, a direction of a stimulus applied to the sensing device in any of an X-, Y-, and Z-plane.

In some embodiments of the method, the first and/or second passive elements comprises switches, the method comprising using one or more of the switches to toggle measurement of one of the plurality of sensing layers of the first and/or second passive elements.

In some embodiments, the method comprises using logic gates, clocks, and/or CPUs to time and deconvolve output signals from the plurality of sensing layers of the first and/or second passive elements.

In some embodiments, the method comprises folding the plurality of electrically conductive threads into separate layers within the sensing device.

In some embodiments, the method comprises, for the first and/or second passive elements, altering an input signal on at least one of the conductive materials of the one or more conductive layers, such that a signal from the first and/or second passive elements, respectively, is differentially turned on or off, or enters a high-Z state via the at least one semi-porous layer.

In some embodiments, the method comprises: applying a stimulus to the sensing device in a direction; and, based on the direction of the stimulus relative to the sensing device, the first and/or second passive element entering an on state, an off state, or a high-Z state when the direction of the stimulus is in a same direction in which the at least one semi-porous layer is positioned between one of the plurality of conductive layers and the at least one sensing layer for the first and/or second passive elements, respectively.

In some embodiments, the method comprises cutting and/or folding the first and second passive elements in any of X-, Y-, and Z-directions to differentially measure a stimulus applied to the sensing device in any of an X-, Y-, and Z-plane, respectively.

In some embodiments of the method, the sensing device can interact with a user for motion acquisition purposes.

In some embodiments of the method, the sensing device is foldable, bendable, and/or rollable by the user.

In some embodiments of the method, the sensing device can be stored, carried, and/or transported by the user.

In some embodiments, the method comprises installing the sensing device onto one or more of wood, metal, ceramic, glass, plastic, foam, turf, gravel, carpet, synthetic, organic, and metamaterials.

In some embodiments, the method comprises connecting the sensing device to a receiving device for use online, offline, cloud-based, and external storage applications.

In some embodiments of the method, the sensing device can generate data for use by the user for algorithmic and/or computerized activities.

In some embodiments of the method, the sensing device can generate data for use for machine-learning activities.

In some embodiments, the method comprises arranging the first and second passive elements spaced apart from each other in X-, Y-, and/or X-directions, such that the sensing device can differentially measure a stimulus applied to the sensing device in an X-, Y-, and/or Z-plane, respectively.

In some embodiments, the method comprises optimizing sew paths of the plurality of electrically conductive threads to enhance a signal-to-noise ratio and/or a common-mode rejection of the sensing device, optionally, wherein optimizing sew paths comprises using one or more search algorithms, optionally, the one or more search algorithms comprising a depth-first search, a breadth-first search, nearest neighbor, and clustering.

In some embodiments, the method comprises controlling one or more of tension, pitch, duty cycle, stitch width, and stitch length of one or more of the plurality of electrically conductive threads on different layers, so that the first and second passive elements overlap each other and, optionally, do not intersect the electrically conductive threads or connections of each other.

In some embodiments, the method comprises: folding and/or cutting layers of the sensing device; and deforming the sensing device in a two- or three-dimensional geometry; wherein, through the folding and/or cutting and deforming of the sensing device, the first and second passive elements and the plurality of electrically conductive threads associated therewith overlap each other and, optionally, do not intersect the electrically conductive threads or connections of each other.

According to another example embodiment, a sensing system is provided herein, the sensing system comprising a plurality of the devices according to the subject matter disclosed herein, wherein the plurality of the devices are arranged in a form of an array, or matrix, of devices.

According to another example embodiment, a method of manufacturing a sensing system is disclosed herein, the method comprising: providing a plurality of the devices according to the subject matter disclosed herein; and arranging the plurality of the devices in a form of an array, or matrix, of devices.

In some embodiments, the device comprises a layered fabric surface, the layered fabric surface comprising: a first passive element, having a characteristic selected from the group consisting of a resistive, capacitive, or inductive characteristics, comprising: a first layer serving as a flexible substrate; a second layer serving as a conductive layer, wherein the second layer is bonded to the first layer; a third layer serving as a semi-conductive layer, wherein the third layer is layered on top of the second layer; a fourth layer serving as a conductive layer, wherein the fourth layer is layered on top of the third layer; and a fifth layer serving as a flexible substrate, wherein the fifth layer is bonded to the fourth layer; a first insulating element, wherein the first insulating element is layered on top of the first passive element; a second insulating element, wherein the second insulating element is layered below the first passive element; and a plurality of conductive materials, wherein the plurality of conductive materials is electromechanically attached to the first passive element, and wherein the plurality of conductive materials are electromechanically exposed on or embedded in the first insulating element or the second insulating element.

In some embodiments, the layers comprising the first passive element are configured to be embedded and folded within the layers performed through processes selected from the group consisting of sewing, embroidery, heat-pressing, adhesives, ultrasonic welding, folding, and casting.

In some embodiments, the first layer of the passive element and second layer of the passive element are on the same side as the fourth layer of the passive element and fifth layer of the passive element.

In some embodiments, a pattern of the conductive material on the second layer of the passive element and a pattern of the conductive material on the fourth layer of the passive element are configured to alter the resistive, capacitive, or conductive properties of the first passive element.

In some embodiments, a thickness of material, a chemical composition, a porosity, an area of intersecting region of the top and bottom conductive layers, a thickness of traces, a number of turns in a pattern, a separation between intertwined conductive traces, or a distance from a sensitive material is configured to alter a response time, an input dynamic range, an output dynamic range, a signal-to-noise ratio, a common-noise rejection ratio, a signal gain, a sensitivity of the device, or an insensitivity of the device.

In some embodiments, an additional layer is placed between the second layer of the passive element and third layer of the passive element, or between the fourth layer of the passive element and third layer of the passive element, to alter a response time, an input dynamic range, an output dynamic range, a signal-to-noise ratio, a common-noise rejection ratio, a signal gain, a sensitivity of the device, or an insensitivity of the device.

In some embodiments, an additional layer is bonded to the first insulating layer or to the second insulating layer of the device, and wherein a material of the additional layer is selected from the group consisting of a glass, wood, gravel, synthetic, leather, and metal-like material.

In some embodiments, each layer is bonded using a technique selected from the group consisting of sewing, embroidery, heat-pressing, adhesives, ultrasonic welding, and casting.

In some embodiments, an edge of the device is finished from a process selected from the group consisting of sewing, embroidery, heat-pressing, adhesives, ultrasonic welding, and casting.

In some embodiments, the plurality of conductive materials is configured to be placed at any location within the device.

In some embodiments, the plurality of conductive materials is folded into separate layers within the device.

In some embodiments, the plurality of conductive materials is made through a process selected from the group consisting of sewing, weaving, embroidery, bonding, heat-pressing, screen printing, vinyl cutting, and ink-jet printing.

In some embodiments, the plurality of conductive materials is padded with porous materials or semi-conductive materials within the device.

In some embodiments, the plurality of conductive materials is attached to passive or active filtering components configured to perform operations selected from the group consisting of low-pass, high-pass, band-pass, and notch filtering.

In some embodiments, the plurality of conductive materials is terminated onto a connector, wherein the connector is attached to a controlling module configured to assemble incoming data and transmit the assembled data to a receiving device connected to the Internet.

In some embodiments, the device comprises a layered fabric surface, the layered fabric surface comprising: a first passive element, having a characteristic selected from the group consisting of a resistive, capacitive, or inductive characteristics; a second passive element, having a characteristic selected from the group consisting of a resistive, capacitive, or inductive characteristics; a first insulating element, wherein the first insulating element is layered on top of the first passive element; a second insulating element, wherein the second insulating element is layered below the first passive element; a plurality of conductive materials, wherein the plurality of conductive materials are electromechanically attached to, exposed on, or embedded in the first passive element and second passive element.

In some embodiments, the layers comprising the first passive element can be embedded and folded within the existing layers through processes selected from the group consisting of sewing, embroidery, heat-pressing, adhesives, ultrasonic welding, folding, and casting.

In some embodiments, the first passive element and the second passive element are combined in a configuration selected from the group consisting of the same surface, opposing surfaces, stacked on one another, and folded together.

In some embodiments, the first passive element and the second passive element share at least one of the conductive materials out of the plurality of conductive materials.

In some embodiments, a relative angle positioning of the first passive element and the second passive element alters the directional sensitivity of the device as well as an overall average sensitivity of the device.

In some embodiments, a surface area of the first passive element or the second passive element alters a response time, an input dynamic range, an output dynamic range, a signal-to-noise ratio, a common-noise rejection ratio, a signal gain, a sensitivity of the sensor, or an insensitivity of the device.

In some embodiments, a thickness of the first passive element or the second passive element alters a response time, an input dynamic range, an output dynamic range, a signal-to-noise ratio, a common-noise rejection ratio, a signal gain, a sensitivity of the sensor, or an insensitivity of the device.

In some embodiments, a spacing between the first passive element or the second passive element alters a response time, an input dynamic range, an output dynamic range, a signal-to-noise ratio, a common-noise rejection ratio, a signal gain, sensitivity of the sensor, or an insensitivity of the device.

In some embodiments, a signal from the first passive element and the signal from the second passive element is interpolated to form a secondary signal that is located within the first passive element and the second passive element.

In some embodiments, a signal from the first passive element or the second passive element is differentially read through serial communication protocols selected from the group consisting of single-wire, two-wire, MOSI-MISO, PCI, bus, and serial peripheral interfaces.

In some embodiments, a signal from the first passive element or the second passive element is differentially turned on or off by altering the voltage on at least one of the conductive materials of the plurality of conductive materials.

In some embodiments, the plurality of conductive materials is shared between the first passive element and the second passive element.

In some embodiments, an edge of the device are finished from a process selected from the group consisting of sewing, embroidery, heat-pressing, adhesives, ultrasonic welding, and casting.

In some embodiments, the plurality of conductive materials is configured to be placed at any location within the device.

In some embodiments, the plurality of conductive materials is folded into separate layers within the device.

In some embodiments, the plurality of conductive materials is made through a process selected from the group consisting of sewing, weaving, embroidery, bonding, heat-pressing, screen printing, vinyl cutting, and ink-jet printing.

In some embodiments, the plurality of conductive materials is padded with porous materials or semi-conductive materials within the device.

In some embodiments, the plurality of conductive materials is attached to passive or active filtering components configured to perform operations selected from the group consisting of low-pass, high-pass, band-pass, and notch filtering.

In some embodiments, the plurality of conductive materials is terminated onto a connector, wherein the connector is attached to a controlling module configured to assemble incoming data and transmit the assembled data to a receiving device connected to the Internet.

In some embodiments, the device comprises a layered fabric surface configured to be handled by a user for motion acquisition purposes.

In some embodiments, the user is able to fold, bend, or roll the device.

In some embodiments, the user is able to store, carry, or transport the device.

In some embodiments, the user is able to install the device onto surfaces selected from the group consisting of wood, metal, ceramic, glass, plastic, foam, turf, gravel, carpet, synthetic, and metamaterials.

In some embodiments, the device is able to connect to a receiving device for a use selected from the group consisting of online, offline, cloud, and external storage.

In some embodiments, the user is able to use data for algorithmic and computerized activities.

In some embodiments, the user is able to use data for machine learning activities.

BRIEF DESCRIPTION OF THE DRAWINGS

The accompanying figures illustrate a number of exemplary embodiments and are a part of the specification. Together with the following description, these figures demonstrate and explain various principles of the instant disclosure.

FIG. 2B is a sectional view showing an example embodiment of the stitching pattern in which the top thread has a higher tension.

FIG. 2C is a sectional view showing an example embodiment of the stitching pattern in which the top thread has a lower tension.

FIGS. 8A-8F are sectional views of respective example embodiments in which conductive threads are assembled in multiple conductive layers to form a system of electrodes for signal transmission.

DETAILED DESCRIPTION

Figure 1A:
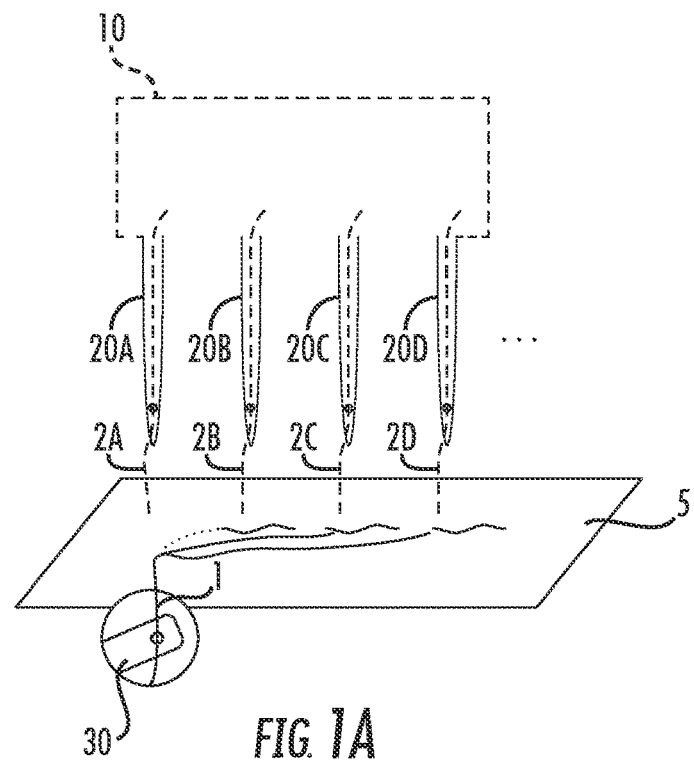
FIG. 1A is a schematic illustration of an example embodiment of a computer numerical controlled (CNC) multi-needle embroidery machine.

The presently disclosed subject matter now will be described more fully hereinafter, in which some, but not all embodiments of the presently disclosed subject matter are described. Indeed, the presently disclosed subject matter can be embodied in many different forms and should not be construed as limited to the embodiments set forth herein; rather, these embodiments are provided so that this disclosure will satisfy applicable legal requirements.

The terminology used herein is for the purpose of describing particular embodiments only and is not intended to be limiting of the presently disclosed subject matter.

While the following terms are believed to be well understood by one of ordinary skill in the art, the following definitions are set forth to facilitate explanation of the presently disclosed subject matter.

All technical and scientific terms used herein, unless otherwise defined below, are intended to have the same meaning as commonly understood by one of ordinary skill in the art. References to techniques employed herein are intended to refer to the techniques as commonly understood in the art, including variations on those techniques or substitutions of equivalent techniques that would be apparent to one of skill in the art. While the following terms are believed to be well understood by one of ordinary skill in the art, the following definitions are set forth to facilitate explanation of the presently disclosed subject matter.

In describing the presently disclosed subject matter, it will be understood that a number of techniques and steps are disclosed. Each of these has individual benefit and each can also be used in conjunction with one or more, or in some cases all, of the other disclosed techniques.

Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Following long-standing patent law convention, the terms "a", "an", and "the" refer to "one or more" when used in this application, including the claims. Thus, for example, reference to "a cell" includes a plurality of such cells, and so forth.

Unless otherwise indicated, all numbers expressing quantities of ingredients, reaction conditions, and so forth used in the specification and claims are to be understood as being modified in all instances by the term "about". Accordingly, unless indicated to the contrary, the numerical parameters set forth in this specification and attached claims are approximations that can vary depending upon the desired properties sought to be obtained by the presently disclosed subject matter.

As used herein, the term "about," when referring to a value or to an amount of a composition, dose, sequence identity, mass, weight, temperature, time, volume, concentration, percentage, etc., is meant to encompass variations of in some embodiments±20%, in some embodiments±10%, in some embodiments±5%, in some embodiments±1%, in some embodiments±0.5%, and in some embodiments±0.1% from the specified amount, as such variations are appropriate to perform the disclosed methods or employ the disclosed compositions.

The term "comprising", which is synonymous with "including" "containing" or "characterized by" is inclusive or open-ended and does not exclude additional, unrecited elements or method steps. "Comprising" is a term of art used in claim language which means that the named elements are essential, but other elements can be added and still form a construct within the scope of the claim.

As used herein, the phrase "consisting of" excludes any element, step, or ingredient not specified in the claim. When the phrase "consists of" appears in a clause of the body of a claim, rather than immediately following the preamble, it limits only the element set forth in that clause; other elements are not excluded from the claim as a whole.

As used herein, the phrase "consisting essentially of" limits the scope of a claim to the specified materials or steps, plus those that do not materially affect the basic and novel characteristic(s) of the claimed subject matter.

With respect to the terms "comprising", "consisting of", and "consisting essentially of", where one of these three terms is used herein, the presently disclosed and claimed subject matter can include the use of either of the other two terms.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

Sewing, embroidery, overlocking, and similar types sewing and threading techniques require an interlocking mechanism between a top thread, also known as a carrier thread, and a bottom thread, also known as a bobbin thread. The terms "top thread" and "carrier thread" may be used interchangeably herein. Similarly, the terms "bottom thread" and "bobbin thread" may be used interchangeably herein. There can be multiple top threads used in a sewing machine, which require an equivalent amount of sewing needles (e.g., four top threads would require four sewing needles). Multiple top threads allow for the use of more complex sewing patterns, which can be used, for example, to strengthen or reinforce sewing lines, seams, hems, and embroidery patterns, and/or to add new mechanical properties to the material(s) into which the threads are sewn, such new mechanical properties including, for example, changing (e.g., increasing and/or decreasing, such as in different regions) elasticity, stretchability, twistability, bendability, and the like.

To manufacture a fabric-based device, at least one of the threads (e.g., top and/or bobbin threads) must be conductive (e.g., having an electrical conductivity of greater than about 1 Siemens/meter), with the remaining threads being electrically insulating (e.g., having characteristics of an electrical insulator, having an electrical conductivity of less than about 1 Siemens/meter). For n>2 and n>m, where n is the number of sewing needles and top threads and where m is the number of conductive threads, the number of conductive threads to insulating thread(s) follow a variety of different combinations according to the relationship $$\frac{n!}{m!(n-m)!}.$$

Separately, the bottom thread can either be a conductive thread or a non-conductive thread, thereby increasing the number of permutations by a factor of 2. Typically, the bottom thread and the top thread are applied from (e.g., sewn on) opposite sides of the fabric. The exposure of the top and bottom threads is controlled by the sewing pitch, tension applied to each of the threads during sewing, and the physical characteristics of the threads themselves. Under the user's control, the tension of one or more threads can be adjusted to expose the top and bottom thread on the same surface (e.g., the top surface) of the fabric. When the bottom thread and the top thread are exposed on the same surface, the sewing pitch and sewing pattern can be adjusted to either expose the bottom thread or to shroud the bottom thread with interlocking top thread(s) to minimize contact with neighboring threads. By reversing the tension (e.g., by decreasing the top thread tension and increasing the bottom thread tension, or the opposite), both the bottom thread and the top thread can be exposed on the other surface (e.g., the bottom surface) of the fabric; however, upon such reversal of the respective thread tensions, the bottom thread is not shrouded by the top thread(s), but instead overlaps the top thread(s). Under this setting, the top threads can be exposed or shrouded by the bottom thread(s).

Thus, using such principles of sewing, it is possible to build fabric-based semiconductive devices by strategically, or selectively, sewing conductive threads or fibers (used interchangeably herein) on a flexible surface, such conductive threads being capable, via sewing, of being routed in/on the top, bottom, or intermediate (e.g., middle) layers of a sewn flexible surface. In forming such fabric-based semiconductive devices, it is advantageous to minimize electrical interference between conductive threads, such that short-circuits and parasitic signal cross-talk can be avoided. Parameters that can guide the design of fabric-based devices through multiple conductive threads have been determined and include, for example, the following:

1. The number of conductive threads and insulating threads required,
2. The sewing pattern
3. The width of the sewing pattern
4. The length of each stitch, also known as pitch, of the sewing path
5. The number of sewn layers,
6. Which layers will be conductive, semiconductive, and/or insulating, and/or be sewn with conductive, semiconductive, and/or insulating threads
7. The tension between the conductive and non-conductive (insulating) thread In an example embodiment in which the device is formed in a multi-layer material (e.g., fabric) using 2 sewing needles, one providing a top thread and the other providing a bottom thread, which is a conductive thread, the relative tension between the top thread and the bottom thread determines in which of the layers of the multi-layer material the top and bottom threads are disposed. The pitch of the sewing pattern is selected to determine the length of the top and/or bottom thread that is exposed; the pattern's width, for example, a zig-zag pattern, is selected to determine the area of the exposed conductive region.

When an equal (e.g., same) tension is applied to both the top thread and the bottom thread, the top and bottom threads are independently exposed on their own layers. When there is a higher tension applied to the top thread than to the bottom thread, the top thread exerts a relatively higher tension force on the bottom thread at the sewn connection and the bottom thread is correspondingly pulled by the relatively higher tension of the top thread in the direction of the top thread (e.g., towards the top surface) and is exposed on the top surface of the multi-layer material, with correspondingly less of the bottom thread being exposed on the bottom surface. An increase in relative tension between the top and bottom threads increases the amount of bottom thread exposed on the top layer of the multi-layer material.

When there is a lower tension applied to the top thread than to the bottom thread, the bottom thread exerts a relatively higher tension force on the top thread at the sewn connection and the top thread is correspondingly pulled by the relatively higher tension of the bottom thread in the direction of the bottom thread (e.g., towards the bottom surface) and is exposed on the bottom surface of the multi-layer material. A decrease in relative tension between the top and bottom threads increases the amount of top thread exposed on the bottom layer of the multi-layer material.

As used herein, a definition for the term "pitch" can be the distance from the position where a needle penetrates the multi-layer material to the position where the needle next penetrates the multi-layer material; stated somewhat differently, the sewing "pitch" is the distance between the interlocking stitch from the top thread and bottom thread. When the sewing pitch increases, the amount (e.g., length) of the top and/or bottom thread(s) exposed on the top and/or bottom surface(s) increases. When the sewing pitch decreases, the amount (e.g., length) of the top and/or bottom thread(s) exposed on the top and/or bottom surface(s) decreases. Varying relative tension and sewing pitch several example sewing scenarios will be described hereinbelow.

When there is a neutral, or substantially equal, tension applied to the top thread and the bottom thread, the top thread is stitched so as to be exposed on (e.g., only on) the top surface of the multi-layer material and the bottom thread is stitched so as to be exposed on (e.g., only on) the bottom surface of the multi-layer material. When neutral tension is applied and the pitch increases, the exposed length of the top thread on the top surface increases and the exposed length of the bottom thread on the bottom surface increases. When neutral tension is applied and the pitch decreases, the exposed length of the top thread on the top surface decreases and the exposed length of the bottom thread on the bottom surface decreases When there is a greater, or higher magnitude, tension applied to the top thread than to the bottom thread, the top thread is stitched so as to be exposed on (e.g., only on) the top surface of the multi-layer material and the bottom thread is stitched so as to be exposed intermittently on the top surface of the multi-layer material. The portion of the bottom thread that is not exposed on the top surface of the multi-layer material is exposed on the bottom surface of the multi-layer material. When greater tension is applied to the top thread than to the bottom thread and the sewing pitch increases, the exposed length of the bottom thread on the bottom surface increases and the exposed length of the bottom thread on the top surface decreases; thus, the relative ratio of exposed bottom thread on the bottom surface compared to on the top surface increases and the exposed length of the top thread on the top surface increases. When greater tension is applied to the top thread than to the bottom thread and the sewing pitch decreases, the exposed length of the bottom thread on the bottom surface decreases and the exposed length of the bottom thread on the top surface increases; thus, the relative ratio of exposed bottom thread on the top surface compared to on the bottom surface increases and the exposed length of the top thread on the top surface decreases.

When there is a smaller, or lower magnitude, tension applied to the top thread than to the bottom thread, the bottom threat is stitched so as to be exposed on (e.g., only on) the bottom surface of the multi-layer material and the top thread is stitched so as to be exposed intermittently on the bottom surface of the multi-layer material. The portion of the top thread that is not exposed on the bottom surface of the multi-layer material is exposed on the top surface of the multi-layer material. When smaller tension is applied to the top thread than to the bottom thread and the sewing pitch increases, the exposed length of the top thread on the top surface increases and the exposed length of the top thread on the bottom surface decreases; thus, the relative ratio of exposed top thread on the top surface compared to on the bottom surface increases and the exposed length of the bottom thread on the bottom surface increases. When smaller tension is applied to the top thread than to the bottom thread and the sewing pitch decreases, the exposed length of the top thread on the top surface decreases and the exposed length of the top thread on the bottom surface increases; thus, the relative ratio of exposed top thread on the top surface compared to on the bottom surface decreases and the exposed length of the bottom thread on the bottom surface decreases.

Another term used herein is the "duty cycle," which can be defined as the ratio of the length of the thread (e.g., the top and/or bottom thread) exposed on the surface (e.g., the top and/or the bottom surface) of the multi-layer material, relative to the length of the thread (e.g., the top and/or bottom thread) that is penetrated into the surface (e.g., the top and/or the bottom surface) of the multi-layer material, or exposed on another surface (e.g., the opposing surface). The duty cycle, along with the relative tension and the sewing pitch, can be selected to control the amount (e.g., length) of a thread (e.g., the top and/or bottom thread) on the surface(s) (e.g., the top and/or the bottom surface) of the multi-layer material.

Exposure of the top and/or bottom thread(s) on the bottom, top, or within an internal layer of the multi-layer material is particularly advantageous in determining how multiple conductive threads carrying electrical signals, also known as signal wires, can be sewn into a material without overlapping, or cross-talking, with each other. As disclosed herein, controlling electrical signals between components and layers of an electric circuit is analogous to the design of electrical circuits in conventional printed circuits boards, where signals are transferred between routes, pours, vias, and the like.

According to an example embodiment, a first thread of conductive material may be sewn to form a first line in a horizontal direction, relative to the sewn (e.g., multi-layer) material, and a second thread of conductive material may be sewn to form a second line in the vertical direction, which is perpendicular to the first thread. Both of the first and second lines have the conductive thread on the bobbin, bottom thread, and the top thread contains a non-conductive, insulating thread. At the point where the first line intersects the second line, the tension of one or both of the sets of threads that form the first and second lines, respectively, is adjusted to avoid overlap and short-circuiting between the first thread and the second thread. For example, the set of threads that forms the horizontally sewn first line can maintain a neutral tension between the top and bottom threads, such that the top thread remains exposed on the top surface, and the bottom thread remains exposed on the bottom surface; in such an example, however, the vertically sewn second line could be sewn at the intersection point to have a higher tension applied to the top thread, such that the conductive second, bottom thread is pulled to the top surface. Additionally, the pitch and duty cycle of the first line and of the second line are respectively coordinated, such that the exposed conductive thread of the first line does not overlap with that of the second line on the top or bottom surface of the sewn material at the intersection point. In another example, applying a higher tension to the top thread than to the bottom thread in forming the first line and applying a neutral tension in forming the second line would also be sufficient.

In an example embodiment such as described immediately hereinabove, in which the orientation of the conductive threads was reversed, such that the top threads forming the first and second lines were the conductive threads and the bottom threads forming the first and second lines were the nonconductive threads, the opposite tension application/control from that which is described immediately hereinabove would be required. In such an example embodiment, either the first line or the second line would need to apply a lower tension to its top thread than to its bottom thread, while the other of the first or second lines would have a neutral tension applied to the top and bottom threads associated therewith.

According to another example embodiment, the top thread of the first line is formed of a conductive thread and the bottom thread of the first line is a non-conductive thread, while the top thread of the second line is formed of a non-conductive thread and the bottom thread of the second line is a conductive thread. In such an embodiment, there would be no requirement to apply a differential tension between the top and bottom threads in either the first or second lines; however, the respective pitch and duty cycle values for the first and second lines must be coordinated with each other, such that the exposed conductive thread of the first and second lines do not overlap each other on the top or bottom surfaces of the sewn material at the intersection point, which is where the first and second lines intersect each other. Although this is the simplest scenario, it may not be logistically viable to have a machine, or multiple machines, have different bottom thread or top thread types (e.g., conductive or non-conductive).

The sewing strategy discussed above can be applied to multiple layers of fabric that can be stacked, folded, or sewn together. Each layer is sewn with conductive threads before such stacking, folding, or sewing together. To layer multiple fabrics with conductive threads sewn therein, the area of exposed conductive threads must be controlled on all interfacing surfaces, such that no two neighboring or adjacent conductive threads contact each other to form a short-circuit. As already described elsewhere herein, controlling relative tension between the top and bottom threads may be utilized to move conductive threads to non-interfacing layers; similarly, a change in pitch and/or duty cycle may be used to help hide conductive threads into or on another surface of the sewn material at such intersection points when stacking multiple layers of sewn material together. In another example embodiment, layers of material can be stacked together prior to stitching any conductive threads therein and the conductive threads can then be sewn into the layers of material.

In another example embodiment, a single conductive pattern is sewn, or stitched, in/on a single piece of material (e.g., fabric). In such an embodiment, there exists an optimal sewn path, in which the sewing needle, as well as the thread (e.g., top thread or bottom thread) associated therewith, need not rise and move to another location on the material to start or resume another (e.g., second, different) conductive pattern. The rise and movement of the sewing needle and the thread associated therewith to another location on the material is commonly referred to as a jump stitch; jump stitching conductive threads between conductive patterns on a material will cause short-circuits in the resultant electric circuit. To optimize planning of the conductive patterns in/on the material and to reduce the amount of jump stitches, an algorithm (e.g., a method) for performing such optimization is disclosed herein, such algorithm being referred to herein as depth-first search. The depth-first search algorithm analyzes the nearest sewn node (e.g., where a sewn thread will branch, forming more than one electrically conductive path, such as may occur when components are connected in parallel) and recursively follows the planned sewn path until reaching a final node, at which there is no branch. The algorithm then queues the electrical route with the longest sequence of nodes and recursively (e.g., sequentially) traverses all remaining nodes until all electrical routes are queued. The algorithm then uses this sequence of electrical routes to program a machine to sew a pattern that connects all of the nodes, with the route having the longest chain of nodes being sewn first. When the route of a node is completed, the machine is configured to cut the thread and resume sewing onto the next node. Otherwise, the machine continues to sew onto the next node forming an undesired jump-stitch between nodes.

The depth-first search algorithm, traverses recursively the edges of each sewn path, referred to as nodes herein, until reaching a final node in a sewn path, at which point the algorithm reverses and searches for neighboring terminating nodes, for which it iteratively forms the edges of each sewn path branching off therefrom; this process is repeated to complete the sewn path in which no nodes remain. Depth-first search, rather than breadth-first search, it's complementary algorithm, allows for a stitched pattern, or circuit, to be planned (e.g., in advance) so that while sewing, the stitched pattern can be performed without performing, or at least minimizing, the quantity of back stitches or jump stitches, which would increase the amount of time it would take to form the stitched pattern, as well as costs associated with post-processing labor.

In some aspects, a textile-based mechanical sensor comprises a conductive input and a conductive output, which are also referred to herein as electrodes. These electrodes interface with an electromechanically sensitive region, which can have characteristics that are resistive, capacitive, and/or inductive in nature. The conductive input and conductive output interfaces can be on the same or opposite sides of a layer, typically a flexible material (e.g., fabric). The conductive input and output interfaces cannot overlap or cross each other, since that would cause a short-circuit and, necessarily, for the sensor to be inoperable. A device comprising such a textile-based mechanical sensor can comprise a conductive input, a conductive output, a layer in/on which the conductive input and output are disposed, and the electromechanically sensitive region. These layers can be stacked either vertically or horizontally. The conductive input and conductive output are configured to receive, for example, signals that are power, ground, digital, and analog (frequency modulated). In some embodiments, the conductive input and output can enter a "high-Z" state, which means the conductive input and output exhibit a highly resistive state mimicking that of an open circuit, or of a disconnected signal. No input or output signals can be received or transmitted at and/or through the input and/or output in this high-Z state. In some embodiments, a conductive input or conductive output can enter a high-Z state by using a switch before signals are transmitted thereby. In another embodiment, a conductive input and/or output can enter a high-Z state using an operational amplifier, which exhibits a high input impedance. In another embodiment, a conductive input and/or output can enter a high-Z state using a MOSFET, BJT, or similar transistors that exhibit high-Z behavior when powered by specific voltages or currents. In another embodiment, a conductive input and/or output can enter a high-Z state using a combinations of resistors, capacitors, inductors, and/or similar passive components to create high, low, notch, or bandpass filters to exhibit high input or output impedance at different frequency bands.

To electromechanically achieve a high-Z state in conductive, non-conductive, and semiconductive fabrics themselves, a semi-porous layer is incorporated between the electrodes and the electromechanically sensitive region. The semi-porous layer is configured to prevent signal (e.g., electron) flow from the electrodes to the electromechanically sensitive region when no input stimuli is added. However, when an electrical, mechanical, chemical, and/or magnetic change is provided to the device, the semi-porous layer will electrically, mechanically, chemically, and/or magnetically expand the pores associated therewith, or otherwise increase the conductivity thereof, such that the signals provided to the electrodes are transmitted to the electromechanically sensitive region. By way of example in which the device is mechanically responsive, mechanical changes (e.g., bending, twisting, stretching, and/or pressure) mechanically deform the pores of the semi-porous layer, which thus allows physical contact (e.g., in the form of an electrically conductive path, or circuit) between the electrode and the electromechanically sensitive region, which can, for example, result in activation (e.g., turning on) of the device.

In addition to such on, off, and a high-Z states, a sensor can stabilize to a controlled current or voltage level by being in a pull-up state or a pull-down state. A pull-up or pull-down state occurs when an electrode has a default voltage or current value when no external stimulus is added. Typically, the default value is high (VCC) or low (ground). A pull-up state is achieved by attaching a strong resistor (e.g., within the range of about 1 k$\Omega$ to about 1 M$\Omega$, inclusive) to a digital high value as well as the electrode. A pull-down state is achieved by attaching the resistor to a digital low value, such as ground, as well as to the electrode. In a pull-up state, the resistor is referred to as a pull-up resistor. In a pull-down state, the resistor is referred to as a pull-down resistor. When an external signal is provided to the device, the resistance of the pull-up or pull-down resistor is so high that the connection is seen as a shunt, or an open circuit. Therefore, an external signal may be transmitted to the electrode when the electrode is in a non-high-Z state.

In fabric, a pull-up or pull-down state can be achieved, for example, by using a combination of conductive, semiconductive, and non-conductive fabrics. The pull-up or pull-down resistors are woven, sewn, and/or layered onto an electrode with a connection to a high state or low state, respectively. Such a fabric-based pull-up or pull-down resistor can be manufactured to provide, for example, a high impedance (e.g., within the range of about 1 k$\Omega$ to about 1 M$\Omega$, inclusive). Parameters that can be modified to control the resistance of a fabric resistor can include, for example, width, length, density of cross-stitch, thickness, and/or inherent conductivity of the material.

In some embodiments, a system comprising a plurality of sensors is provided; some or all of the plurality of sensors can be connected to a common, or shared, conductive input, or electrode. In some embodiments, the common electrode is connected to a power source, which is shared between some or all of the plurality of devices. Layering, sewing, or weaving multiple input sources can be tedious, time inefficient, or mechanically challenging (e.g., difficult to impossible). To minimize the quantity of branches of conductive routes to multiple electrodes, a single thread, stitch, hem, or sheet of conductive fabric can be provided, in some embodiments, to act as a bus for consolidating the signal before branching towards the desired/specified electrodes of the plurality of devices. In conventional PCB design, "bussing" can be achieved by creating a thicker conductive trace that passes between each device before branching shorter traces towards the respective electrodes of the devices. Another way that "bussing" can be achieved in conventional PCB design is via use of an entire layer, called a pour or a plane, which acts as an isotropic sheet of the same signal and is placed below or above the layer of the PCB in/on which the devices are provided; such devices can connect to the signal layer by forming vias into the layer.

According to the subject matter disclosed herein, a fabric-based bus can be achieved, for example, by sewing discrete lines, embroidered regions, or entire surfaces of electrically conductive material (e.g., thread). These regions of conductive material can then, following a depth-first search, be designed to branch and connect to multiple devices. Example embodiments of such fabric-based devices will now be described herein, using the concepts of conductive input and output electrodes, the states in which such electrodes can operate, and how to bus signals towards such devices. In particular, the input and output conductive threads, along with the sensitive region and semi-porous layer, can be considered according to several different examples of circuit architecture, which will be described hereinbelow.

In an example embodiment, a plurality of sensors are electrically connected via a discrete conductive input and output. In some such embodiments, the conductive input and output electrodes are provided on the same side/surface (e.g., in the same layer, both on the top surface or on the bottom surface) and the sensitive region is then layered on (e.g., over/under) this electrode layer; thus, each sensor comprises two (2) layers: an electrode layer (e.g., the layer in which the first and second electrodes are provided) and a layer in which the sensitive region is provided. In some other such embodiments, the conductive input and output electrodes are provided on opposite sides/surfaces (e.g., one on the top surface and the other on the bottom surface) and the sensitive region is disposed between the respective layer in which each electrode is provided; thus, each sensor comprises three (3) layers: a first electrode layer, a second electrode layer, and a layer in which the sensitive region is provided in contact (e.g., direct contact) with the first and second electrode layers.

In another example embodiment, a plurality of sensors are electrically connected via forming an electrical bus, or "bussing," that transmits an input or output signal to/from the sensors. In some such embodiments, the conductive input and output electrodes are provided on the same side/surface (e.g., in the same layer, both on the top surface or on the bottom surface); the input electrode is connected to a separate layer that has a signal bus, the output electrode layer is connected to another separate layer that has a signal bus, and the sensitive region is connected to (e.g., on the same side of) the input and output electrodes; thus, each sensor comprises four (4) layers: an electrode layer (e.g., the layer in which the first and second electrodes are provided), a bus layer connected to the first electrode, a bus layer connected to the second electrode, and a layer in which the sensitive region is provided. In some other such embodiments, the conductive input and output electrodes are provided on separate, or discrete, layers (e.g., one on the top surface and the other on the bottom surface) from each other; the input electrode is connected to a separate layer that has a signal bus, the output electrode layer is connected to another separate layer that has a signal bus, and the sensitive region is connected to (e.g., between, as an intermediate layer) the input and output electrodes; thus, each sensor comprises five (5) layers: a first electrode layer, a bus layer connected to the first electrode, a second electrode layer, a bus layer connected to the second electrode, and a layer in which the sensitive region is provided in contact (e.g., direct contact) with the first and second electrode layers.

In another example embodiment, a plurality of sensors that are electrically connected by electrode(s) with a high-Z state and via forming an electrical bus, or "bussing," that transmits an input or output signal to/from the sensors. In some such embodiments, the conductive input and output electrodes are provided on the same side/surface (e.g., in the same layer, both on the top surface or on the bottom surface); the input electrode is connected to a separate layer that has a signal bus, the output electrode layer is connected to another separate layer that has a signal bus, the layer in which the first and second electrodes are provided is layered on a semi-porous material acting as a high-Z material, and the sensitive region is connected to (e.g., on the same side of) the input and output electrodes; thus, each sensor comprises five (5) layers: an electrode layer (e.g., the layer in which the first and second electrodes are provided), a bus layer connected to the first electrode, a bus layer connected to the second electrode, a layer comprising the semi-porous material, and a layer in which the sensitive region is provided. In some other such embodiments, the conductive input and output electrodes are provided on separate, or discrete, layers (e.g., one on the top surface and the other on the bottom surface) from each other; the input electrode is connected to a separate layer that has a signal bus, the layer in which the first electrode is provided is layered on a semi-porous material acting as a high-Z material, the output electrode layer is connected to another separate layer that has a signal bus, the layer in which the first electrode is provided is optionally (while only one layer of high-Z material is needed to enable the device to enter a high-Z state, more than one layer of high-Z material can be used, as desired) layered on a semi-porous material acting as a high-Z material, and the sensitive region is connected to (e.g., between, as an intermediate layer) the input and output electrodes; thus, each sensor comprises six (6) or, optionally, seven (7) layers: a first electrode layer, a bus layer connected to the first electrode, a first high-Z layer on the first electrode layer, a second electrode layer, a bus layer connected to the second electrode, an optional second high-Z layer on the second electrode layer, and a layer in which the sensitive region is provided in contact (e.g., direct contact) with the first and second electrode layers.

A device can be fabricated using any of the example architectures described herein, but is not limited thereto and persons having ordinary skill in the art will understand that other unenumerated circuit architectures may be used without deviating from the scope of the presently disclosed subject matter. Additional layers can be added to the exterior of the device (e.g., for providing additional aesthetic and/or functional properties). Examples of such additional layers include, for example, layers that are formed from materials (e.g., textiles, fabrics, and the like) that are differently colored and/or textured from the device, as well as layers that are more flame-resistant, heat-resistant, and/or water-resistant than the layers (e.g., the outermost layers) of the device for providing additional environmental protection the device. Thus, the number of layers used in a device can be greater than those expressly disclosed herein, based on the anticipated use of the device, as well as for reasons of preference of the designer of the device.

In some embodiments, a fabric device or system comprises one or more (e.g., a plurality of) sensors that are responsive to mechanical changes. Such mechanical changes can be, for example, in the x (stretch), y (compression), and z (pressure) directions, as well as bending and/or twisting about an axis in these directions. Therefore, the sensors are advantageously capable of bending, twisting, and/or warping in three dimensions. To further engineer a fabric device, which has sensors embedded therein and can be deformed in 3-dimensional space, it is advantageous in some embodiments for cuts and/or folds to be selectively made along, for example, crease, bend, and/or curve lines. Such cuts and/or folds can allow a sheet (e.g., a single-layered sheet) of material comprising a plurality of fabric-based sensors embedded and/or formed therein, or thereon, in a 2-dimensional plane (e.g., sensors arranged coplanar to each other when the sheet is in an unfolded/uncut state) to deform in 3-dimensional space. Particular cut and fold patterns can be selected from, for example, kirigami, origami, and curves and folds found in nature, such as bonded atoms or cells organized in tissue.

As disclosed elsewhere herein, a fabric-based sensor comprises a conductive input electrode and a conductive output electrode that are each respectively interfaced with (e.g., electrically connected to) a sensitive region. The areas outside of the electrode area are non-sensitive, in comparison with the sensitive region. Areas that are sensitive and areas that are non-sensitive can be folded with valley folds, mountain folds, squash folds, inside reverse folds, outside reverse folds, petal folds, book folds, petal folds, sink folds, triangle folds and repeated to form pleats and crimps. Areas that are non-sensitive can, in some embodiments, be cut to allow the material to stretch or bend around the cut area. Additionally, in some embodiments, repeated cuts may be made in such non-sensitive regions to form kirigami patterns that systematically expand or contract in a particular direction {e.g., in the x-direction). In some embodiments, such cuts (e.g., in the non-sensitive areas) can be through the entire fabric (e.g., through all layers of the fabric), or only in/on specific layers of the fabric. In some embodiments, such cuts can be made in a shallow manner, such that only some of the layers (e.g., only the first few layers) are cut all of the layers of the fabric are not cut, pierced, etc. In some embodiments, the sheet can be cut into individual layers that are then layered on top of each other in a prescribed order to form a multi-layer material with a plurality of sensors embedded therein; cutting and stacking a sheet of fabric that already has sensor(s) formed therein before such cutting and stacking occurs produces a multi-layer material (e.g., fabric) device that comprises intermediate (e.g., internal) layers that can have cuts formed therein and exterior layers that are, for example, devoid of such cuts.

In some embodiments, some of the sensors disclosed herein can be configured as touch sensors. Thus, in some embodiments, a fabric-based touch sensor according to the presently disclosed subject matter can comprise, for example, a conductive input electrode, a conductive output electrode, and a sensitive region that is electromechanically sensitive to mechanical deformation. Examples of materials that exhibit this property are piezoelectric and/or piezoresistive materials. Further examples of such materials include capacitive and/or inductive materials. Further examples of such materials include electromechanical and/or magnetically sensitive materials, in which a mechanical change (e.g., deformation) induces a change in the magnetic field produced by such layer(s). Further examples of such materials include electromechanical and chemically sensitive materials, in which a mechanical change (e.g., deformation) induces a physical or chemical reaction.

In some embodiments, one or more of the electrodes of such touch sensors comprise a semi-porous material layered (e.g., provided in a layered form) between the respective electrode(s) and the sensitive region. Such a semi-porous layer is configured to act as a high-Z state material. Due to the high-Z state of the semi-porous layer, when no input force is applied (e.g., when not contacted with even minimal force) to the touch sensor, the input electrode, the output electrode, or both the input and output electrodes do not contact (e.g., are electrically disconnected from) the sensitive region. When a force is applied (e.g., when contacted directly) to the touch sensor, the input electrode, the output electrode, or both the input and output electrodes make electrical or mechanical contact with the sensitive region. For example, when the input electrode is in contact with the sensitive layer due to application of a force (e.g., by touching) to the touch sensor, the input electrode is configured to transmit a power source (e.g., VCC) or other electrical signal that is configured, when received at the sensitive region, to activate (e.g., turn on) the touch sensor.

In some embodiments, such touch sensors comprise one or more (e.g., a plurality of) layers in contact (e.g., direct contact) with the sensitive layer, such one or more layers being or comprising a resistive material. The resistive material has, for example, two resistors on opposite ends (e.g., edges) thereof. The two resistors are configured and electrically connected to act as either pull-up or pull-down resistors, depending on the particular application. The combination of the resistive material and the pull-up or pull-down resistors form two voltage dividers on the opposite ends of the resistive material. In some such embodiments, the point of contact between the resistive material and one or more (e.g., all) of the pull-up or pull-down resistor(s) has an embedded or sewn conductive material, which is configured to act as separate (e.g., third and/or fourth) electrodes. The third electrode interfaces with the resistive layer and the pull-up or pull-down resistor associated with the third electrode and/or the fourth electrode interfaces with the resistive layer and the pull-up or pull-down resistor associated with the fourth electrode. Such embodiments of the touch sensor are configured to determine a signal from the third and/or fourth electrodes to measure the amount (e.g., magnitude) of current transferred between the left and right voltage dividers.

In such examples of touch sensors comprising first, second, third, and fourth electrodes, the first electrode electrically and/or mechanically contacts (e.g., directly contacts) the sensitive layer when a force is applied to the touch sensor (e.g., at a surface thereof). The sensitive layer is electrically connected to the first electrode and is configured to receive a signal from the first electrode, which splits between the third and fourth electrodes. The third and fourth electrodes are then measured to detect the magnitude of the split of voltage and current between the pull-up or pull-down resistors associated therewith, respectively. The ratio of signal split between the third and fourth electrode is used to determine the relative location, or position, of the touch on the touch sensor in the direction of physical separation (e.g., left-right) between the third and fourth electrodes. For example, when the pull-up or pull-down resistors associated respectively with the third and fourth electrodes are in the pull-down state, then a touch on the side (e.g., left side) of the touch sensor on which the third electrode is arranged registers a lower signal on the third electrode than is registered on the side (e.g., right side) of the touch sensor on which the fourth electrode is arranged. When the pull-up or pull-down resistors associated respectively with the third and fourth electrodes are in the pull-up state, then a touch on the side (e.g., left side) of the touch sensor on which the third electrode is arranged registers a higher signal on the third electrode than is registered on the side (e.g., right side) of the touch sensor on which the fourth electrode is arranged. The signal ratio, or split, between the third and fourth electrodes can be used to determine the distance ratio (e.g., the relative position) of the touch between the opposing sides of the touch sensor. For example, a 40%/60% split between the third/fourth electrodes may indicate that the touch occurred at a distance 40% between the third and fourth electrodes, whereas a 20%/80% split may indicate that the touch occurred at a distance closer to the third electrode than in the 40%/60% split instance.

Figure 13A:
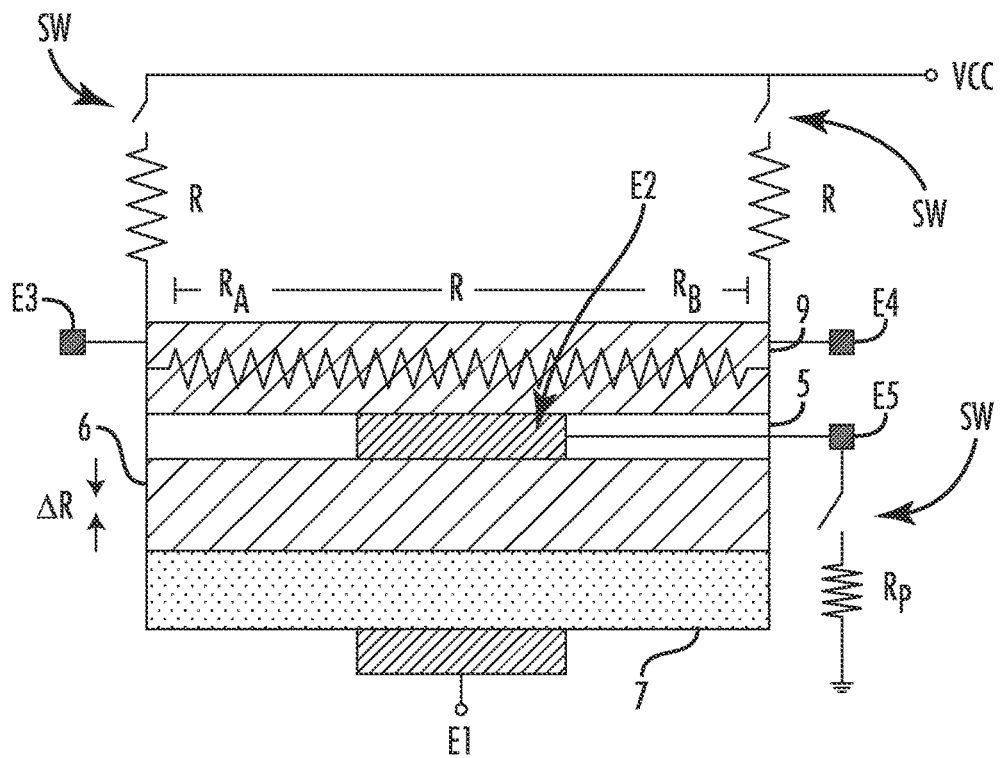
FIG. 13A is a schematic illustration of an example embodiment for a touch-sensitive device, incorporating a pressure-sensitive material to detect both touch and the amount of force applied due to the touch made from fabric.

In some embodiments, the touch sensor is configured to detect touch location (e.g., measured in the x- and y-directions) as well as touch pressure, or force magnitude (e.g., measured in the z-direction). In such an example embodiment, the second electrode is positioned between the layer in which the sensitive region is disposed and the layer in which the resistive material is disposed; the layer in which the resistive material is disposed has the third and fourth electrodes connected on opposite sides thereof. The second electrode is connected to a pull-up or pull-down resistive material that forms another voltage divider with the sensitive region. This voltage divider measures the resistive, capacitive, inductive, or voltage change of the sensitive layer when a force is applied to the touch sensor. In some embodiments, as shown in FIG. 13A, the intersection of the second electrode with the pull-up or pull-down resistor associated therewith is comprises an embedded or sewn conductive material, which acts as a fifth electrode. The signal from the fifth electrode is used to determine the relative amount of distortion (e.g., deformation) of the sensitive region.

In some embodiments, a system or device can comprise a plurality of sensors (e.g., touch sensors). According to such embodiments, each of the sensors has dedicated (e.g., separate, independent) conductive input and output electrodes. However, as the quantity of sensors increases, the quantity of electrical connections required increases commensurately, which leads to complex electrical circuit designs that require overlapping threads and/or wires and are logistically and/or mechanically cumbersome to manufacture. To reduce the quantity of required electrical connections, sensors may share (e.g., in parallel or series) the same input and/or output electrodes. Considerations for shared electrical connections include, for example, impedance matching, frequency matching, voltage and power matching, and/or mechanical and material matching at the connection interface.

Depending on the types and positions of sensors used in such devices and/or systems, electrical connections can be reduced according to any of a plurality of different methodologies. Examples of such methodologies are disclosed herein, but the presently disclosed subject matter is not limited only to the example methodologies expressly described herein and include others that would be understood by persons having ordinary skill in the art.

According to an example methodology, signals can be frequency modulated such that all connections are shared between devices. The frequency at which a signal is transferred determines which device and/or sensor can be communicated with. Frequency modulated and bit-controlled communication (e.g., I2C, SPI, and SWI) require a quantity of from 1-4 wires, inclusive. The wire(s) can be bussed to every sensor. Another example includes using a technique called daisy-chaining (e.g., a type of series electrical connection), in which the output electrode of one sensor is connected to the input electrode of an adjacent, or next, sensor. Thus, sensors can be organized into a row, with a conductive thread or wire intersecting the input and output electrodes of all of the sensors. In this first methodology, the quantity of conductive threads or wires required for connecting n sensors can range from between 1-4, inclusive.

According to another example methodology, the input and output electrodes of each sensor are each electrically connected independent of the input and output electrodes of all of the other sensors. Thus, each sensor is electrically connected to a dedicated (e.g., separate, independent, discrete) pair of conductive threads or wires. The use of this methodology can be advantageous when designing prototype devices or systems, or when the quantity of sensors is limited. However, the number of threads or wires required according to this methodology increases commensurately as the quantity of sensors in a system or device increases. Thus, the quantity of conductive threads or wires required for connecting n sensors is double (e.g., 2*n) the quantity of sensors According to another example methodology, all of the sensors of a device or system are electrically connected (e.g., for power and/or communication) to the same input, such that all of the input electrodes of the sensors can be electrically connected together (e.g., bussed by a single conductive thread or wire). According to this example methodology, the output electrode of each of the sensors is electrically connected independent of each other. Thus, each sensor comprises its own output electrode and the quantity of conductive threads or wires required for connecting n sensors is defined as n+1.

According to another example methodology, the sensors of a device or system are arranged in a row and column grid-like matrix, or array. According to this methodology, the quantity of sensors in each row is defined as n and the quantity of sensors in each column is defined as m; thus, the minimum quantity of conductive threads or wires required for connecting nm sensors is defined as n+m. In embodiments of systems or devices using this example methodology, firmware control is necessary to systematically activate (e.g., turn on) or deactivate (e.g., turn off) one or more sensors in the array of n+m sensors. In one example embodiment, the rows of the array are the input connections, which determine if a sensor is active/idle by transmitting a zero (0) or high signal, and the columns of the array are the output connections, which are connected to a measurement system that determines the value of the sensor in the grid. In firmware, the rows are connected to a bi-state logic that can be assigned to transmit a low or high value; these are typically called digital pins. The columns are connected to analog-to-digital (ADC) converters, which measure the signal output; an output from each ADC can be selectively read. Measure the sensor output of a particular sensor within the array, all inputs are set to a low state (e.g., receiving a 0 signal), other than the row in which the particular sensor is located, which is set to a high state (e.g., receiving a high signal). In other words, all inputs are turned off except for the one in which the particular sensor is located. After the row for the particular sensor is selected and the respective low/high signals are transmitted to the inputs, a specific column of the array in which the particular sensor is located can be read using the ADC connected to the column of the array in which the particular sensor is located. This coordination of turning on or off the rows and reading the output from an ADC connected to the column in which the particular sensor picks the particular device at a specified row and column (e.g., coordinate) within the array of sensors. For example, in an example embodiment of a system or device comprising 2 rows and 2 columns (e.g., n=2 and m=2) of sensors (e.g., for a total of four sensors), measuring the sensor at coordinate {1, 1} requires turning on row 1, turning off row 2, and measuring the output from the ADC connected to column 1. Measuring the output from the ADC connected to column 2 would result in measuring the sensor at the coordinate {1, 2}, since the sensor in row 1, column two is also on. Depending on the design and level of sensor cross-talk, both {1, 1} and {1, 2} can be measured simultaneously in some embodiments. However, if there is cross-talk or signal distortion between adjacent sensors in a same row, it is advantageous to fully convert the ADC value at {1, 1} before measuring the output from the ADC connected to column 2 to read the value at {1, 2}.

According to another example methodology, the sensors of a device or system are connected via Charlieplexing, in which a tri-state input and output logic is leveraged to turn on or off sensors in a matrix. Tri-state logic is the capability to change a signal between an "on" state, an "off" state, or a "high-Z" state. According to such an embodiment, the sensors must have signal polarity, in which a signal can only flow in one direction and not in the other direction. In other words, the signal travels can only travel through the sensor(s) from the input electrode to the output electrode, and not from the output electrode to the input electrode. Upon transmission of a signal to the output electrode, the sensor(s) enters a high-Z state. Thus, the quantity of conductive threads or wires required for connecting n sensors is defined according to the equation $$\frac{1}{2}(1+\sqrt{1+4\cdot n}).$$

According to such an example embodiment, the input electrodes are provided with a signal that is toggled between a low signal, a high signal, or a high-Z signal and the output electrode of each of the sensors is received sequentially to measure the signal from a particular sensor in a matrix of n*m sensors. It is particularly important that each input electrode has an accompanying resistor to buffer any leakage current when the sensors are turned on or enter a high-Z state. The above equation can be inverted to determine the quantity of sensors that can be connected when starting with a known set, or quantity, of available electrical connectors, or terminals. If the number of connections is known in advance, having, for example N wires, then the quantity of sensors that can be connected according to this methodology is determined according to the equation.

For multiple sensors, driving a specific sequence of input and output states can be time consuming and power-intensive. Therefore, it is advantageous to optimize the set or sequence of inputs and outputs to toggle. In such embodiments, the "nearest neighbor" algorithm can be utilized to cluster groups of input and output channels, such that clusters of input and output channels are toggled collectively. Consolidating which inputs and outputs to toggle and at what interval can advantageously minimize firmware redundancy, time, and power consumption. If the matrix of resistor and sensor idea were to be extended infinitely in the x and y direction, then it must be determined how to deconvolve the signal from a particular coordinate {n, m}. For example, if each sensor was merely a wire, effectively meaning unit gain, and each sensor was connected in the x and y direction with a resistor R, then the equivalent resistance at each node, or coordinate, is determined as follows:

$$R_{n,m} = \frac{2}{\pi}\left(1+\frac{1}{3}+\frac{1}{5}+\frac{1}{2m-1}\right)$$

$$R_{n,m} = \frac{4}{\pi}-\frac{1}{2}$$

The resistance at each node is effectively the same.

In an embodiment in which each sensor was not a wire, but was instead one of the sensors disclosed herein, if the sensor has a non-negative impedance, or uses a pull-up or pull-down resistor ($R_{sense}$), then the overall impedance of the sensor can be estimated by first-order approximation as:

$$R_{total} = R_{n,m} + R_{sense}$$

$$R_{sense} = R_{total} - R_{n,m}$$

Using this relationship, it is possible to deconvolve a particular coordinate of the sensor signal by applying Kirchoff's and Ohm's laws. Furthermore, a basic voltage divider equation can help extract the specific voltage and current output of that sensor at that particular coordinate.

FIG. 1A shows a computer numerical controlled (CNC) multi-needle sewing machine 10, which comprises a plurality of sewing needles 20A-20D. Each of the sewing needles 20A-20D holds a different thread 2A-2D. The threads 2A-2D can have the same or different electrical conductivities, weights, densities, ply-counts, elasticities, and/or colors from each other. Each thread 2A-2D is sewn with a bobbin 30 of the sewing machine 10 to secure a stitch (e.g., one intersection, or interlocking engagement, between a thread 2A-2D from one of the sewing needles 20A-20D and a thread 1 provided by the bobbin 30. The sewing needles 20A-20D can contain either an electrically conductive thread or an electrically non-conductive thread. The bobbin 30 can contain an electrically conductive thread or an electrically non-conductive thread. In the example embodiment shown, the thread 1 of the bobbin 30 is an electrically conductive thread and the threads 2A-2D of each of the sewing needles 20A-20D are electrically non-conductive (e.g., insulating) threads.

Figure 1B:
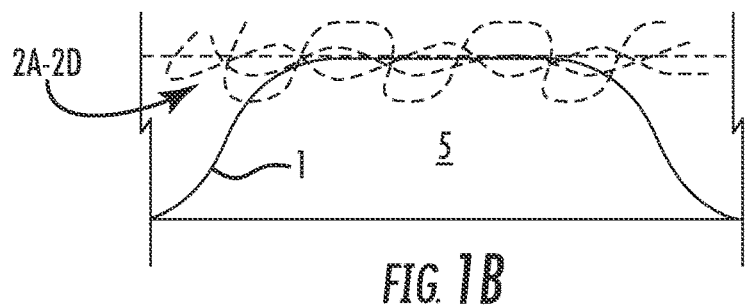
FIG. 1B is a cross-sectional view of an example embodiment of a stitching pattern in which threads are sewn into a flexible material.

FIG. 1B shows a cross-sectional view of a stitch formed in a flexible material 5 (e.g., a fabric), in which the top threads 2A-2D and the bobbin thread 1 are sewn into the flexible material 5. In this example, the thread 1 of the bobbin 30 is an electrically conductive thread. The bobbin thread 1 is exposed on the bottom side of the flexible material 5 as determined by the tension and stitch length, which are controlled by the sewing machine 10 and set by an operator or controller. The top threads 2A-2D are used to insulate the bobbin thread 1 when the bobbin thread 1 is exposed on the top surface of the flexible material 5. The top threads 2A-2D are also advantageously used to pattern specific sequences of threads 2A-2D to add a mechanical feature to the flexible material 5. Examples of such stitches can include stitching zig-zag patterns to allow for extra stretching of the flexible material 5 in the sewn direction, stitching a biased stitch in which the stretch is controlled in a specific x, y direction or angle. In some embodiments some or all of the top threads 2A-2D can contain electrically conductive threads to expose more conductive material. Examples are to mechanically reinforce the conductive area, expose enough area so that another stitch or electromechanical device can contact that area, and/or create a specific pattern that changes the resistivity, capacitance, and/or inductance of that area.

Figure 1C:
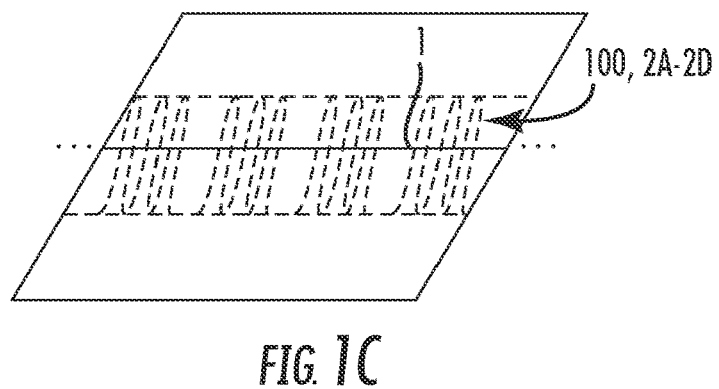
FIG. 1C is an isometric view of the stitching pattern shown in FIG. 1B.

FIG. 1C is an isometric view of the stitching pattern shown in FIG. 1B. The bobbin thread 1 is shown intermittently being exposed on the top side, or the bottom side, of the flexible material 5, as controlled by the tension and stitch length, also known as pitch, of the machine. The top threads 2A-2D are sewn into a stitched pattern 100 in the form of a zig-zag pattern, with two straight stitches at the furthest edge of each zig-zag to visually show the area covered as well as mechanically reinforce the edges of the stitch 100. Some or all of the top threads 2A-2D can also be composed of conductive threads in order to electromechanically reinforce the conductivity contributed by the bobbin thread 1, for example, to increase the surface area of the conductive material for connection purposes and/or the control the resistivity, capacitance, and/or inductance of the sewn area.

Figure 2A:
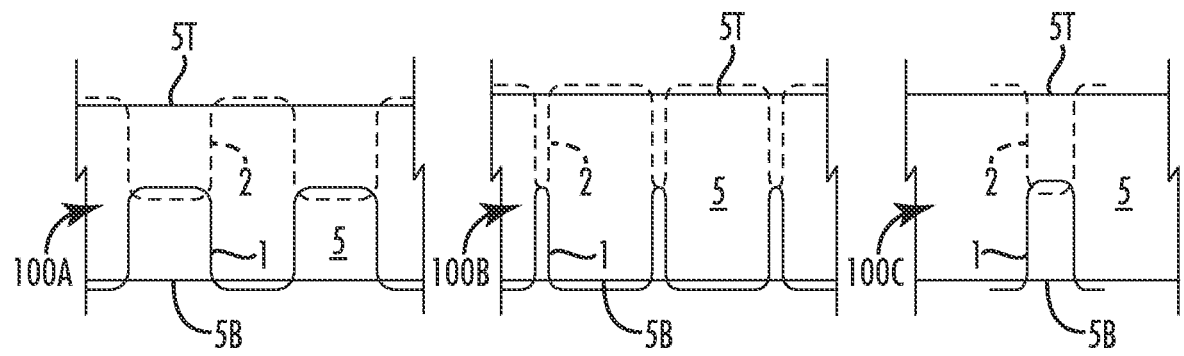
FIGS. 2A-2C are respective sectional illustrations showing how different stitch lengths affect the amount of exposed threads on the surface of the flexible material between stitches, respectively, when the top thread and the bottom thread have equal tension, when the top thread has higher tension than the bottom thread, and when the top thread has lower tension than the bottom thread.
Figure 2B:
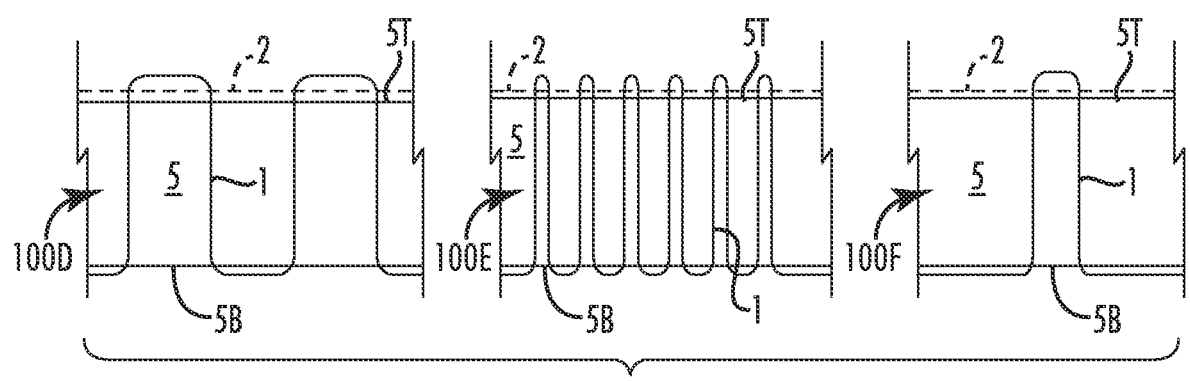
Figure 2C:
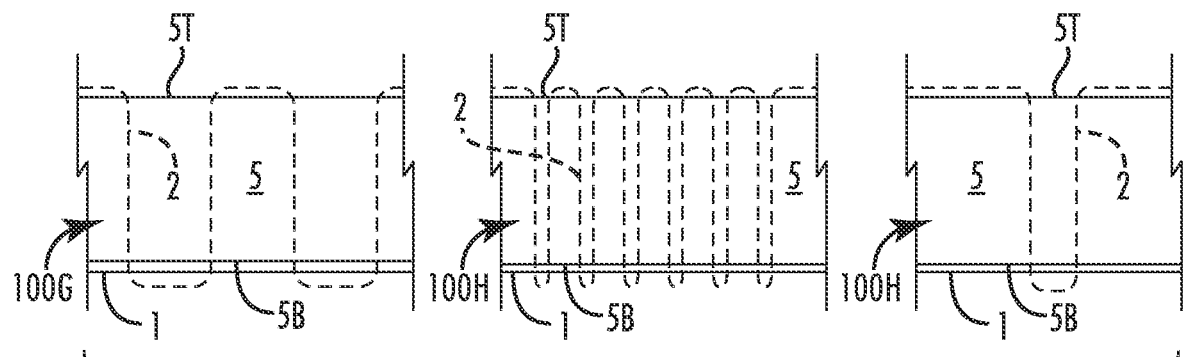

FIGS. 2A-C shows how the tension between the top thread 2 and the bottom thread 1 determines in which layer, side, or surface a thread 1, 2 is positioned within a stitched pattern 100. The sewing machine 10 can be, for example, an embroidery machine, a straight stitch machine, an overlock machine, or any other suitable machine type that has a sewing mechanism.

FIG. 2A shows stitched patterns 100A-100C, which are produced when the tension is substantially equal between the top thread 2 and the bottom thread 1. The top and bottom threads 1, 2 intersect (e.g., form an interlocked connection) with each other within the flexible material 5 (e.g., the sewn material). Each of the stitched patterns 100A-100C in FIG. 2A show how different stitch lengths alter the amount of the top thread exposed on the top surface 5T of the flexible material 5 and the amount of the bobbin thread 1 exposed on the bottom surface 5B of the flexible material 5 between individual stitches. The ratio of the exposed top and bottom threads 1, 2 on the respective top or bottom surfaces 5T, 5B compared to the overall stitch length is referred to herein as the duty cycle of such top or bottom thread 1, 2, as the case may be. The stitched pattern 100B has a high duty cycle. The stitched pattern 100C has a low duty cycle. The stitched pattern 100A has a medium, or intermediate, duty cycle.

FIG. 2B shows stitched patterns 100D-100F, which are produced when the top thread 2 has a higher tension than the bottom thread 1. The top and bottom threads 1, 2 intersect (e.g., form an interlocked connection) with each other at the top surface 5T of the flexible material 5 (e.g., the sewn material). In this case, the top thread 2 and the sewing needle associated therewith have more mechanical force applied thereto than does the bobbin thread 1, which pulls both the top and bottom threads 1, 2 up to the top surface 5T. Such high tension applied to the top thread 2 causes both the top and bobbin threads 1, 2 to be exposed (e.g., at least partially external to) on the top surface 5T. The exposure of the bobbin thread 1 on the top surface 5T is minimal, only occurring when the sewing needle 20 makes a puncture through the flexible material 5.

FIG. 2C shows stitched patterns 100G-100I, which are produced when the bobbin thread 1 has a higher tension than the top thread 2. The top and bobbin threads 1, 2 intersect (e.g., form an interlocked connection) with each other at the bottom surface 5B of the flexible material 5 (e.g., the sewn material). In this case, the bobbin thread 1 has more mechanical force applied thereto than does the top thread 2, which pulls down both the top and bobbin threads 1, 2 to the bottom surface 5B. Such low tension applied to the top thread 2 causes the top and bobbin threads 1, 2 to be exposed (e.g., at least partially external to) on the bottom surface 5B. The exposure of the top thread 2 on the bottom surface 5B is minimal, only occurring when the sewing needle 20 makes a puncture through the flexible material 5.

Figure 3:
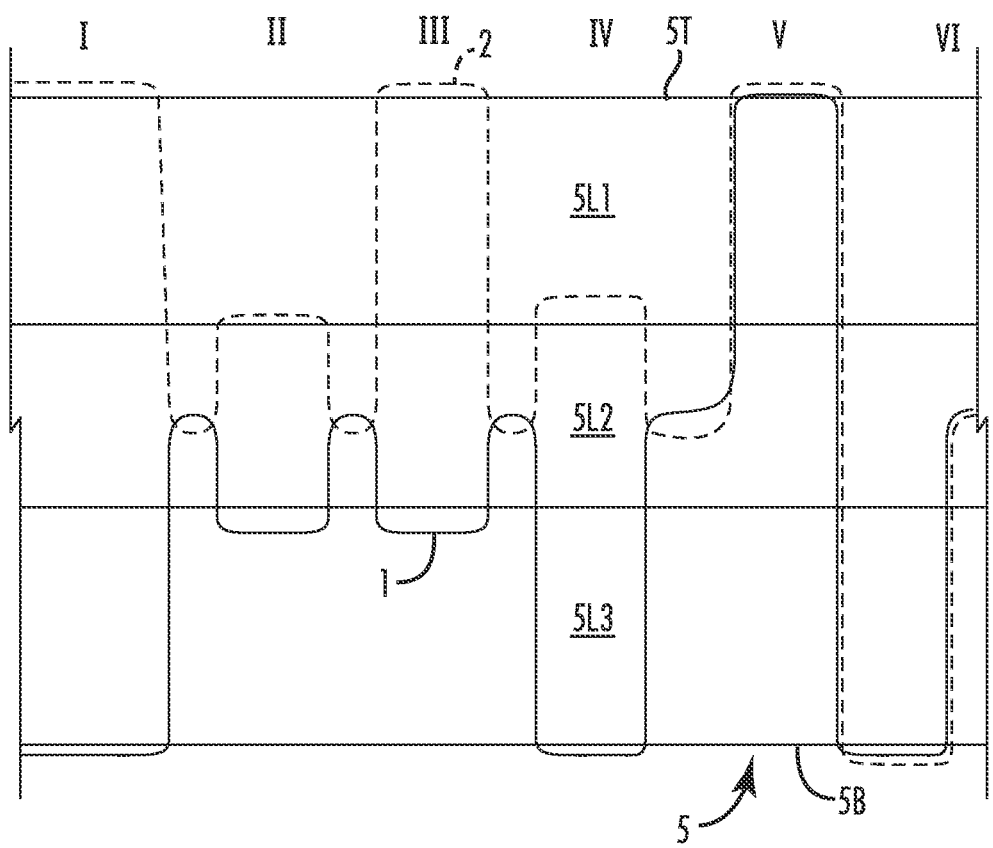
FIG. 3 is a sectional view of an example embodiment of a stitching pattern, in which top and bottom threads are sewn onto the top or bottom surface of layer(s) of a multi-layer fabric by controlling the tension of the top and bottom threads.

FIG. 3 is a sectional view of an example embodiment of a stitched pattern, in which multiple layers of a flexible material 5 (e.g., fabric) are shown. The flexible material 5 comprises a first layer 5L1, a second layer 5L2, and a third layer 5L3. The top surface 5T of the flexible material 5 is the exposed, or outermost, surface of the first layer 5L1. The bottom surface 5B of the flexible material 5 is the exposed, or outermost, surface of the third layer 5L3. In FIG. 3, a top thread 2 and a bobbin thread 1 are respectively sewn or stitched into, onto, and/or through the first, second, and/or third layers 5L1-5L3 by controlling the relative tension applied to the top and bobbin threads 1, 2. For purposes of illustration and discussion, the flexible material 5 is divided laterally into six (6) different regions, or sections, which are labeled using Roman numerals I-VI at the top of FIG. 3. In section I, a substantially equal tension is applied to the top and bobbin threads 1, 2, such that the top and bobbin threads 1, 2 are at/on the top and bottom surfaces 5T, 5B of the flexible material 5, respectively. In section II, the top and bobbin threads 1, 2 are at, in, and/or on the top and bottom surfaces of (e.g., on opposing surfaces of) the second layer 5L2, respectively. In section III, the top thread 2 is at, in, and/or on the top surface of the first layer 5L1 (e.g., on the top surface 5T), and the bobbin thread 1 is at, in, and/or on the bottom surface of the second layer 5L2. In section IV, the top thread 2 has pulled inwards from the top surface 5T, such that the top thread 2 is at, in, and/or on the top surface of the second layer 5L2, and the bobbin thread 1 is pulled outwards from the position shown in section III, such that the bobbin thread 1 is at, in, and/or on the bottom surface 5B. In section V, a higher tension is applied to the top thread 2 than to the bobbin thread 1, such that the bobbin thread 1 follows the top thread 2 to the top surface 5T, such that both the top and bobbin threads 1, 2 are at, in, and/or on top surface 5T. In section VI, a lower tension is applied to the top thread 2 than to the bobbin thread 1, such that the top thread 2 follows the bobbin thread 1 to the bottom surface 5B, such that both the top and bobbin threads 1, 2 are at, in, and/or on bottom surface 5B.

Figure 4:
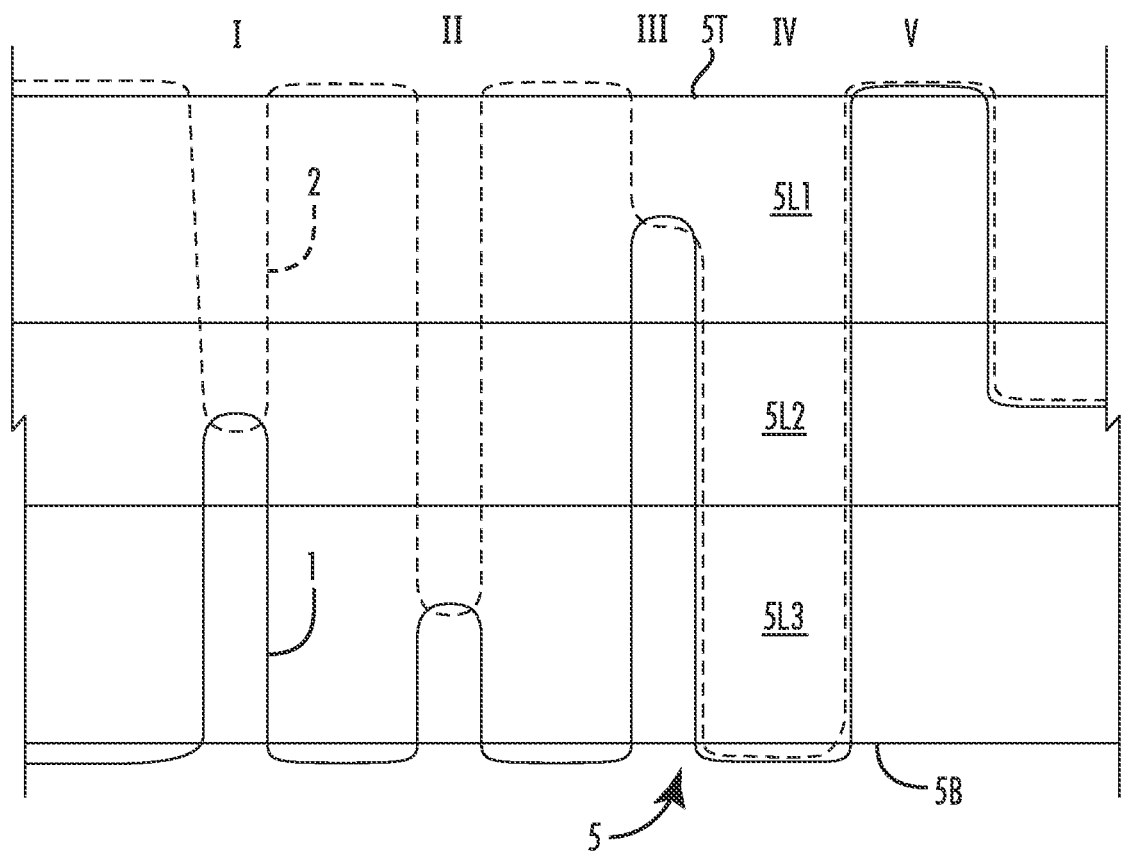
FIG. 4 is a sectional view of another example embodiment of a stitching pattern, in which top and bottom threads are sewn to have intersection points that are embedded within a specified layer of a multi-layer fabric.

FIG. 4 is a sectional view of an example embodiment of a stitched pattern, in which multiple layers of a flexible material 5 (e.g., fabric) are shown. The flexible material 5 comprises a first layer 5L1, a second layer 5L2, and a third layer 5L3. The top surface 5T of the flexible material 5 is the exposed, or outermost, surface of the first layer 5L1. The bottom surface 5B of the flexible material 5 is the exposed, or outermost, surface of the third layer 5L3. In FIG. 3, a top thread 2 and a bobbin thread 1 are respectively sewn or stitched into, onto, and/or through the first, second, and/or third layers 5L1-5L3 by controlling the relative tension applied to the top and bobbin threads 1, 2. For purposes of illustration and discussion, the flexible material 5 is divided laterally into six (6) different regions, or sections, which are labeled using Roman numerals I-V at the top of FIG. 3. In section I, a substantially equal tension is applied to the top and bobbin threads 1, 2, such that the intersection point between the top and bobbin threads 1, 2 is internal to the flexible material 5, within the second layer 5L2. In section II, a lower tension is applied to the top thread 2 than to the bobbin thread 1, such that the intersection point between the top and bobbin threads 1, 2 is internal to the flexible material 5, within the third layer 5L3. In section III, a higher tension is applied to the top thread 2 than to the bobbin thread 1, such that the intersection point between the top and bobbin threads 1, 2 is internal to the flexible material 5, within the first layer 5L1. In section IV, a lower tension is applied to the top thread 2 than to the bobbin thread 1 than in section II, which causes the top thread 2 to follow the bottom thread 1 to the bottom surface 5B, such that the intersection point between the top and bobbin threads 1, 2 is at the bottom surface 5B of the flexible material 5. In section V, a higher tension is applied to the top thread 2 than to the bobbin thread 1 than in section III, which causes the bobbin thread 1 to follow the top thread 2 to the top surface 5T, such that the intersection point between the top and bobbin threads 1, 2 is at the top surface 5T of the flexible material 5.

Figure 5A:
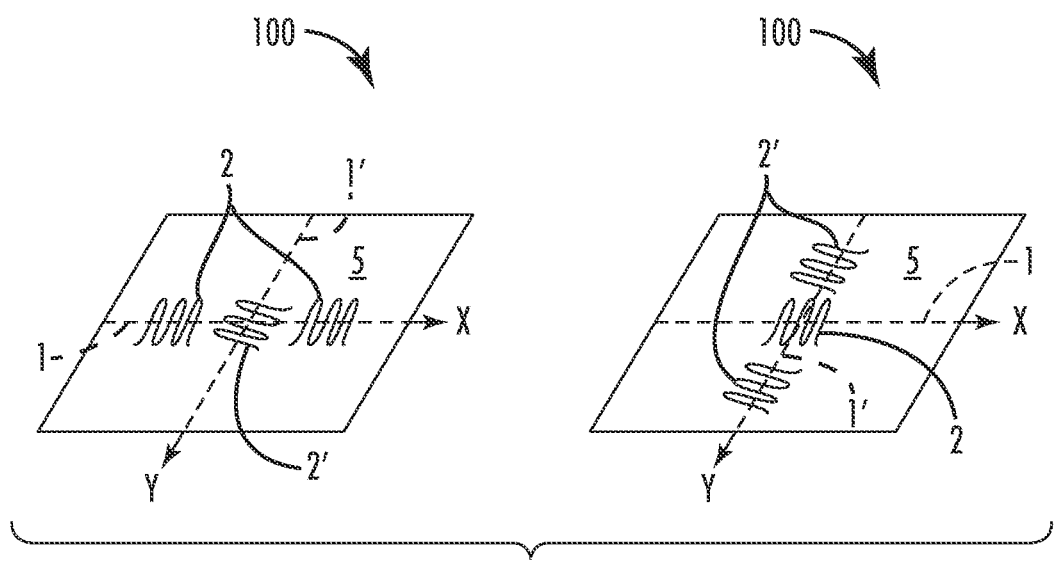
FIG. 5A is a schematic illustration showing how thread tension can be used to control the surface exposure of the top and bottom threads of a stitching pattern when two or more stitch lines intersect each other in a 2-dimensional plane.

FIG. 5A shows two examples embodiments in which tension engineering (e.g., selective controlling of tension between one or more top threads and one or more bottom threads) is used to control the amount of the top and bottom threads 1, 2 that is exposed on the top and/or bottom surfaces of the flexible material 5 when two or more stitch lines, or stitched patterns, intersect with each other in a 2 dimensional plane. In the example embodiments shown on FIG. 5A, there are two stitched patterns, one extending in the x-direction, and the other extending in the y-direction, which is perpendicular to the x-direction. In this example embodiment, the top thread 2 is an electrically conductive thread and is exposed on the top surface (e.g., the surface shown in FIG. 5A) of the flexible material 5 during a neutral tension stitch. When the stitched pattern extending in the x-direction intersects with the stitched pattern extending in the y-direction, one of the stitched patterns must alter the relative tension between the top and bottom threads 1, 2 that forms such stitched pattern, such that the electrically conductive thread (e.g., the top thread 2) of a first stitched pattern (e.g., the pattern extending in the x-direction) is pulled towards the bottom surface of the flexible material 5, which allows for the electrically conductive thread (e.g., the top thread 2) of a second stitched pattern (e.g., the pattern extending in the y-direction) to be exposed on the top surface of the flexible material 5 within the intersection region. In some embodiments, the relative tension between the top and bobbin threads 1, 2 that form the second stitched pattern line can be modified (e.g., increased, so that the tension applied to the top thread 2 is greater than the tension applied to the bobbin thread 1), so that both the top and bobbin threads 1, 2 of such second stitched pattern would be pulled to the top surface of the flexible material 5. When the relative tension between the top and bobbin threads 1, 2 that form the first stitched pattern is reduced in comparison to the relative tension between the top and bobbin threads 1, 2 that form the second stitched pattern line (e.g., when the relative tension in the first stitched pattern is less than the relative tension in the second stitched pattern), in the intersection region the electrically conductive threads of the respective first and second stitched patterns will be on opposite sides (e.g., at, in, or on the top and bottom surfaces, respectively) of the flexible material 5, thereby avoiding a collision and/or short-circuit between the electrically conductive threads of the first and second stitched patterns.

Figure 5B:
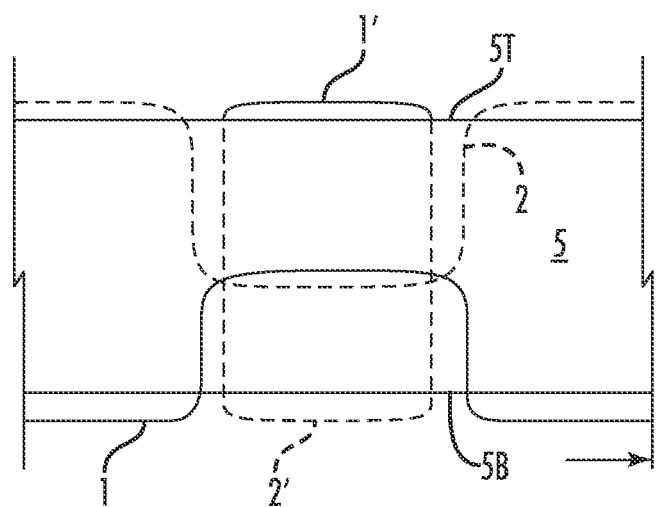
FIG. 5B is a sectional view of the illustration shown in FIG. 5A at the intersection point for the two stitch lines.

FIG. 5B is an example embodiment illustrating a cross-sectional view of one of the flexible materials 5 shown in FIG. 5A, at the intersection region between the first and second stitched patterns. The first stitched pattern comprises a top thread 2 and a bobbin thread 1; the bobbin thread 1 is an electrically conductive thread. The second stitched pattern comprises a top thread 2' and a bobbin thread 1'; the top thread 2' is an electrically conductive thread. The electrically conductive top thread 2' is pulled up to the top surface 5T in the intersection region, while the electrically conductive bobbin thread 1 of the first stitched pattern is spaced apart from (e.g., internal to the flexible material 5) the electrically conductive top thread 2' of the second stitched pattern in the intersection region. Additionally, the pitch of the first and second stitched patterns are alternating within the intersection region, such that when an electrically conductive thread is exposed on the top surface 5T, the electrically conductive thread of the other stitched pattern is either exposed on the opposite surface (e.g., on bottom surface 5B) or interlocked within the flexible material 5. Thus, at each intersection region where stitched patterns containing one or more electrically conductive patterns cross each other, each conductive thread of each of the intersecting stitched patterns is advantageously at, in, or on a different layer or surface of the flexible material 5, so as to avoid a collision and short-circuit between such electrically conductive threads of different stitched patterns.

Figure 6:
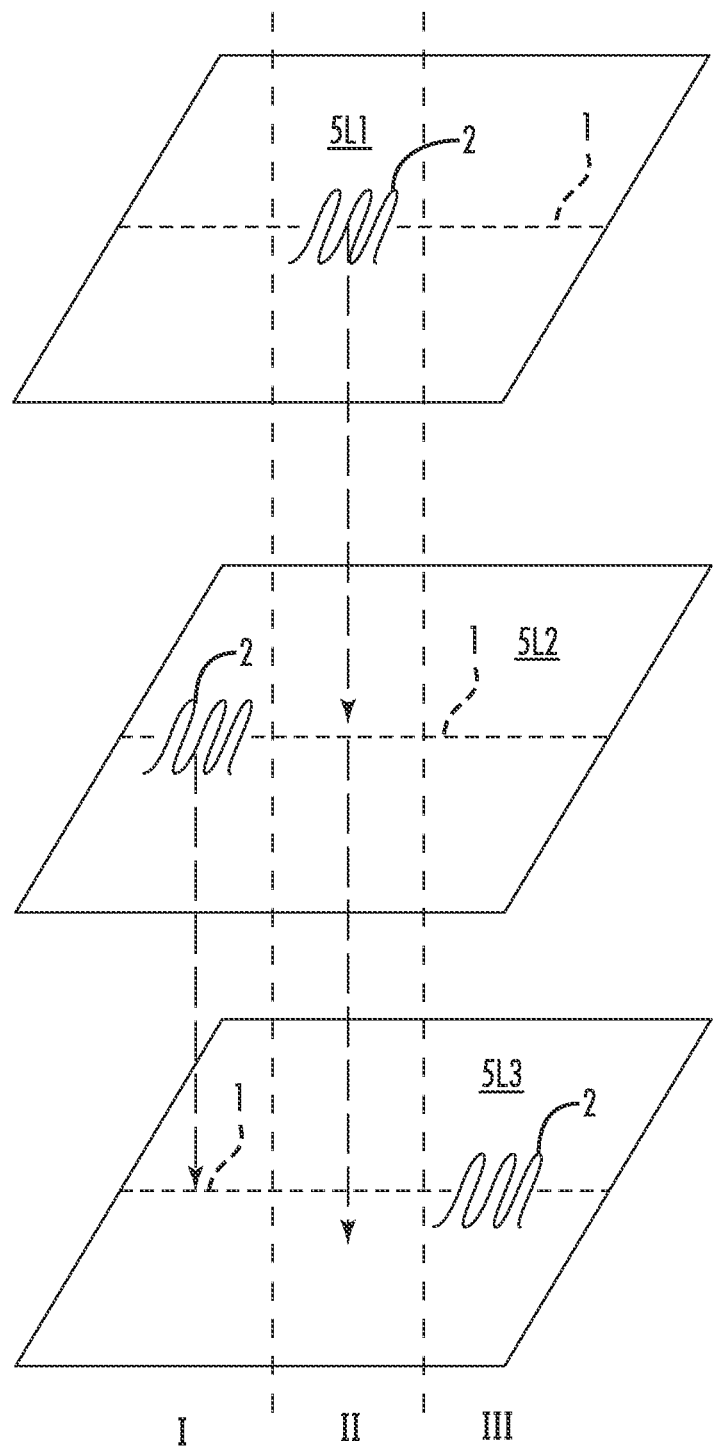
FIG. 6 is an exploded view of an example embodiment of a multi-layer fabric formed from layers with a stitch pattern of threads applied thereto.

FIG. 6 shows an exploded view of a multi-layer flexible fabric, in which each of the multiple layers is shown spaced apart from, but stacked vertically over each other. In the example embodiment shown in FIG. 6, the top thread 2 of each stitched pattern within a layer 5L1-5L3 comprises an electrically conductive thread, and the bobbin thread 1 of each stitched pattern within a layer 5L1-5L3 comprises a non-conductive, or insulating, thread. The top thread 2 is controlled to be exposed on the top surface of each of the layers 5L1-5L3. When the layers 5L1-5L3 are stacked on top of each other, the top threads 2 are lined up (e.g., in the lateral, or horizontal direction shown in FIG. 6) to form a continuous sewn line. In another example embodiment, the top thread 2 of each stitched pattern within a layer 5L1-5L3 can be sewn such that, when the layers 5L1-5L3 are stacked, the top threads 2 in each layer 5L1-5L3 form independent routes (e.g., electrically conductive paths) from each other and do not overlap with electrically conductive threads from any of the other layers 5L1-5L3. For example, once the first, second, and third layers 5L1-5L3 are stacked together, the electrically conductive top threads 2 in each of the regions I, II, and III may form a continuous electrically conductive stitched pattern (e.g., sewn line) or may form independent electrically conductive stitched pattern (e.g., sewn lines) that do not cross or contact (e.g., directly) each other. Using electrically conductive threads to provide electrically conductive paths between layers 5L1-5L3 of a multi-layer flexible material can be considered as conceptually analogous to creating vias and routes in conventional printed circuit boards.

The benefit of navigating conductive threads between layers is to reduce the quantity of intersection points on surfaces of the multi-layer flexible material that have high densities of electrically conductive material. Additionally, embedding electrically conductive threads within specific layers may advantageously be used for adding additional properties to such threads from the inherent characteristics of the material from which such layer is formed. For example, some layers of such a multi-layer flexible material may be selected to provide RF and/or EMF/EMI protection characteristics that allow higher current, voltage, and/or frequencies to pass therethrough. Materials that provide such RF and/or EMF/EMI protection characteristics may also be used to provide protection against external RF, EMF, and/or EMI noise injection into the signal being transmitted by such electrically conductive thread disposed therein and/or thereon. By way of further example, some layers of such a multi-layer flexible material may be selected to provide additional mechanical advantages such as stretchability, moisture wicking, tear-resistance, etc. Furthermore, some layers of such a multi-layer flexible material may be selected to provide additional chemical advantages, such as, for example, flame retardant, anti-soiling, and/or anti-microbial properties.

Figure 7A:
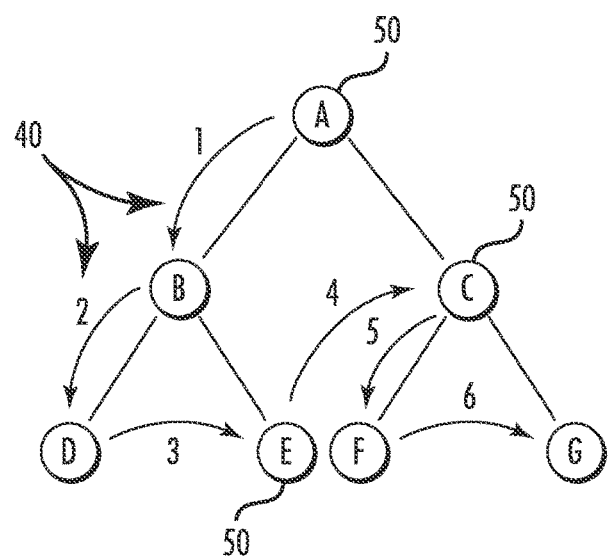
FIG. 7A is a schematic illustration showing how a complex stitch pattern can be algorithmically decomposed into individual sequences comprising smaller sewing lines.
Figure 7B:
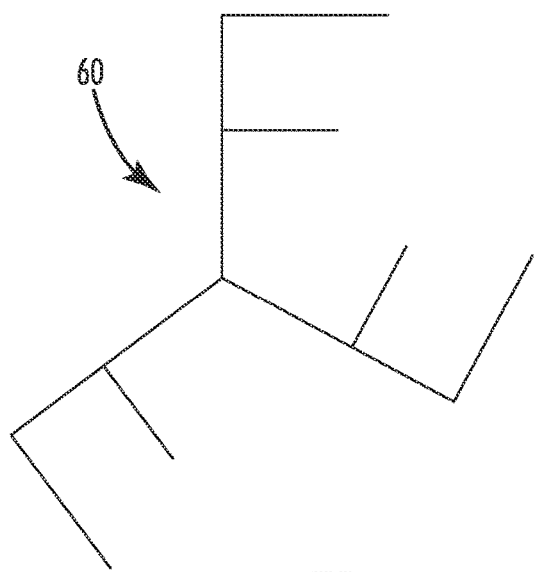
FIG. 7B is a schematic illustration of an example embodiment of a complex stitched pattern.
Figure 7C:
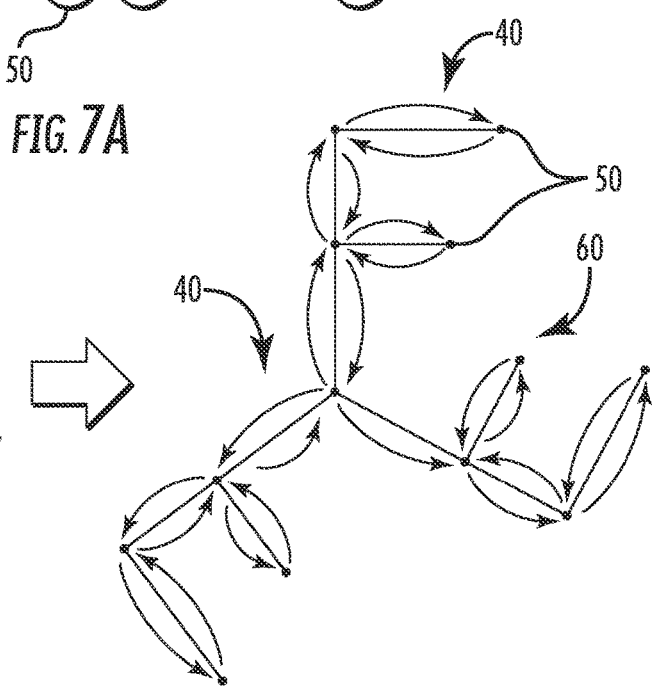
FIG. 7C shows an example embodiment, in which the order in which the nodes of the complex stitched pattern shown in FIG. 7B are connected together, such as using a sewing machine.

FIGS. 7A-7C illustrate how a complex stitched pattern can be algorithmically broken down into a sequence of smaller sewing lines, to reduce sewing speed, the quantity of lined that must be sewn to form the complex stitched pattern, and the quantity of jump stitches and/or thread intersections. In FIG. 7A, a schematic illustration of nodes 50 and sequentially performed stitching actions 40 are shown. FIG. 7B is an illustration of an example embodiment of a complex stitched pattern, generally designated 60, and FIG. 7C is an example embodiment illustrating the order in which the nodes 50 of the complex stitched pattern 60 are connected by a sewing machine (e.g., 10, FIG. 1A) performing the sequential stitching actions 40. Nearest-neighbor combined with depth-first search is an algorithmic technique that is suitable for use in deconstructing the complex stitched pattern 60 into a plurality of neighboring nodes 50. Each node 50 is searched through and ordered through a depth-first search algorithm. Nodes 50 that are furthest down a single branch (e.g., sewn path) of the complex stitched pattern 60 are sewn first; the neighboring nodes 50, which have lengths therebetween, are discovered recursively through a nearest neighbor algorithm, and are queued in a sewing order, which comprises the plurality of stitching actions 40. After the depth-first search algorithm is completed, the complex stitched pattern 60 is vectorized and converted to machine coordinates that are represented as vectors, gerbers and/or gcode. At each non-offspring (e.g., terminal) node 50, the intersection point between the top and bobbin threads is cut before making the neighboring stitch. If no cut is made between stitches, a jump stitch is created. A jump stitch occurs when a previous stitch is electrically connected to another node 50, where a non-connecting stitch is to be performed to form another portion of the complex stitched pattern. Upon a sewing machine being unable to cut the threads at a non-offspring node 50 before sewing a further portion of the complex stitched pattern 60 from another node 50, then the device in which the complex stitched pattern is formed must be post-processed (e.g., by a further machine, or manually by a human) by severing (e.g., cutting) such jump stitches.

FIGS. 8A-8F show example embodiments in which multiple conductive threads in multiple conductive layers are constructed to create devices 300A-300F, which comprise electrodes for signal transmission purposes, for example.

FIG. 8A shows a first example embodiment of a device, generally designated 300A, which comprises an input electrode E1 and an output electrode E2 that are sewn into and/or onto a same layer of flexible material 5. The electrodes E1, E2 are sewn in a manner such that the electrodes E1, E2 are exposed on a surface of the device 300A that is configured to interact with an adjacent surface that has electrical, mechanical, magnetic, and/or chemical sensing properties. In this example embodiment, the electrodes E1, E2 have a high density of conductive material sewn onto the bottom surface of the layer of the flexible material 5, which interacts with the sensitive layer 6 beneath the layer of flexible material 5. The layer of flexible material 5, in which the electrodes E1, E2 are provided, have conductive threads 1 sewn throughout the same layer of the flexible material 5 to other parts of the device 300A for electrical communication (e.g., to transmit a signal). According to the construction of the device 300A, the input electrode E1 acts is configured to provide an input signal into the sensitive layer 6, which then transforms the input signal into an output signal, and the output signal is then transmitted to the output electrode E2, which can then be transmitted, via the conductive thread 1 attached to the output electrode E2, to a receiving device. According to this example embodiment, the surface sensitivity of the sensitive layer 6 can be measured and/or determined.

FIG. 8B shows an example embodiment of a device, generally designated 300B, which comprises an input electrode E1 and an output electrode E2 that are sewn into and/or onto separate (e.g., different, discrete, independent) layers of a flexible material 5. In device 300B, the layer of flexible material 5 in which the input electrode E1 is disposed is on an opposite side of the sensing layer 6 from the layer of flexible material 5 in which the output electrode E2 is disposed. Thus, the layer of flexible material 5, in which the input electrode E1 is disposed, is at (e.g., directly against, in direct contact with) the top surface of the sensing layer 6 and the layer of flexible material 5, in which the output electrode E2 is disposed, is at (e.g., directly against, in direct contact with) the bottom surface of the sensing layer 6. In another example embodiment, the layer of flexible material 5, in which the input electrode E1 is disposed, can instead be at (e.g., directly against, in direct contact with) the bottom surface of the sensing layer 6 and the layer of flexible material 5, in which the output electrode E2 is disposed, can be at (e.g., directly against, in direct contact with) the top surface of the sensing layer 6. The electrodes E1, E2 are sewn in a manner such that the electrodes E1, E2 are exposed on a surface of the device 300B that is configured to interact with an adjacent surface that has electrical, mechanical, magnetic, and/or chemical sensing properties. In this example embodiment, the electrodes E1, E2 have a high density of conductive material sewn onto the surface of the layer of the flexible material 5 that is adjacent to (e.g., directly in contact with, nearest) the sensitive layer 6 to interact with the sensitive layer 6. The respective layer of flexible material 5, in which one of the electrodes E1, E2 is provided, has a conductive thread 1 sewn throughout the same layer of the flexible material 5 to other parts of the device 300A for electrical communication (e.g., to transmit a signal). Regardless of which side of the sensing layer 6 that the layers of flexible material 5 in which the input or output electrodes E1, E2 are disposed, the input signal is received at the input electrode E1, transmitted through the sensitive layer 6, in which the input signal is transformed into an output signal, and the output signal is transmitted from the sensing layer 6 to the output electrode E2, on the opposite side of the sensing layer 6 from the input electrode E1. According to this example embodiment, the internal sensitivity of the sensitive layer 6 can be measured and/or determined.

FIG. 8C shows an example embodiment of a device, generally designated 300C, which comprises an input electrode E1 and an output electrode E2 that are sewn into and/or onto the same layer of flexible material 5. The electrodes E1, E2 are sewn in a manner such that the electrodes E1, E2 are exposed on a surface of the device 300C that is configured to interact with an adjacent surface that has electrical, mechanical, magnetic, and/or chemical sensing properties. In this example embodiment, the electrodes E1, E2 have a high density of conductive material sewn onto the bottom surface of the layer of the flexible material 5, which interacts with the sensitive layer 6 beneath the layer of flexible material 5. The device 300C comprises electrically conductive threads 1 that are stitched, in the manner of signal transmission threads, into and/or onto separate (e.g., different, discrete, independent) layers of flexible material 5, which are layered on top of the layer of flexible material 5 in which the electrodes E1, E2 are disposed. The respective layers of flexible material 5, in which one of the conductive threads 1 are disposed (e.g., embedded and/or at, in, or on an external surface thereof), are provided on the same side of the sensitive layer 6 on which the layer of flexible material 5, in which the electrodes E1, E2 are provided, is positioned. According to the construction of the device 300C, the input electrode E1 acts is configured to provide an input signal into the sensitive layer 6, which then transforms the input signal into an output signal, and the output signal is then transmitted to the output electrode E2, which can then be transmitted, via the conductive thread 1 attached to the output electrode E2, to a receiving device. According to this example embodiment, the surface sensitivity of the sensitive layer 6 can be measured and/or determined. The conductive threads 1 from the electrodes E1, E2 are configured, in some embodiments, to provide electrical "busing" to transfer signal to other parts of the device 300C.

FIG. 8D shows an example embodiment of a device, generally designated 300D, which comprises an input electrode E1 and an output electrode E2 that are sewn into and/or onto separate (e.g., different, discrete, independent) layers of a flexible material 5. In device 300D, the layer of flexible material 5 in which the input electrode E1 is disposed is on an opposite side of the sensing layer 6 from the layer of flexible material 5 in which the output electrode E2 is disposed. Thus, the layer of flexible material 5, in which the input electrode E1 is disposed, is at (e.g., directly against, in direct contact with) the top surface of the sensing layer 6 and the layer of flexible material 5, in which the output electrode E2 is disposed, is at (e.g., directly against, in direct contact with) the bottom surface of the sensing layer 6. In another example embodiment, the layer of flexible material 5, in which the input electrode E1 is disposed, can instead be at (e.g., directly against, in direct contact with) the bottom surface of the sensing layer 6 and the layer of flexible material 5, in which the output electrode E2 is disposed, can be at (e.g., directly against, in direct contact with) the top surface of the sensing layer 6. The electrodes E1, E2 are sewn in a manner such that the electrodes E1, E2 are exposed on a surface of the device 300D that is configured to interact with an adjacent surface that has electrical, mechanical, magnetic, and/or chemical sensing properties. In this example embodiment, the electrodes E1, E2 have a high density of conductive material sewn onto the surface of the layer of the flexible material 5 that is adjacent to (e.g., directly in contact with, nearest) the sensitive layer 6 to interact with the sensitive layer 6. The device 300D comprises electrically conductive threads 1 that are stitched, in the manner of signal transmission threads, into and/or onto separate (e.g., different, discrete, independent) layers of flexible material 5, which are layered on top of the layer of flexible material 5 in which the electrodes E1, E2 are disposed. The respective layers of flexible material 5, in which one of the conductive threads 1 are disposed (e.g., embedded and/or at, in, or on an external surface thereof), are provided on the same side of the sensitive layer 6 on which the layer of flexible material 5, in which the electrode E1, E2 to which such conductive thread 1 is connected is provided, is positioned. Regardless of which side of the sensing layer 6 that the layers of flexible material 5 in which the input or output electrodes E1, E2 are disposed, the input signal is received at the input electrode E1, transmitted through the sensitive layer 6, in which the input signal is transformed into an output signal, and the output signal is transmitted from the sensing layer 6 to the output electrode E2, on the opposite side of the sensing layer 6 from the input electrode E1. According to this example embodiment, the internal sensitivity of the sensitive layer 6 can be measured and/or determined.

FIG. 8E shows an example embodiment of a device, generally designated 300E, which is based on the device 300C shown in FIG. 8C. The device 300C comprises an input electrode E1 and an output electrode E2 that are sewn into and/or onto the same layer of flexible material 5. The electrodes E1, E2 are sewn in a manner such that the electrodes E1, E2 are exposed on a surface of the device 300C that is configured to interact with an adjacent surface that has electrical, mechanical, magnetic, and/or chemical sensing properties. In this example embodiment, the electrodes E1, E2 have a high density of conductive material sewn onto the bottom surface of the layer of the flexible material 5, which interacts with the sensitive layer 6 beneath the layer of flexible material 5. The device 300E comprises electrically conductive threads 1 that are stitched, in the manner of signal transmission threads, into and/or onto separate (e.g., different, discrete, independent) layers of flexible material 5, which are layered on top of the layer of flexible material 5 in which the electrodes E1, E2 are disposed. The respective layers of flexible material 5, in which one of the conductive threads 1 are disposed (e.g., embedded and/or at, in, or on an external surface thereof), are provided on the same side of the sensitive layer 6 on which the layer of flexible material 5, in which the electrodes E1, E2 are provided, is positioned. A layer of semi-porous material 7 is provided between (e.g., directly between, as in direct contact with each of) the sensitive layer 6 and the layer of flexible material 5, in which the electrodes E1, E2 are disposed. The semi-porous material 7 can be an electrically, mechanically, magnetically, and/or chemically porous material that, when deformed, opens or closes its pores, or alters an electromechanical, chemical, magnetic state, to allow the layer of flexible material 5, which is on (e.g., directly on, as in direct contact) the top surface of the layer of semi-porous material 7, and the sensitive layer, which is on (e.g., directly on, as in direct contact) the bottom surface of the layer of semi-porous material 7, to interact with each other (e.g., electrically). According to this example embodiment, an external stimuli received by the device 300E will cause a deformation of the layer of semi-porous material 7, which will then allow an electrical connection between the layer of flexible material 5, in which the electrodes E1, E2 are disposed, and the sensitive layer 6.

Alternatively, in some embodiments, the semi-porous material 7 can be electrically, mechanically, magnetically, and/or chemically induced to electrostatically, rather than mechanically, become highly conductive to allow a signal flow between the layer of flexible material 5, in which the electrodes E1, E2 are disposed, and the sensitive layer 6 without requiring any mechanical change to the pore size of the semi-porous material 7. According to the construction of the device 300E, the input electrode E1 acts is configured to provide an input signal into the sensitive layer 6, which then transforms the input signal into an output signal, and the output signal is then transmitted to the output electrode E2, which can then be transmitted, via the conductive thread 1 attached to the output electrode E2, to a receiving device. According to this example embodiment, the surface sensitivity of the sensitive layer 6 can be measured and/or determined. The conductive threads 1 from the electrodes E1, E2 are configured, in some embodiments, to provide electrical "bussing" to transfer signal to other parts of the device 300C.

FIG. 8F shows an example embodiment of a device, generally designated 300F, which comprises an input electrode E1 and an output electrode E2 that are sewn into and/or onto separate (e.g., different, discrete, independent) layers of a flexible material 5. In device 300F, the layer of flexible material 5 in which the input electrode E1 is disposed is on an opposite side of the sensing layer 6 from the layer of flexible material 5 in which the output electrode E2 is disposed. Thus, the layer of flexible material 5, in which the input electrode E1 is disposed, is at (e.g., directly against, in direct contact with) the top surface of the sensing layer 6 and the layer of flexible material 5, in which the output electrode E2 is disposed, is at (e.g., directly against, in direct contact with) the bottom surface of the sensing layer 6. In another example embodiment, the layer of flexible material 5, in which the input electrode E1 is disposed, can instead be at (e.g., directly against, in direct contact with) the bottom surface of the sensing layer 6 and the layer of flexible material 5, in which the output electrode E2 is disposed, can be at (e.g., directly against, in direct contact with) the top surface of the sensing layer 6. The electrodes E1, E2 are sewn in a manner such that the electrodes E1, E2 are exposed on a surface of the device 300F that is configured to interact with an adjacent surface that has electrical, mechanical, magnetic, and/or chemical sensing properties. In this example embodiment, the electrodes E1, E2 have a high density of conductive material sewn onto the surface of the layer of the flexible material 5 that is adjacent to (e.g., directly in contact with, nearest) the sensitive layer 6 to interact with the sensitive layer 6. The device 300F comprises electrically conductive threads 1 that are stitched, in the manner of signal transmission threads, into and/or onto separate (e.g., different, discrete, independent) layers of flexible material 5, which are layered on top of the layer of flexible material 5 in which the electrodes E1, E2 are disposed. The respective layers of flexible material 5, in which one of the conductive threads 1 are disposed (e.g., embedded and/or at, in, or on an external surface thereof), are provided on the same side of the sensitive layer 6 on which the layer of flexible material 5, in which the electrode E1, E2 to which such conductive thread 1 is connected is provided, is positioned. A layer of semi-porous material 7 is provided between (e.g., directly between, as in direct contact with each of) the sensitive layer 6 and the layer of flexible material 5, in which the input electrode E1 is disposed and also between (e.g., directly between, as in direct contact with each of) the sensitive layer 6 and the layer of flexible material 5, in which the output electrode E2 is disposed. The semi-porous material 7 can be an electrically, mechanically, magnetically, and/or chemically porous material that, when deformed, opens or closes its pores, or alters an electromechanical, chemical, or magnetic state, to allow the respective layer of flexible material 5, in which is disposed one of the electrodes E1, E2 and which is spaced apart from the sensitive layer 6 by the layer of semi-porous material 7, to interact with each other (e.g., electrically). According to this example embodiment, an external stimuli received by the device 300F will cause a deformation of the layers of semi-porous material 7, which will then allow an electrical connection between a corresponding one of the layers of flexible material 5, in which one of the electrodes E1, E2 is disposed, and the sensitive layer 6. Alternatively, in some embodiments, the semi-porous material 7 can be electrically, mechanically, magnetically, and/or chemically induced to electrostatically, rather than mechanically, become highly conductive to allow a signal flow between a corresponding one of the layers of flexible material 5, in which one of the electrodes E1, E2 is disposed, and the sensitive layer 6 without requiring any mechanical change to the pore size of the semi-porous material 7 positioned therebetween. Regardless of which side of the sensing layer 6 that the layers of flexible material 5 in which the input or output electrodes E1, E2 are disposed, the input signal is received at the input electrode E1, transmitted through the sensitive layer 6, in which the input signal is transformed into an output signal, and the output signal is transmitted from the sensing layer 6 to the output electrode E2, on the opposite side of the sensing layer 6 from the input electrode E1. According to this example embodiment, the internal sensitivity of the sensitive layer 6 can be measured and/or determined. The device 300F is particularly advantageous for providing differential control of the activation of the input and output electrodes E1, E2, such as may be achieved by controlling the stimulus provided to one or both of the layers of semi-porous material 7 that interface between one of the electrodes E1, E2 and the sensitive layer 6.

Figure 9:
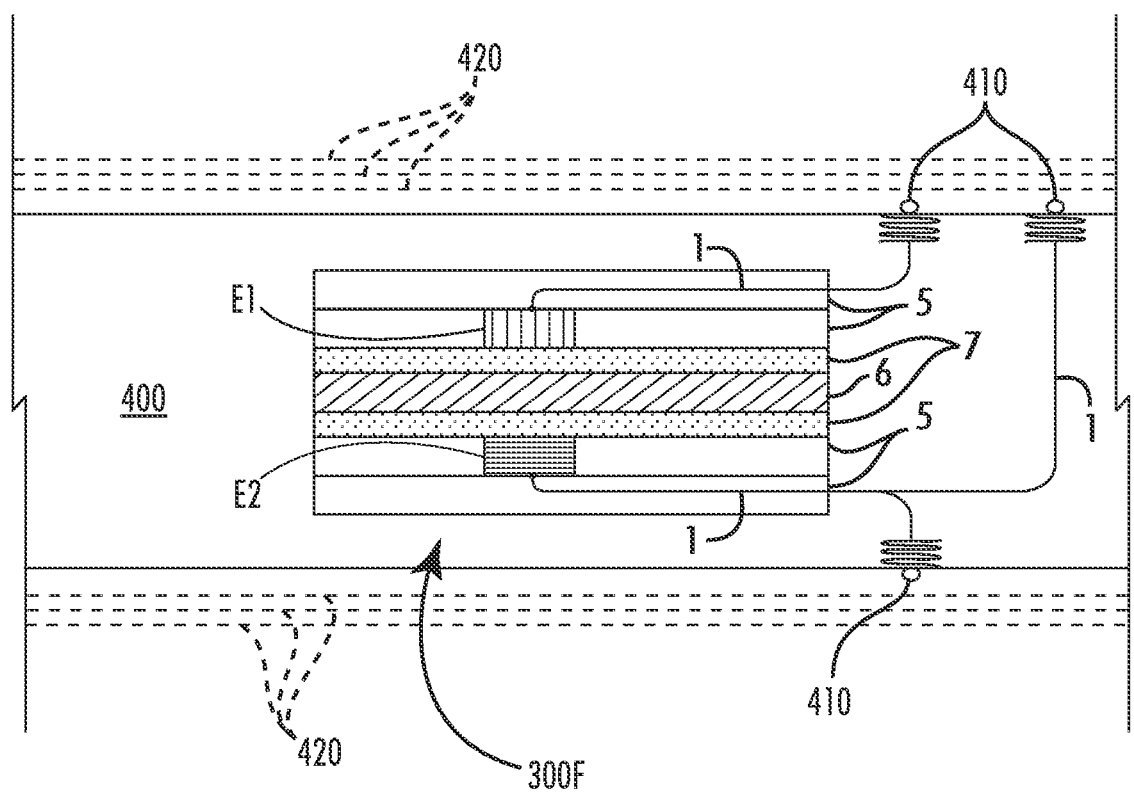
FIG. 9 is a sectional schematic view in which the system of electrodes shown in FIG. 8C are integrated into a garment, or final product.

FIG. 9 shows the device 300F of FIG. 8F in a generalized context within a garment 400, or final product. The first and second electrodes are further stitched with conductive threads 1 (e.g., in the manner of signal transmission threads) that navigate towards the top and bottom layers of the garment 400. The conductive threads 1 can be exposed on the top and/or bottom surfaces of the garment 400, or final product, such as at one of the terminals 410. The exposure of the signal transmission wires on the top or bottom surfaces can be done through a variety of electromechanical means, such as crimps, hook-and-loop fabric, solder, adhesives, wires, etc. Additional conductive threads 1 can, in some embodiments, be sewn connecting from existing conductive threads 1 to increase the number of connections to the corresponding input or output electrode, to which such conductive thread 1 is attached. The garment 400 can further contain additional top and/or bottom layers 420 for aesthetic or electro-chemical-mechanical purposes. Examples of used for such additional top and/or bottom layers 420 can include shielding the device 300F from RF and/or EMF/EMI signals, protecting the device 300F from chemical interference, such as sweat and/or light, and/or increasing mechanical stability of the device 300F by adding denser and/or anti-fraying materials.

Folds may be included to mechanically move one side of a material to another. One example purpose is to enable layers with conductive material to interact with other conductive materials either distant from one another on the same layer, or on opposite layers. Another example purpose is to form crease marks that preferentially bend when an external force is applied. Another example purpose is to allow actuation of the device, in which a fold can turn on or off the device by connecting conductive material from different parts of the device. Examples of folds include, without limitation, mountain fold, valley fold, linear and non-linear creases, roll-in-fold, pleat fold, turn over, squash fold, push in, and inside or outside reverse folds. Folds and 3 dimensional crafts can be taken from origami structures.

Folds found in nature, specifically atomic bonds and biological networks, can be used as the general basis for more complex folding architectures that enable 3 dimensional folding patterns, but are not limited to such naturally-derived folds. Folding patterns typically follow rational values of pi ($\pi/2$, $\pi/3$, $\pi/4$). These folds allow a 2-dimensionally organized device to form into a 3-dimensional structure.

Folds and cuts can be used to make 3-dimensional and expandable structures. Folds and cuts can, in some instances, be tessellated in a matrix to allow curvature and bending of a device. Non-symmetrical folds and cuts can be used to create edges, islands, or structures that can border between two or more matrices of folds and cuts. A non-limiting example is making a cut between two separate areas of cut and fold patterns to separate the folding structure of either side folding or interacting with one another. Folds and 3-dimensional cuts can be taken, for example, from kirigami structures, but are not limited thereto.

Folds and/or cuts onto a single sheet of fabric can be used, in some instances, to design garments (e.g., for wearing by a human). Folds and/or cuts can also be utilized to allow expandability for different sized bodies such that sizes, such as small, medium, and large, are made on the same garment but stretched, or expanded, to conform to the desired body size. Having a universally sized garment will advantageously allow for increased efficiency in manufacturing and at retail, while also allowing the same garment to be shared among persons having different body sizes. Furthermore, repeated patterns of folds and cuts can be used to allow the garment to be worn in different orientations and/or angles for aesthetic and/or functional purposes.

Figure 10A:
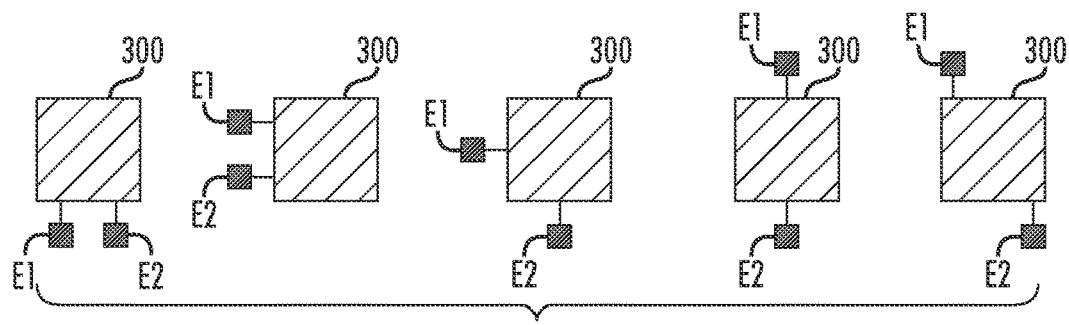
FIG. 10A is a schematic illustration of various example embodiments for electrical connection of a touch-sensitive device to two electrodes.

In FIG. 10A, a plurality of different example arrangements of electrodes E1, E2 about a sensor 300 is shown. In FIG. 10A, each sensor 300 require a minimum of two electrodes E1, E2. The electrode E1 is an input electrode and is configured to allow an input signal to be transmitted into the sensor 300; the electrode E2 is an output electrode and is configured to allow an output signal to be transmitted from the sensor 300, such as to a receiving unit, central processing unit (CPU), another sensor 300, and/or transmission device (e.g., for wired and/or wireless transmission), such as a WiFi® or Bluetooth® module. The sensors 300 can be manufactured into any shape, with the electrodes E1, E2 being connected in any arrangement with respect to the sensor 300 that allows a signal to be transmitted into and out of the sensor 300. The signal into and out of the sensor 300 travels the shortest distance between the electrodes E1, E2. Therefore, electrodes E1, E2 that are connected to the sensor 300 at respective positions that are further away from each other capture (e.g., measure) a larger portion of the sensing area (e.g., in sensing layer 6, FIGS. 8A-8F) of the sensor 300. Conversely, electrodes E1, E2 that are connected to the sensor 300 at respective positions that are closer to each other capture (e.g., measure) a smaller portion of the sensing area (e.g., in sensing layer 6, FIGS. 8A-8F) of the sensor 300. However, as the distance increases between the locations on the sensor 300 to which the electrodes E1, E2, the sensitivity of the sensing area decreases. For example, electrodes E1, E2 that are connected to the sensor 300 at positions that are closer together are more sensitive to an input signal than are electrodes E1, E2 that are connected to the sensor 300 at positions that are further apart; such electrodes E1, E2 that are connected to a sensor 300 with increased distances therebetween may require more (e.g., a higher magnitude, or amplitude) stimulus (e.g., input signal) to produce a reading. This is due to impedance matching, signal degradation through more sensing material, and exposure to increased parasitic capacitance and resistive noise from the environment.

Figure 10B:
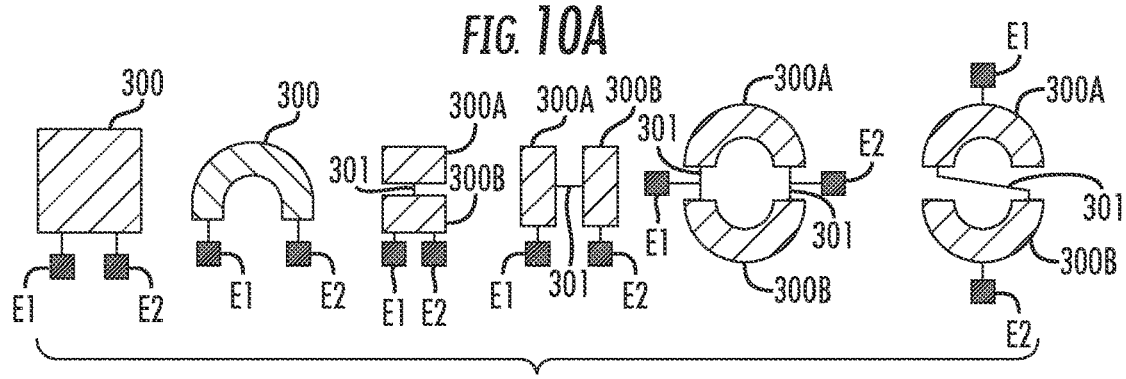
FIG. 10B is a schematic illustration of various example embodiments for various shapes and/or sizes of a touch-sensitive device, which is connected between two electrodes.

In FIG. 10B, it is shown that the sensing area of the sensors 300 can be cut, folded, twisted, repeated, and overall distorted in any 2D or 3D topology to best cover the sensing area of interest. In some example embodiments shown therein, the sensor is cut, or otherwise bifurcated, into two sensor areas 300A, 300B, which are connected together by highly electrically conductive wires 301 (e.g., electrically conductive threads). Electrodes E1, E2 can intersect any sensing area or connectors between sensing areas.

Figure 10C:
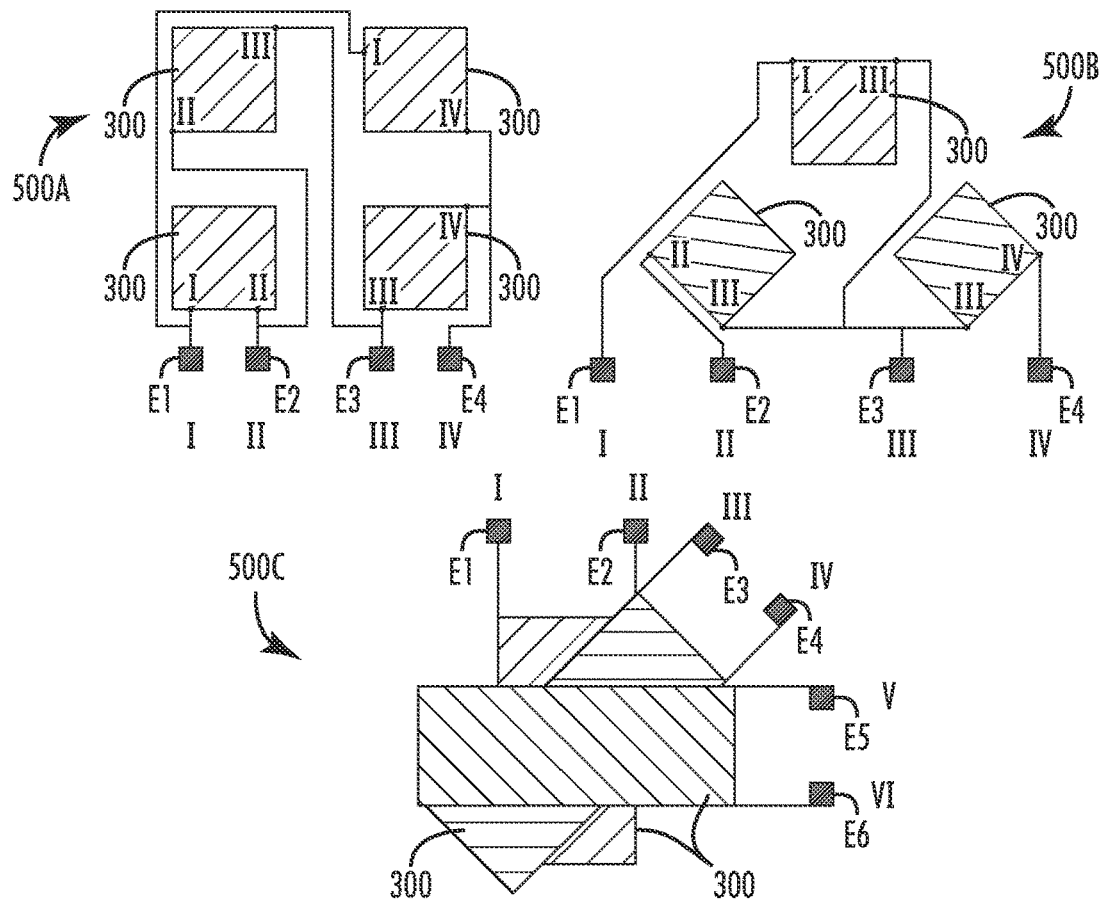
FIG. 10C is a schematic illustration of example embodiments of electrical connections between a plurality of touch-sensitive devices and respective electrodes for X, Y, and Z directional monitoring.

In FIG. 10C, example embodiments of systems, generally designated 500A-500C, are shown, which comprise combinations of sensors 300. The sensors of such systems 500A-500C can be organized such that connectors and electrodes (e.g., E1-E6) can be shared between sensors 300. In addition, sensors 300 can be arranged such that signal fusion can be performed to measure the overall signal input of such system 500A-500C. For example, the system 500A comprises a grid of sensors 300 can be used to generate a 2D representation of the signal on a plane; applications may include, for example, touch sensing, or ground mapping. Another example embodiment shown in FIG. 10C is system 500B, in which the sensors 300 are angled, inclined, and/or tilted relative to each other, such that the direction of the signal that impacts the system (e.g., 500B, 500C) can be determined; applications may include, for example, swiping on a screen, or devices that need to differentiate how a signal travels across and/or through a device. Another example embodiment shown in FIG. 10C is system 500C, in which the sensors 300 are stacked in an angled, inclined, and/or tilted arrangement relative to each other; in such an example embodiment, the system 500C can measure the perpendicular characteristic of the signal, such as the magnitude and rate of signal change, as well as the direction and angle at which the signal was received by the system 500C. In such systems 500A-500C, inter-sensor spacing determines the voxel resolution of the sensor matrix. Orientation and inter-sensor layout determine the sensing directionality and angle. Sensors 300 distributed, or arrayed, in horizontal and vertical rows and columns can measure changes in the X-Y directions, as defined in Cartesian coordinate systems. Sensors 300 distributed, or positioned, in a radial pattern can measure changes in an angular direction, as defined in a polar coordinate system. Sensors 300 that are overlaid on each other (e.g., stacked vertically on top of each other) can measure small changes in the vertical direction (e.g., in the thickness direction, in the direction in which such sensors 300 are stacked) and can correct for mechanical, thermal, and/or non-conformal defects.

Figure 11A:
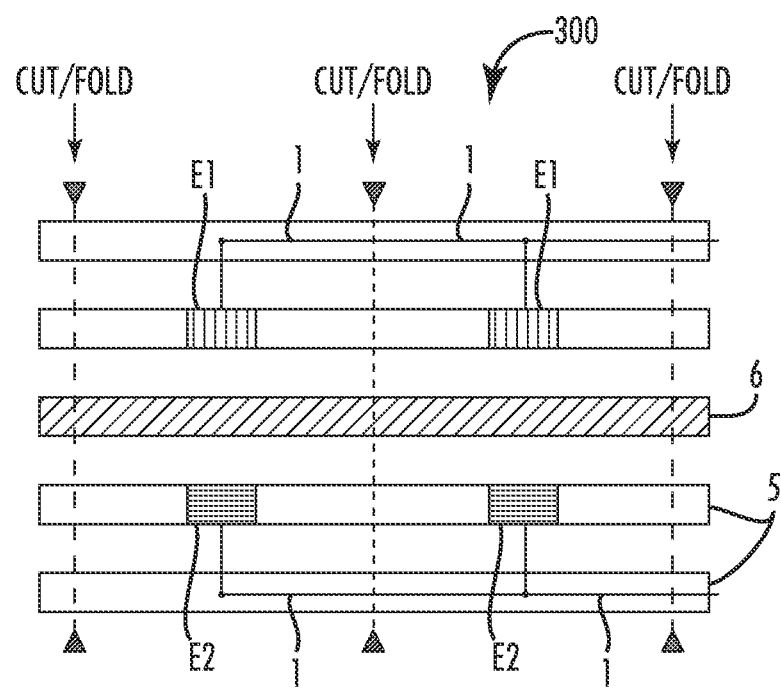
FIGS. 11A and 11B are respective sectional and top views in which folds and/or cuts can be used in the devices shown in FIGS. 8A-8C and 9 to provide enhanced functionality.
Figure 11B:
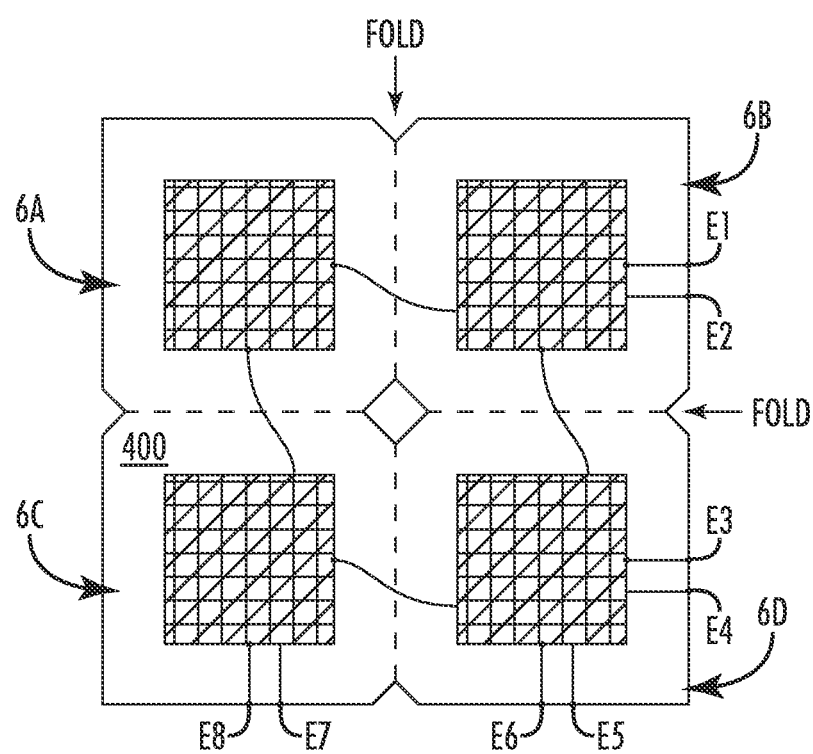

FIGS. 11A and 11B schematically show how folds and/or cuts can be used to add flexibility, expandability, and 3-dimensional curvature to sensors shown in FIGS. 8A-F, 9, and 10. To illustrate this, an example embodiment comprising a 2×2 matrix of sensors (shown as sensing layers 6A-6D) is provided, using four (4) input electrodes (e.g., E1-E4) and four (4) output electrodes (e.g., E5-E8) connected on different sides of the sensitive layers 6A-6D. The signal transmission threads from the electrodes are bussed on separate layers from the electrodes E1-E8. Arrows pointing towards the layers are areas where folds or cuts will be made. FIG. 11A is a cross-sectional view of a device comprising a plurality of sensors 300 created due to folding and/or cutting. FIG. 11B is a top view of the, in which solid lines indicate where cuts have been made and broken lines indicate locations for folds to be made. Cuts are made in layers devoid of any electrode(s) or conductive threads. Folds are made between electrodes E1 in the same layer and between electrodes E2 in the same layer, to demarcate areas of sensitive regions. The device shown in FIGS. 11A and 11B is configured to stretch in the x- and y-directions, as well as curve in the z-direction. Example applications for such devices can include, without limitation, applying such device(s) onto joints of the human body, such as the shoulder, elbow, knee, ankle, hip, wrist, finger and toe digits, chest, and/or neck to measure compressive, tensile, stretching, and pressure forces. Other example sensing features can also include skin-voltage pickup and physiological measurements, such as temperature, humidity, and/or sweat sensing.

Figure 12A:
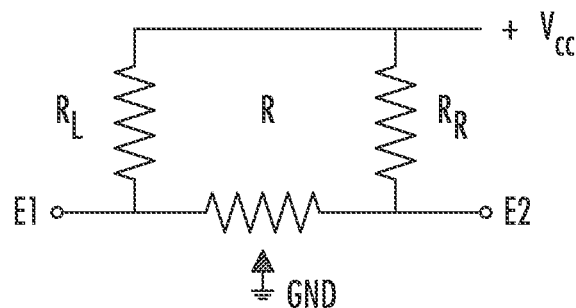
FIG. 12A is an electrical schematic of an example embodiment of a dual electrode touch-sensitive device.
Figure 12B:
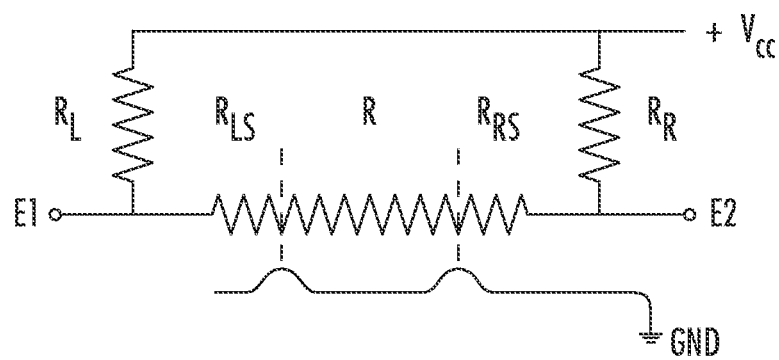
FIG. 12B is an electrical schematic of an example embodiment of a dual electrode touch-sensitive device, in which the pull-up resistors are equal to each other.
Figure 12C:
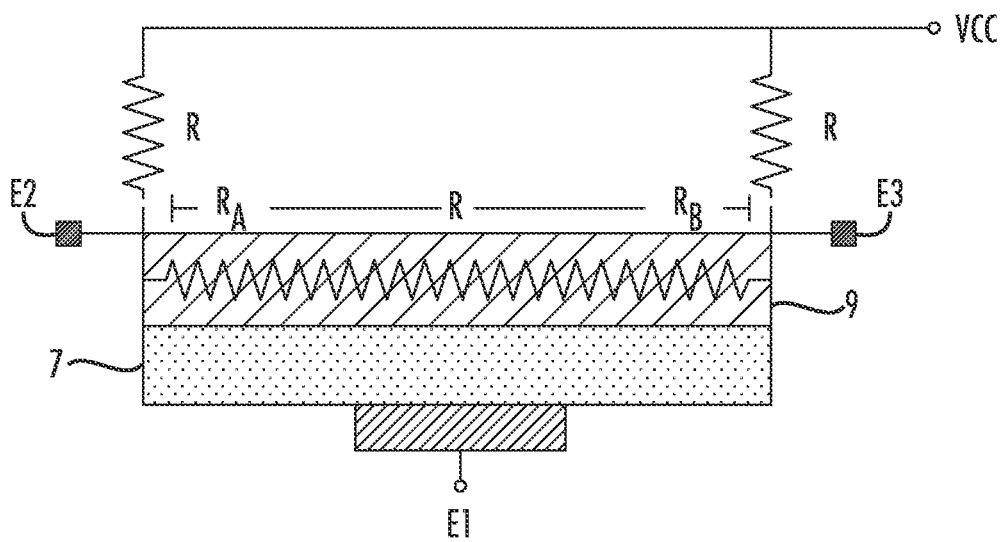
FIG. 12C is a schematic illustration of an example embodiment for a touch-sensitive device constructed from electrodes, connectors, and resistors made from fabric.

FIGS. 12A-C show electrical schematics, or diagrams, for construction of such a touch sensitive device as is disclosed herein. FIG. 12A shows a dual-electrode touch device. The device uses a voltage divider mechanism comprising two resistors $R_L$ and $R_R$. A force caused by a touch causes a signal connection on a resistive area R. A touch completes a circuit by connecting the resistive area R to ground. The location at which the touch occurs splits the resistive area R in two, the left and right sides towards the left and right voltage dividers $R_L$, $R_R$, respectively. The two regions of the resistive area R can be divided from left to right. The left and right voltage dividers $R_L$, $R_R$ are pull-up resistors, each of which is connected to $V_{cc}$. A left and right signal are read (e.g., at electrodes E1, E2) from the left and right voltage dividers $R_L$, $R_R$. The signals from the left and right side of the resistive area R are ratios of $V_{cc}$, their combined ratios being equal to 1. The ratio of the left and right signal corresponds to the relative distance of the touch from the left and right side of the resistive area R.

FIG. 12B shows a dual-touch sensitive device, similar in construction to the device shown in FIG. 12A, but with the left and right pull-up resistors $R_L$, $R_R$ being equal. Applying two touch points on the resistive area R creates 3 resistor segments connected to ground. The right and left segments, denoted as $R_{LS}$ and $R_{RS}$, are used to calculate the signal ratio on the right and left electrode. However, the middle portion of the resistor segment, R, is not used, and is not required for the dual-touch location calculation. The equation of the left voltage divider ratio is $R_{LS}/(R_{LS}+R_L)$. The equation for the right voltage divider ratio is $R_{RS}/(R_{RS}+R_R)$. This equation is true if the touch connection is ground, and the left and right pull-up resistors $R_L$, $R_R$ are connected to $V_{cc}$. When the connections are reversed, the equations instead follow $R_L/(R_{LS}+R_L)$ and $R_R/(R_{RS}+R_R)$ for the left and right side ratios, respectively. Furthermore, the middle portion of the resistive area R (e.g., the portion between the two touch points) can be indirectly derived as $R_{TOT}-R_{LS}-R_{RS}$, where $R_{TOT}$ is the total resistance of the resistive area. A left and right signal are read (e.g., at electrodes E1, E2) from the left and right voltage dividers $R_L$, $R_R$. The signals from the left and right side of the resistive area R are ratios of $V_{cc}$, their combined ratios being equal to 1. The ratio of the left and right signal corresponds to the relative distance of the touch from the left and right side of the resistive area R. Thus, the relative left touch and right touch locations on the resistive area can be determined.

FIG. 12C shows an example embodiment for construction of a touch sensor using electrodes, connectors, and resistors made from fabric. The first electrode E1 is a sewn area on (e.g., in direct contact with) a semi-porous material 7 that prevents contact onto a first layer of resistive, or piezoresistive, material 9. The resistive material 9 comprises a semi-conductive fabric, whose stitch count, weight, density, and thickness are selected to tailor a specific resistance following equation $R=\rho t/A$, where t is the thickness of the fabric layer, and A is the length and width of the fabric layer. $\rho$ is the resistivity of the fabric, which is determined by its mechanical and chemical composition. Changes in thickness, area and resistivity of the fabric make it mechanically and touch responsive.

At the end of the layer of resistive material 9, second and third electrodes E2, E3 are connected. The second and third electrodes E2, E3 are sewn to a second and third resistive fabric layer (e.g., each comprising one of resistors R) leading to a shared connector which can either be connected to an electrical ground or a power source, such as $V_{cc}$. The second and third resistive fabric layers have equivalent resistance values. In this example, the signal to which the shared connector is connected is ground. To complete the circuit, the first electrode E1, which activates the touch signal, is connected to $V_{cc}$. If the signal orientation was reversed such that the first electrode E1 was an electric ground and the second and third resistive fabric layers were connected to $V_{cc}$ then, when the device is not touched and thus no signal flow occurs, $V_{cc}$ on the second and third resistive fabric layers would build up charge, which would lead to static, heat dissipation, or other undesirable effects. If $V_{cc}$ is connected to the first electrode E1 then, when the device is not touched, the charge can be dissipated in the semi-porous material layer 7 and will not affect the other components of the device.

When the device is not touched, the first electrode E1 does not contact the resistive material 9 due to the semi-porous material 7. Therefore, the device is not on (e.g., is in an inactive state). When the device is touched, the first electrode E1 penetrates the semi-porous material 7 and induces a voltage division in the resistive material 9, between the left and right sides thereof. Following the equations described in FIGS. 12A and 12B, the signal ratio that is split between the second electrode E2 and the third electrode E3 can be calculated. The signal ratio is then used to calculate the relative position of the touch from the left and right side of the device.

Figure 13B:
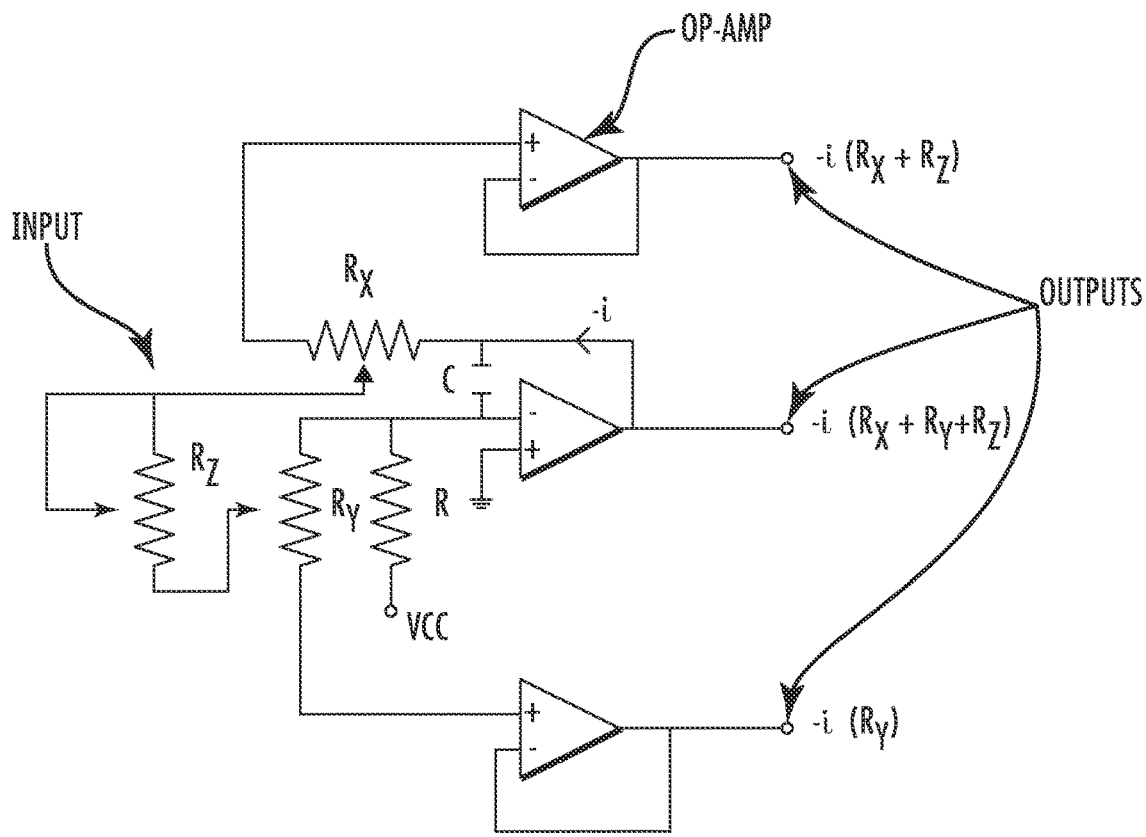
FIG. 13B is an example embodiment of an electrical schematic forming an electrical circuit, which includes the touch-sensitive device shown in FIG. 13A.

FIGS. 13A and 13B show another example embodiment of a touch sensor, which was modified from the embodiments shown in FIGS. 12A-C. The modification in the device shown in FIGS. 13A and 13B is achieved by adding a pressure sensitive material to sense both touch location and the amount of force applied from the touch. Such a pressure sensor can be implemented, for example, by an additional voltage divider from the resistive area to $V_{cc}$. The additional voltage divider uses a pressure sensitive material $R_P$ that changes its impedance based on changes in pressure. The device comprises two switches SW that are toggled to enable selective measurement from the left and right voltage dividers used to calculate touch position, and the voltage divider used to measure pressure. One switch SW is in series between the left and right pull-up resistors to $V_{cc}$, and the second switch SW is in series with $R_P$ to $V_{cc}$. Only one switch SW is activated during a given measurement. When a touch occurs, the switch SW to the left and right voltage dividers is activated to measure the location of the touch. Afterwards, the switch SW on the pressure voltage divider is on, allowing pressure measurement following the equation $R_P/(R_P+R_A)$, where $R_A$ is the change in resistance of the sensitive layer. These calculations must be performed sequentially, not in unison (e.g., not simultaneously), since the touch voltage dividers and the pressure voltage dividers can interfere with the readings obtained from each other. If the electrodes are connected to a microcontroller or processors, the firmware can determine when and how quickly to toggle between touch and pressure measurements.

FIG. 13A is a sectional view of a fabric-based touch sensor device. In this example embodiment, a first electrode E1 is embedded in, or connected to, a semi-porous material 7. The semi-porous material 7 interfaces with a sensitive layer 6, which comprises a pressure-sensitive material. The pressure sensitive material is layered, on an opposite side from the semi-porous material 7, with a layer of resistive material 9, which is used for touch measurement. The order in which the pressure sensitive material 6 and the resistive material 9 are arranged can be interchanged from that which is shown in FIG. 13A. The resistive material 9 is further connected, on opposite sides thereof, to third and fourth electrodes E2, E3, which are used to measure the touch signal on the left and right side, respectively. The third and fourth electrodes E2, E3 are further connected to additional left and right resistive materials R, which can be configured as either of pull-up or pull-down resistors. The left and right resistive materials R are each connected in series with a corresponding switch SW, before connecting to $V_{cc}$. The device also comprises a second electrode E2, which is embedded in a layer of flexible material 5 between the pressure sensitive material 6 and the resistive material 9. The second electrode E2 is connected to a fifth electrode E5, which is exposed on the outer parts of the device for external measurement. The fifth electrode E5 is connected in series with another resistive element $R_P$, which is configured as either a pull-up or pull-down resistor. The fifth electrode E5 is also connected in series with a switch SW before connecting to the resistive element $R_P$.

When a pressure force exceeding a specific threshold (e.g., a mechanical, chemical, electromechanical, and/or magnetic threshold) of the semi-porous material 7 is applied to the device, the first electrode E1 makes electrical contact with the pressure sensitive material 6, as well as the resistive material 9. For touch sensing, the signal is split between the left and right side of the resistive material 9, labeled as RA and RB, respectively. At the same time, the fourth electrode E4 makes an electrical connection with the first electrode E1, and the compressive force changes the impedance of the sensitive material by $R_A$, which is divided across $R_P$. The touch pressure corresponds to the voltage division ratio calculated as $R_P/(R_P+R_A)$. The device may have to be calibrated to measure touch forces between a minimum and maximum value. The ratio determined by the touch voltage division corresponds to a specific value between maximum and minimum values, determined by $(max-min)\times R_P/(R_P+R_A)$.

The switches SW connected to the touch sensitive circuit and pressure sensing circuit must be toggled alternately between one another. Through mechanically toggling, or through firmware-controlled (e.g., by a microcontroller or CPU) toggling, the first switch SW must be on and the second switch SW must be off to measure touch. Afterwards, the first switch SW must be off and the second switch SW must be on to measure the pressure imparted to the device by the touch.

FIG. 13B shows a block diagram of FIG. 13A, in which operational amplifiers, generally designated OP-AMP, are used as signal buffers between the voltage dividers for touch sensing and pressure sensing. The OP-AMPs are used instead of switches in this embodiment. A benefit of using OP-AMPs is that no external instructions are needed to toggle between the switches of the touch sensing circuit and the pressure sensing circuit. OP-AMPs can control the flow of signal due to their high input impedance and low output impedance. Additionally, OP-AMPs can be configured in negative feedback loops as voltage followers to further isolate input and output signals between different segments of a circuit. Furthermore, OP-AMPs can be configured as non-inverting or inverting amplifiers to modulate signal changes. MOSFETs, BJTs, diodes, and other transistors with tri-state logic and logic controlled high impedances can be used instead of OP-AMPs in some embodiments.

Figure 14A:
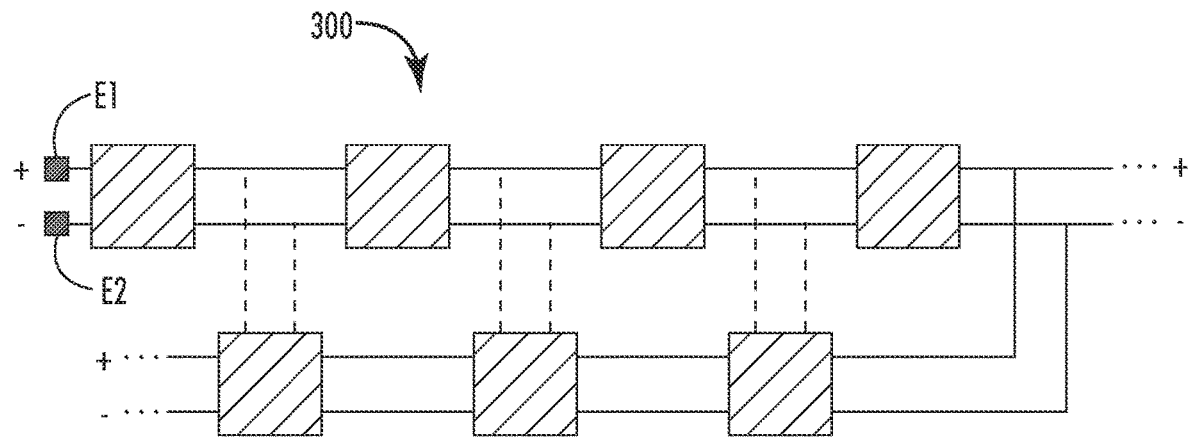
FIG. 14A is a schematic illustration of an example embodiment of a system, in which a plurality of devices are connected between input and output electrodes in series or in parallel.
Figure 14B:
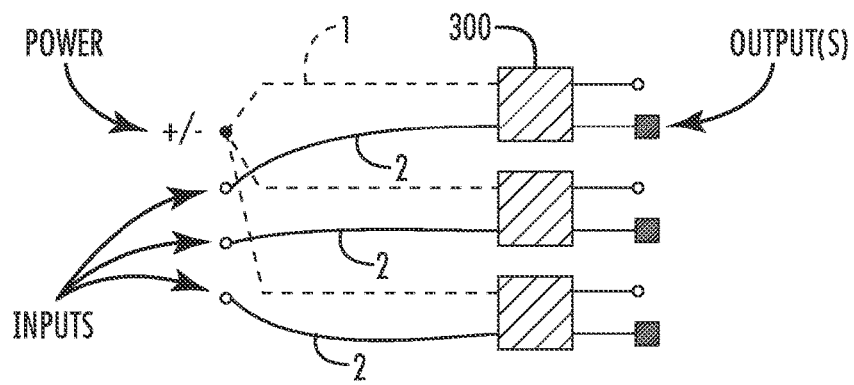
FIG. 14B is a schematic illustration of an example embodiment of a system comprising a plurality of devices, in which they share a common input, yet output signals from multiple touch-sensitive devices are wired independently of each other.
Figure 14C:
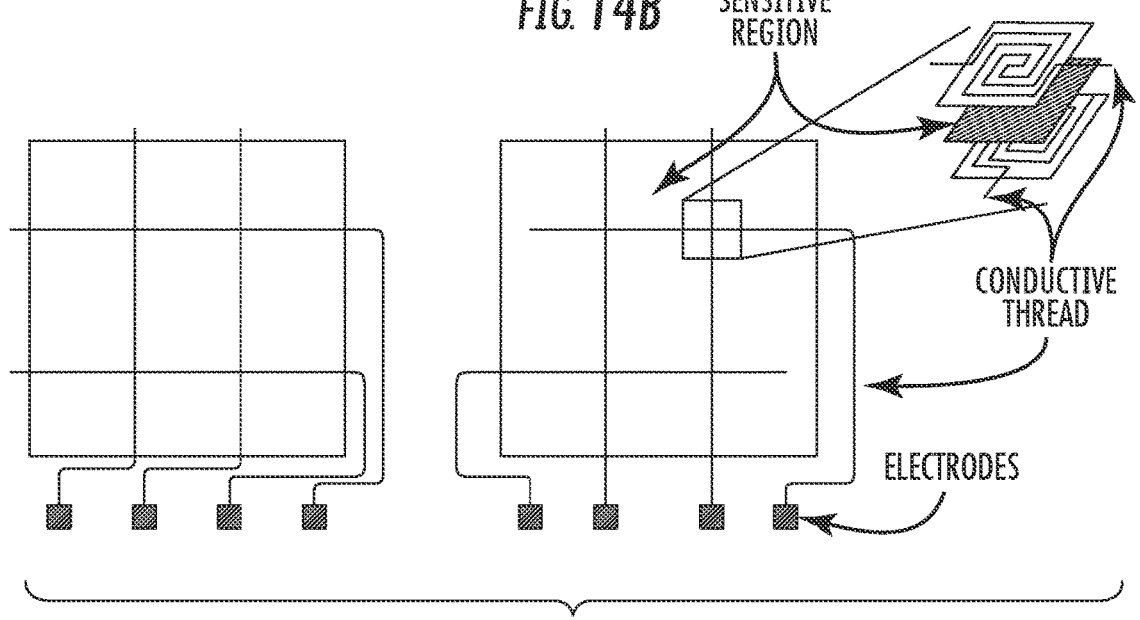
FIG. 14C is a schematic illustration of an example embodiment of a system comprising a plurality of devices, in which power, ground, input, and/or output signals are wired in a grid-like pattern on separate layers of a multi-layer fabric.

FIGS. 14A-C shows several connection schemes that route the input and output signals from a chain or array of sensors 300. FIG. 14A shows a daisy-chain strategy, in which the output of one sensor is used as the input of a neighboring sensor. The wires can be power, ground, or signal wires. Examples of such connections are I2C, SPI, and SWI communication which need a minimum of 1 wire, or at most 4 wires. Wires can transmit a frequency modulated signal such that specific frequencies are matched to a particular sensor along the chain. Each sensor has its own signature allowing for specific and controllable device-to-device communication. Instances in which daisy-chain communication may not be suitable include when certain sensors cannot accommodate high frequency communication. Another example when daisy-chain communication may be unsuitable is when sensors cannot receive or share a power or ground source from a neighboring sensor due to power incompatibility, impedance mismatch, and/or risk of signal degradation due to signal cross-talk. Daisy chaining is a method to limit the amount of connectors by propagating the same signals throughout a chain or array of sensors. The input and output electrodes (denoted as + and −, respectively, in FIG. 14A) is applied to a sensor, and then bussed to a neighboring sensor. The connectors can be bussed in series (solid lines) or in parallel (broken lines), in which the connectors branch, or fork, to connect to adjacent sensors.

FIG. 14B shows another example embodiment of a connection scheme in which one wire is shared among multiple sensors, but either of their input or output signals are independently wired. The shared wire is typically a power or ground source, or an input signal. The output signal is typically individually wired per sensor. In such a scheme, the number of connections is at least n+1, where n is the number of sensors. The benefit of this wiring configuration is that it's compatible with almost all types of sensors, independent of their frequency requirements, power compatible, impedance matching, or signal crosstalk. In addition, the firmware and CPU setup is much simpler by interfacing independently with each sensor rather than needing to modulate and deconvolve frequency signals. As shown in FIG. 14B, arrays of sensors 300 can share the same input signal, as long as the sensors 300 are of the same type, or have similar electrical characteristics. The input signal can be VCC, GND, a digital signal, or a frequency-dependent analog signal. The output of each sensor is independently connected.

FIG. 14C shows another example embodiment of a connection scheme in which power, ground, or input and output signals are wired in a grid-like pattern on separate layers that connect to sensors. For this example embodiment, the power lines are wired on the top layer, and the output signal wires are wired on the bottom layer. The power lines are wired from top to bottom in the vertical direction of FIG. 14C, whereas the output wires are wired from left to right in the horizontal direction of FIG. 14C. The wires then curve to aggregate to a centralized CPU connection, denoted as electrodes. The quantity of intersecting points on the grid determines the quantity of devices or sensors that can be installed. Therefore, if there are n rows, and m columns, are at least n×m connected sensors. To individually communicate with each sensor requires firmware control of when the power and signal wires are turned on, off, or put into a high-Z state.

To measure the sensor at (1, 1), meaning the sensor at the first row and first column, requires turning on the power line on column 1, turning off all other power lines, and reading the signal from row 1. In this state, it is also possible to measure the sensor at (2, 1), which is the second row sensor where the first power column line is on. To measure the device at (1, 2) requires turning on the power line on column 2, turning off all other power lines, and reading the signal from row 1. Similarly, the sensor at (2, 2) can be read as it shares the same power line at column 2. This selective on-off switching of power lines can be performed quickly such that the entire map of sensors can be measured in one CPU cycle.

There are several example design considerations for FIG. 14C to minimize the amount of stray signal, and signal crosstalk. One such design consideration is the amount of stray capacitance between sensors and signal wires, which determines how quickly the CPU can move to read the neighboring sensor. Stray capacitance must be fully dissipated before reading the neighboring sensor. Another such design consideration is the separation layer between the power and signal lines, such that the power lines do not cross to dissipate into neighboring power lines. Another such design consideration is the travel distance of the power and signal lines; the longer the line, the most susceptible it is to signal degradation, noise injection, and crosstalk. To minimize these issues, it may be necessary to add amplifiers within the device (e.g., which comprises the plurality of sensors) so that signals are amplified or maintained along long wire paths.

As shown in FIG. 14C, a matrix of sensors is connected in a configuration, such that there exists a plane of vertical connectors and a plane of horizontal connectors, such that at the intersection of the connectors is a sensor that connects to the input and output signal. In some embodiments, the vertical or horizontal connectors can be coplanar with each other as long as they do not intersect or, otherwise, have a covering layer that prevents electrical shorts between the connectors; a simple example is insulating wires). The vertical connector can be either the input or output signal carrier; the horizontal connector would be the complementary signal carrier type. At each intersection point of the vertical and horizontal connectors is a sensor, where the sensor can display a signal pattern that connects to the vertical or horizontal connector. The signal pattern determines how large and how sensitive the sensor is at that intersection point.

The example connector configuration shown in FIG. 14 can be applied to a monolithic sensing layer. The monolithic sensing layer can be divided into coordinates of sensitive regions determined by the number of vertical or horizontal connectors. The intersection of the vertical and horizontal connectors determines the location at which the sensor layer is sensitive. The signal pattern at the intersection point determines the area of sensitivity, as well as the sensitivity level. This can be advantageous because there is no need to first cut or distribute the sensor layer into discrete units; in such an embodiment, a single sensor plane can be used and electrically divided by the intersection locations of the vertical and horizontal connectors. In such an example embodiment, the quantity of connecting wires is n+m, where n is the number of vertical sensors, and m is the number of horizontal sensors in the matrix.

In the example embodiment shown in FIG. 14C, the dimensions of the pattern and inter-pattern separation is determined by the amount of surface coverage and resolution of the surface. The number of turns and amount of surface covered by the conductive traces is used to determine the dynamic range and sensitivity of the sensitive region. However, the more complex the pattern, the more effort is required to fabricate such a design, and the cost of using conductive thread increases, thereby increasing the costs associated with assembly, or fabrication. Further, patterns must be contiguous and constructed from a single thread with no overlaps, such that the neighboring patterns may be created during the same run. Although patterns may be separately fabricated, an additional step of bonding between the neighboring patterns must be performed using an additional sewing, embroidery, adhesive, ultrasonic welding, or similar method, which increases complexity of the construction. FIG. 14C shows a represented method of routing the traces with either row or column wired together and terminated at an easily accessible edge. FIG. 14C shows how two layers can be stacked to form an exemplary surface of sensors. Example use-cases of separating the sensitive regions are for monitoring steps, or distant objects, and/or movement. With multiple separated conductive regions, a single layer can contain all rows or columns connected and terminated to the same lead.

Figure 15A:
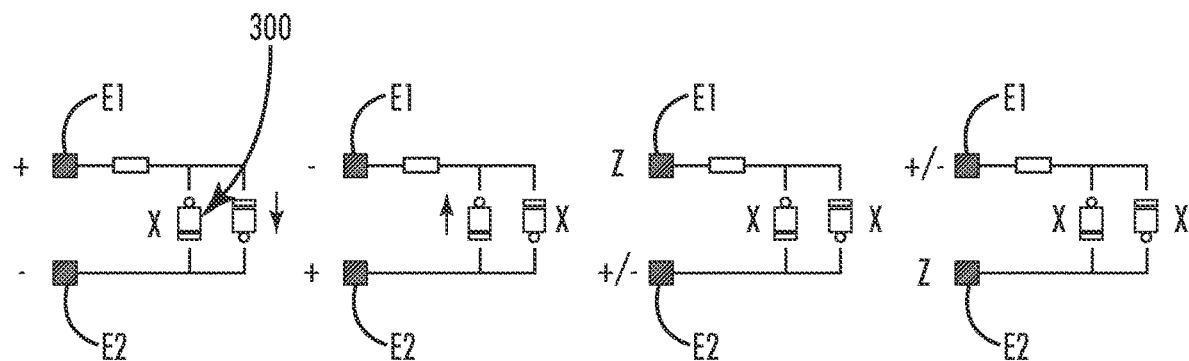
FIG. 15A shows various example embodiments of electrical connections between electrodes for multiplexed electromechanically sensitive devices.
Figure 15B:
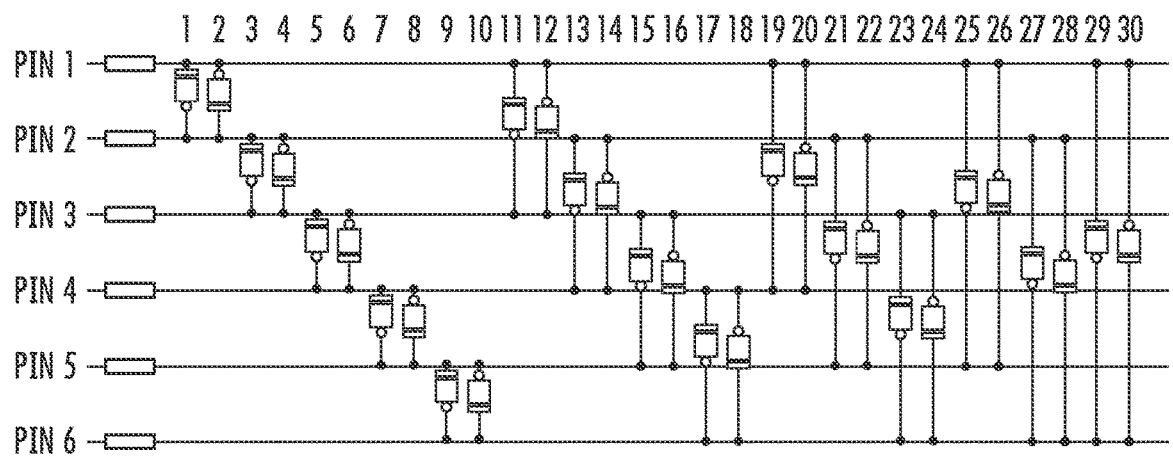
FIG. 15B shows an example embodiment of a fabric-based system in which a plurality of electromechanically sensitive devices are connected via Charlieplexing.
Figure 15C:
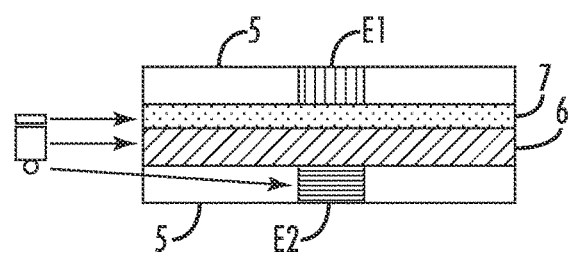
FIG. 15C is a sectional view of an example embodiment of a fabric-based transistor device shown in FIG. 15B.

FIGS. 15A-C show another connection scheme in which sensors 300 are multiplexed using the least amount of wires possible. The connection configuration shown is applicable for sensors that can operate in a tri-state manner, meaning sensors can be on, off, or in a high-Z state. Similarly, the CPU controlling the device must have tri-state control. In addition, the device must behave with signal polarity, meaning that signal can only flow from input to output. Voltage or current flowing from the output to input will put the device in a high-Z state. Each wire may also require a resistor to control for the flow of current and minimize the amount of signal interference between connected sensors.

In a two device configuration, a first sensor 300 has its input connected to a first electrode, and its output connected to a second electrode and a second sensor 300 has its connections reversed, such that its input is connected to the second electrode, and its output is connected to the first electrode. If the first electrode sends a signal, then the first sensor 300 is turned on and the second sensor 300 enters a high-Z state. The second electrode would read the signal from the first sensor 300. If the second electrode sends a signal, then the first sensor 300 enters a high-Z state and the second sensor 300 is turned on. The first electrode would read the signal from the second sensor 300. This principle can be expanded to multiple sensors 300. As multiple sensors 300 are connected, the polarity between input and output signals are toggled to measure the signal of the connected sensor 300. In order to eliminate cross-talk between neighboring sensors 300, all other electrodes must enter a high-Z state to disconnect non-measured sensors 300.

FIG. 15B shows a fabric-based Charlieplexed system. The configuration is linearized for visual purposes, but can also be configured into a grid-like configuration. Each signal wire/electrode is in series with a resistor. Each resistor has an identical resistor value. Each sensor is indicated as a square with a bar on one end, and a dot on the other end. The bar indicates the sensor's input signal, and the dot indicates the sensor's output signal. Signals can only move from the bar to the dot. Signals traveling from the dot to the bar will render the sensor in a high-Z state. Signals from the bar to the dot must exceed a certain threshold in order to activate the sensor and turn it on. In some sensors, that may mean a mechanical force such as a touch, or an electrical voltage. A sensor with on-off and signal polarity behavior can also be described as a transistor.

Two sensors in opposite orientation can be connected to the same pair of electrodes because of the sensor's signal polarity. For the example of electrode 1 and 2, also referred to as electrode 1 and 2, power is sent via signal wire 1, therefore turning on the first sensor and forcing the second sensor to enter a high-Z state. Electrode 2 is then used to measure the output of the first sensor. If power is sent via electrode 2 then the second sensor is turned on and the first sensor enters a high-Z state. Electrode 1 is then used to measure the signal from the second sensor. During these measurements, the remaining electrodes 3 and on are put into a high-Z state, effectively disconnecting all sensors on pins not connected to electrodes 1 and 2. This pattern of measuring pairs of sensors on a pair of electrode pins can be looped through all combinations of electrodes. The first loop will loop through pins 1 to N, and the second loop will loop through pins 2 to N. Examples of pairs are (1,2), (1,3), (1,4) . . . , and (2,1), (2,3), (2,4), and (3,1), (3,2), (3,4) . . . to all possible positions of the N pins. Therefore, given N pins, there can be at most $N^2-N$ connectable sensors. If given the number of sensors beforehand, in this case n number of sensors, then the number of pins required to wire them all together would be.

FIG. 15C shows a cross sectional view of a fabric-based transistor sensor shown in FIG. 15B. The bar indicating the input of the sensor is schematic illustration of the layer 5 containing the first electrode E1, made of sewn or weaved conductive thread. The first electrode E1 is in contact with a second layer composed of a semi-porous material 7, which prevents electromechanical contact with a third layer acting as the sensitive layer 6. The sensitive layer 6 can be made of a semi-conductive fabric that has electro-chemical-magneto-mechanical sensing properties. Below the sensitive layer 6 is a fourth layer embedded with a second electrode E2, made of sewn or weaved conductive thread. Due to the semi-porous material 7, signal only flows from the first electrode E1 to the second electrode E2. No signal can flow from the second electrode E2 to the first electrode E1. Therefore, the sensor has signal polarity from the first electrode E1 to the second electrode E2. When no external stimulus is applied, the device is in a high-Z state. If a ground signal is connected to the first electrode E1, the sensor is turned off. If an external stimulus, such as a power source or pressure, is applied to the first electrode E1, the electrical or mechanical change deforms the semi-porous layer 7, allowing the first electrode E1 to contact the sensitive layer 6, thereby allowing signal to flow. The signal flow will then exit the sensor from the second electrode E2 as an output signal. Because the sensor can enter on, off, and high-Z states, as well as turn on due to an external stimulus, the sensor can be considered a transistor with tri-state behavior. If the signal polarity were to be reversed, then the construction of the sensor can be inverted from that shown in FIG. 15C, or the semi-porous material 7 can be layered between the sensitive layer 6 and the second electrode E2.

Figure 16:
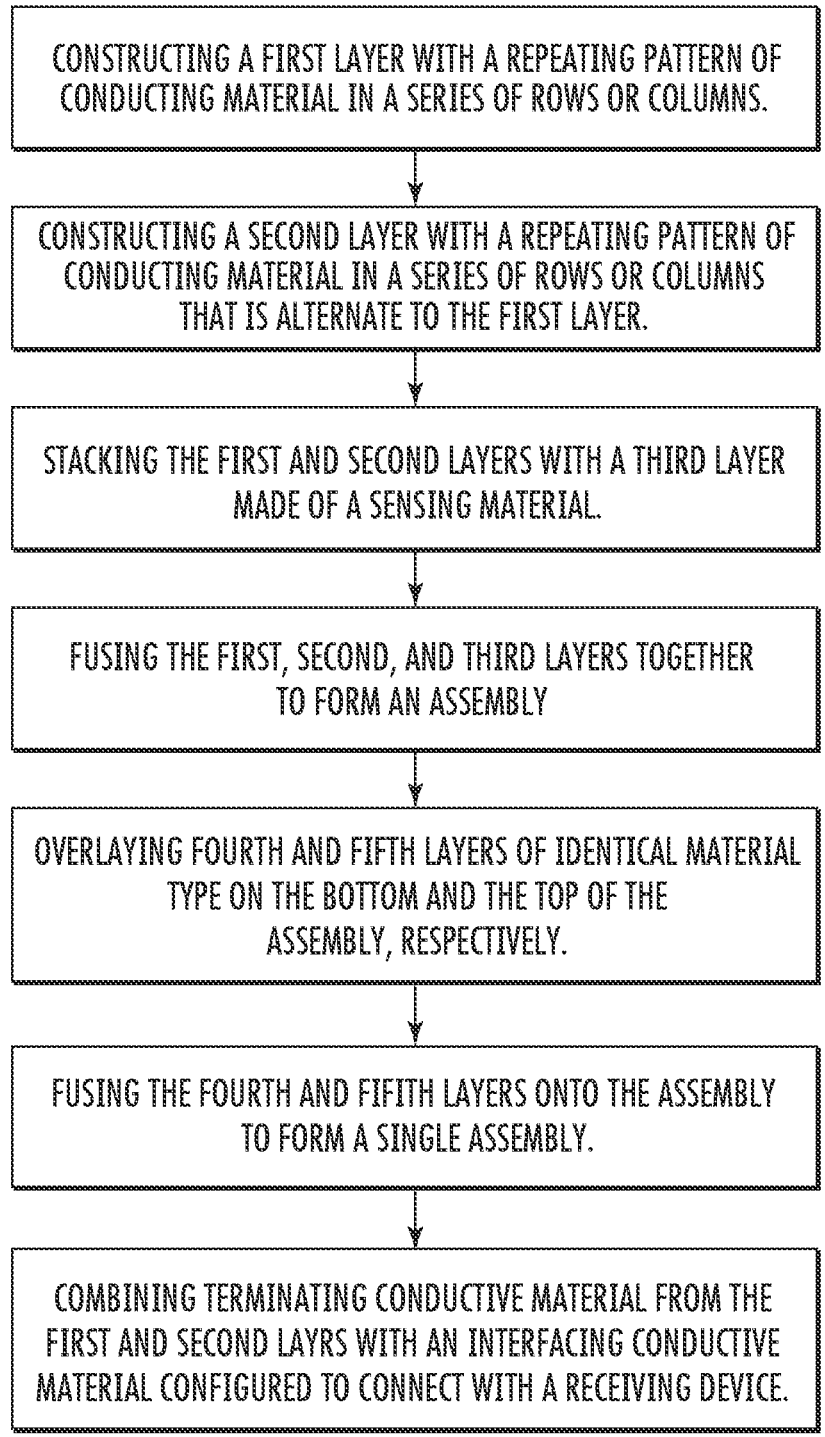
FIG. 16 is a flow chart showing steps of a method according to an example embodiment for fabricating, or constructing, a touch-sensitive device disclosed herein.

FIG. 16 is a flow chart showing steps of a method according to an example embodiment for fabricating, or constructing, a touch-sensitive device disclosed herein. In a first step, the method comprises constructing a first layer with a repeating pattern of electrically conductive material (s) in a series of rows and/or columns. Next, the method comprises the step of constructing a second layer with a repeating pattern of electrically conductive material(s) in a series of rows and/or columns, which is alternate to (e.g., the arrangement is alternate to) the first layer. Next, the method comprises the step of stacking a third layer onto (e.g., between, on the same side as, etc.) the first and second layers, this third layer comprising a sensing material. Next, the method comprises the step of fusing the first, second, and third layers together to form an assembly (e.g., having a unitary, or monolithic, structure). Next, the method comprises the step of overlaying fourth and fifth layers of a material (e.g., an identical material for both of the fourth and fifth layers) on the bottom and top sides, respectively, of the assembly. Next, the method comprises the step of fusing the fourth and fifth layers onto the top and bottom sides, respectively, of the assembly to form a single, unified (e.g., having a unitary, or monolithic, structure) assembly. Next, the method comprises the step of combining terminating electrically conductive material from the first and second layers with an interfacing electrically conductive material configured to connect with a receiving device.

Figure 17:
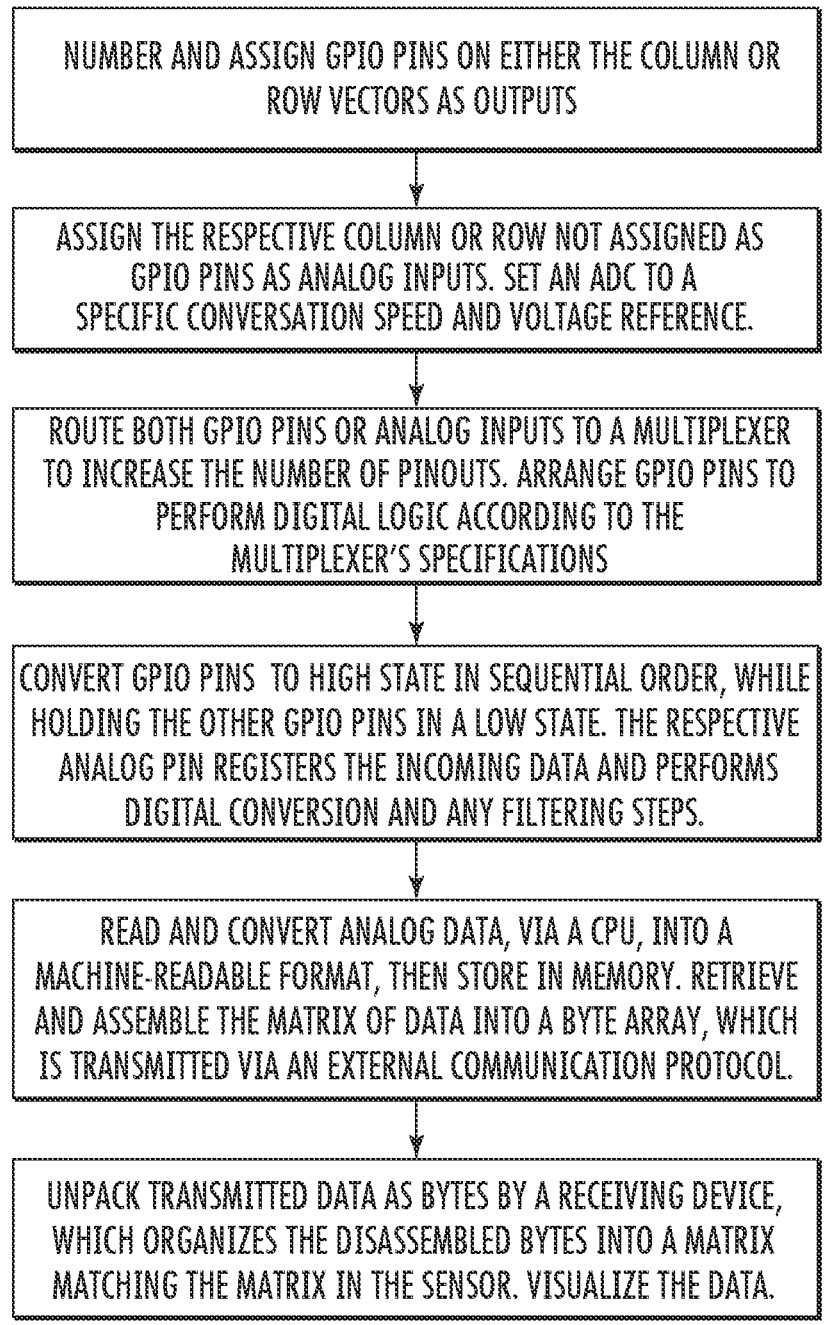
FIG. 17 is a flow chart showing steps of a method according to an example embodiment for using a touch-sensitive device disclosed herein for data collection.

FIG. 17 is a flow chart showing steps of a method according to an example embodiment for using a touch-sensitive device disclosed herein for data collection. In a first step, the method comprises numbering and assigning GPIO pins on either the column or row vectors as outputs. Next, the method comprises the step of assigning the respective column or row not assigned as GPIO pins as analog inputs; then, setting an analog-to-digital converter (ADC) to a specific conversation speed and voltage reference. Next, the method comprises the step of routing both GPIO pins or analog inputs to a multiplexer to increase the number of pinouts; then, arranging the GPIO pins to perform digital logic according to the multiplexer's specifications. Next, the method comprises the step of converting the GPIO pins to a high state in sequential order, while holding the other GPIO pins in a low state; the respective analog pin registers the incoming data and performs digital conversion and any filtering steps. Next, the method comprises the step of reading and converting analog data, via a CPU, into a machine-readable format, then storing it in a memory; the step further includes retrieving and assembling the matrix of data into a byte array, which is transmitted via an external communication protocol. Next, the method comprises the step of unpacking the transmitted data as bytes by a receiving device, which organizes the disassembled bytes into a matrix matching the matrix in the sensor; the step further comprising visualizing the data.

Figure 18:
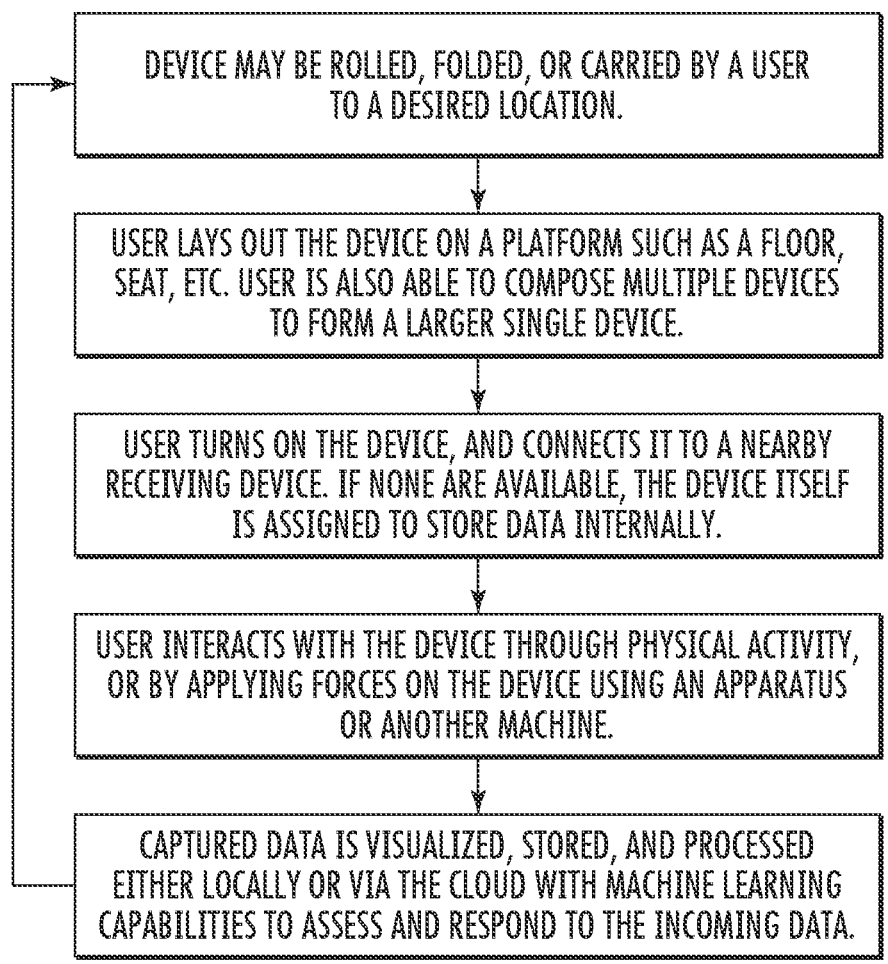
FIG. 18 is a flow chart showing steps of a method according to an example embodiment for a user interacting with a electromechanically sensitive device disclosed herein.

FIG. 18 is a flow chart showing steps of a method according to an example embodiment for a user interacting with a touch-sensitive device disclosed herein. In a first step, the method comprises providing the device (e.g., sensor) to a desired location; the device may be rolled, folded, and/or carried by a user to the desired location. Next, the method comprises the step of laying out (e.g., by a user) the device on a platform, such as a floor, seat, etc.; in some embodiments, a plurality of such devices can be assembled (e.g., by a user) to form a larger single, integrated device and/or system. Next, the method comprises the step of turning on (e.g., activating, as by a user) the device, or plurality of devices, and connecting such device(s) to a receiving device (e.g., with which the device, or devices, are in electronic communication); in embodiments in which no receiving devices are available (e.g., due to lack of electrical communication, lack of system resources, or otherwise), the device itself can be assigned to store data internally (e.g., in a memory provided with the device, or devices). Next, the method comprises the step of the user interacting with the device through physical activity or by applying forces on the device(s); such forces can be applied on the device by the user through an apparatus or other machine. Next, the method comprises the step in which captured data is visualized, stored, and/or processed locally and/or via the cloud with machine learning capabilities to assess and respond to the incoming data.

It will be understood that various details of the presently disclosed subject matter may be changed without departing from the scope of the presently disclosed subject matter. Furthermore, the foregoing description is for the purpose of illustration only, and not for the purpose of limitation.

The invention claimed is:

1. A device comprising:
   first and second passive elements that are formed, respectively, of a plurality of individual layers stacked sequentially on top of each other and comprising:
   a plurality of insulating layers, each of which comprise an insulating material;
   at least one sensing layer, each of which comprise a conductive or a semi-conductive material;
   a plurality of conductive layers, each of which comprises an electrically conductive material; and
   at least one semi-porous layer, each of which comprises a semi-porous material;
   wherein all of the plurality of conductive layers are separated from each other by one or more of the plurality of insulating layers, one or more of the at least one sensing layer, and/or one or more of the at least one semi-porous layer;
   wherein at least some or all of the plurality of conductive layers are spaced apart from the at least one sensing layer by the at least one semi-porous layer; and
   wherein each of the first and second passive element comprises one or more of resistive, capacitive, and inductive characteristics;
   a first insulating layer disposed over a top surface of the first and second passive elements;
   a second insulating layer disposed over a bottom surface of the first and second passive elements; and
   a plurality of electrically conductive threads, each of which is electromechanically attached to, exposed on, or embedded in the first passive element and second passive element or the first and second insulating layers;
   wherein the first and second passive elements are arranged to form a laterally-extending array of passive elements.

2. The device of claim 1, wherein the plurality of individual layers of the first and/or second passive elements can be cut and/or folded for embedding within layers of a fabric material by one or more of sewing, embroidery, heat-pressing, adhesives, ultrasonic welding, folding, crimping, and/or casting.

3. The device of claim 1, wherein:
   the device is configured for cutting and/or folding to conform to irregular surface geometries; and
   the irregular surface geometries comprise on one or more of cloths, body parts, vehicles, appliances, and/or furniture.

4. The device of claim 1, wherein the first passive element and the second passive element are combined in a configuration on a same surface of the fabric, on opposing surfaces of the fabric, on separate surfaces of the fabric, cut and stacked on top of each other, or folded together.

5. The device of claim 1, wherein the first passive element and the second passive element share at least one of the plurality of electrically conductive threads.

6. The device of claim 1, wherein an angular position the first passive element relative to the and second passive element is selected to control a directional sensitivity of the device and/or an average sensitivity of the device.

7. The device of claim 1, wherein a surface area of the first passive element and/or of the second passive element is selected to control a response time, an input dynamic range, an output dynamic range, a signal-to-noise ratio, a common-noise rejection ratio, a signal gain, a sensitivity, and/or an insensitivity of the device.

8. The device of claim 1, wherein a thickness of the first passive element and/or of the second passive element is selected to control a response time, an input dynamic range, an output dynamic range, a signal-to-noise ratio, a common-noise rejection ratio, a signal gain, a sensitivity, and/or an insensitivity of the device.

9. The device of claim 1, wherein a spacing between the first passive element and/or of the second passive element is selected to control a response time, an input dynamic range, an output dynamic range, a signal-to-noise ratio, a common-noise rejection ratio, a signal gain, sensitivity, and/or an insensitivity of the device.

10. The device of claim 1, wherein the device is configured to interpolate a signal from the first passive element and a signal from the second passive element to form a secondary signal that is located within the first passive element and the second passive element.

11. The device of claim 1, wherein the device is configured to differentially read a signal from the first passive element and/or the second passive element via a serial communication protocol comprising one or more of single-wire, two-wire, MOSI-MISO, PCI, bus, and serial peripheral interfaces.

12. The device of claim 1, wherein the device is configured such that, by altering an input signal on at least one of the conductive materials of the plurality of conductive layers of the first and/or second passive elements, a signal from the first passive element and/or the second passive element is differentially turned on or off, or enters a high-Z state via the at least one semi-porous layer of the first and/or second passive element, respectively.

13. The device of claim 1, wherein the plurality of electrically conductive threads are shared between the first and second passive elements.

14. The device of claim 1, wherein, in the first and/or second passive elements, the plurality of insulating layers and the plurality of conductive layers are on a same side as the at least one sensing layer.

15. The device of claim 1, wherein, in the first and/or second passive elements, first and second conductive layers of the plurality of conductive layers each comprise a pattern of the electrically conductive material to control the resistive, capacitive, and/or inductive characteristics of the passive element.

16. The device of claim 1, wherein, in the first and/or second passive elements, for the at least one sensing layer and/or at least some of the plurality of conductive layers, a thickness of material, a chemical composition, a porosity, an area of intersecting region of the top and bottom conductive layers, a thickness of traces, a number of turns in a pattern, a separation between intertwined conductive traces, and/or a distance from a sensitive material is selected to control a response time, an input dynamic range, an output dynamic range, a bandwidth, a signal-to-noise ratio, a common-noise rejection ratio, a signal gain, a sensitivity, and/or an insensitivity of the device.

17. The device of claim 15, wherein:
the first and second conductive layers are positioned on opposite sides of the sensing layer from each other;
the at least one semi-porous layer comprises first and second semi-porous layers;
the first semi-porous layer is disposed between the first conductive layer and the sensing layer;
the second semi-porous layer is disposed between the second conductive layer and the sensing layer; and
the semi-porous material of each of the first and second semi-porous layers is selected to control a response time, an input dynamic range, an output dynamic range, a bandwidth, a signal-to-noise ratio, a common-noise rejection ratio, a signal gain, a sensitivity, and/or an insensitivity of the device.

18. The device of claim 1, comprising one or more additional layer bonded to the first and/or second insulating layers, the one or more additional layers comprising one or more of fabric, glass, wood, gravel, synthetic, leather, organic-like material, and a metal-like material.

19. The device of claim 1, wherein each of the plurality of insulating layers, the at least one sensing layer, the plurality of conductive layers, and the at least one semi-porous layer are bonded together using one or more of sewing, embroidery, heat-pressing, adhesives, ultrasonic welding, folding, crimping, and casting.

20. The device of claim 1, wherein an edge of the device is finished via one or more of sewing, embroidery, heat-pressing, adhesives, ultrasonic welding, folding, crimping, and casting.

21. The device of claim 1, wherein the plurality of electrically conductive threads is configured to be disposed at any location on and/or within the device.

22. The device of claim 1, wherein the plurality of electrically conductive threads is folded into separate layers within the device.

23. The device of claim 1, wherein:
the plurality of electrically conductive threads is disposed via one or more of sewing, weaving, knitting, lacing, depositing, and embroidery; and/or
the plurality of electrically conductive threads is padded with porous materials or semi-conductive materials within the device.

24. The device of claim 1, wherein the plurality of electrically conductive threads is attached to passive or active filtering components configured to perform one or more operations comprising low-pass, high-pass, band-pass, and/or notch filtering.

25. The device of claim 1, wherein the plurality of electrically conductive threads is terminated onto a connector attached to a controller, which is configured to assemble incoming data, thereby creating assembled data, and transmit the assembled data to a receiving device.

26. The device of claim 1, wherein an area between points where the sensing layer is contacted by the plurality of electrically conductive threads determines an area over which the passive element is sensitive.

27. The device of claim 1, wherein the at least one sensing layer comprises a plurality of sensing layers, which are configured to differentially determine a direction of a stimulus applied to the device in any of an X-, Y-, and Z-plane.

28. The device of claim 27, wherein the device comprises switches configured to toggle measurement of one of the plurality of sensing layers.

29. The device of claim 27, wherein the device is configured to use logic gates, clocks, and/or CPUs to time and deconvolve output signals from the plurality of sensing layers.

30. The device of claim 1, wherein the one or more electrically conductive threads comprise a plurality of electrically conductive threads, which are folded into separate layers within the device.

31. The device of claim 1, wherein the device is configured such that, by altering an input signal on at least one of the conductive materials of the one or more conductive layers, a signal from the passive element is differentially turned on or off, or enters a high-Z state via the at least one semi-porous layer.

32. The device of claim 1, wherein the device is configured to enter an on state, an off state, or a high-Z state based on a direction of a stimulus applied to the device, when the direction of the stimulus is in a same direction in which the at least one semi-porous layer is positioned between one of the plurality of conductive layers and the at least one sensing layer.

33. The device of claim 1, wherein the first and second passive elements is configured for cutting and/or folding in any of X-, Y-, and Z-directions to differentially measure a stimulus applied to the device in any of an X-Y-, and Z-plane, respectively.

34. The device of claim 1, wherein the device is configured for interaction with a user for motion acquisition purposes.

35. The device of claim 34, wherein the device is foldable, bendable, and/or rollable by the user.

36. The device of claim 34, wherein the device is configured to be stored, carried, and/or transported by the user.

37. The device of claim 34, wherein the device is configured for installation onto one or more of wood, metal, ceramic, glass, plastic, foam, turf, gravel, carpet, synthetic, organic, and metamaterials.

38. The device of claim 34, wherein the device is configured to connect to a receiving device for use online, offline, cloud-based, and external storage applications.

39. The device of claim 34, wherein the device is configured to generate data for use by the user for algorithmic and/or computerized activities.

40. The device of claim 34, wherein the device is configured to generate data for use for machine-learning activities.

41. The device of claim 1, wherein the first and second passive devices are arranged spaced apart from each other in X-, Y-, and/or X-directions, such that the device is configured to differentially measure a stimulus applied to the device in an X-, Y-, and/or Z-plane, respectively.

42. A device comprising:
first and second passive elements that are formed, respectively, of a plurality of individual layers stacked sequentially on top of each other and comprising:
a plurality of insulating layers, each of which comprise an insulating material;
at least one sensing layer, each of which comprise a conductive or a semi-conductive material;
a plurality of conductive layers, each of which comprises an electrically conductive material; and
at least one semi-porous layer, each of which comprises a semi-porous material;
wherein all of the plurality of conductive layers are separated from each other by one or more of the plurality of insulating layers, one or more of the at least one sensing layer, and/or one or more of the at least one semi-porous layer;
wherein at least some or all of the plurality of conductive layers are spaced apart from the at least one sensing layer by the at least one semi-porous layer; and
wherein each of the first and second passive element comprises one or more of resistive, capacitive, and inductive characteristics;
a first insulating layer disposed over a top surface of the first and second passive elements;
a second insulating layer disposed over a bottom surface of the first and second passive elements; and
a plurality of electrically conductive threads, each of which is electromechanically attached to, exposed on, or embedded in the first passive element and second passive element or the first and second insulating layers;
wherein the first and second passive elements are arranged to form a laterally-extending array of passive elements,
wherein the device is configured such that, by altering an input signal on at least one of the conductive materials of the plurality of conductive layers of the first and/or second passive elements, a signal from the first passive element and/or the second passive element is differentially turned on or off, or enters a high-Z state via the at least one semi-porous layer of the first and/or second passive element, respectively,
wherein, in the first and/or second passive elements, first and second conductive layers of the plurality of conductive layers each comprise a pattern of the electrically conductive material to control the resistive, capacitive, and/or inductive characteristics of the passive element,
wherein, the first and second conductive layers are positioned on opposite sides of the sensing layer from each other;
the at least one semi-porous layer comprises first and second semi-porous layers;
the first semi-porous layer is disposed between the first conductive layer and the sensing layer, the second semi-porous layer is disposed between the second conductive layer and the sensing layer, and the semi-porous material of each of the first and second semi-porous layers is selected to control a response time, an input dynamic range, an output dynamic range, a bandwidth, a signal-to-noise ratio, a common-noise rejection ratio, a signal gain, a sensitivity, and/or an insensitivity of the device.

43. A device comprising:
first and second passive elements that are formed, respectively, of a plurality of individual layers stacked sequentially on top of each other and comprising:
a plurality of insulating layers, each of which comprise an insulating material;
at least one sensing layer, each of which comprise a conductive or a semi-conductive material;
a plurality of conductive layers, each of which comprises an electrically conductive material; and
at least one semi-porous layer, each of which comprises a semi-porous material;
wherein all of the plurality of conductive layers are separated from each other by one or more of the plurality of insulating layers, one or more of the at least one sensing layer, and/or one or more of the at least one semi-porous layer;
wherein at least some or all of the plurality of conductive layers are spaced apart from the at least one sensing layer by the at least one semi-porous layer; and
wherein each of the first and second passive element comprises one or more of resistive, capacitive, and inductive characteristics;
a first insulating layer disposed over a top surface of the first and second passive elements;
a second insulating layer disposed over a bottom surface of the first and second passive elements; and
a plurality of electrically conductive threads, each of which is electromechanically attached to, exposed on, or embedded in the first passive element and second passive element or the first and second insulating layers;
wherein the first and second passive elements are arranged to form a laterally-extending array of passive elements,
wherein an angular position the first passive element relative to the and second passive element is selected to control a directional sensitivity of the device and/or an average sensitivity of the device,
wherein the device is configured to differentially read a signal from the first passive element and/or the second passive element via a serial communication protocol comprising one or more of single-wire, two-wire, MOSI-MISO, PCI, bus, and serial peripheral interfaces,
wherein the plurality of electrically conductive threads are shared between the first and second passive elements,
wherein the at least one sensing layer comprises a plurality of sensing layers, which are configured to differentially determine a direction of a stimulus applied to the device in any of an X-, Y-, and Z-plane.

* * * * *